United States Patent
Matsuo et al.

(10) Patent No.: US 10,546,766 B2
(45) Date of Patent: *Jan. 28, 2020

(54) INSPECTION DEVICE AND SUBSTRATE PROCESSING APPARATUS

(71) Applicant: SCREEN Holdings Co., Ltd., Kyoto (JP)

(72) Inventors: Tomohiro Matsuo, Kyoto (JP); Koji Nakagawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 183 days.

This patent is subject to a terminal disclaimer.

(21) Appl. No.: 15/875,409

(22) Filed: Jan. 19, 2018

(65) Prior Publication Data

US 2018/0144961 A1 May 24, 2018

Related U.S. Application Data

(62) Division of application No. 15/136,336, filed on Apr. 22, 2016, now Pat. No. 10,043,694.

(30) Foreign Application Priority Data

| Apr. 23, 2015 | (JP) | 2015-088541 |
| May 26, 2015 | (JP) | 2015-106601 |
| May 26, 2015 | (JP) | 2015-106602 |

(51) Int. Cl.
*G06K 9/00* (2006.01)
*H01L 21/67* (2006.01)
(Continued)

(52) U.S. Cl.
CPC ...... *H01L 21/67288* (2013.01); *G03F 7/7065* (2013.01); *G06T 7/001* (2013.01); *G06T 2207/30148* (2013.01)

(58) Field of Classification Search
None
See application file for complete search history.

(56) References Cited

U.S. PATENT DOCUMENTS

| 5,912,984 A | 6/1999 | Michael et al. ............... 382/149 |
| 5,982,927 A | 11/1999 | Koljonen ....................... 382/168 |

(Continued)

FOREIGN PATENT DOCUMENTS

| CN | 102608114 A | 7/2012 |
| JP | 61-288143 A | 12/1986 |

(Continued)

OTHER PUBLICATIONS

Decision to Grant a Patent dated Sep. 18, 2018 in corresponding Japanese Application No. 2015-106602.

(Continued)

*Primary Examiner* — Feng Niu
(74) *Attorney, Agent, or Firm* — Ostrolenk Faber LLP

(57) ABSTRACT

Surface image data of a non-defective sample substrate is acquired, and surface image data of a substrate to be inspected is acquired. Differences between gradation values are calculated for pixels of the surface image data of the substrate to be inspected and corresponding pixels of the surface image data of the sample substrate. A constant value is added to the difference between gradation values of each pixel. In the case where the value acquired by addition is in a predetermined allowable range, it is determined that there is no defect for the substrate to be inspected. In the case where the value acquired by addition is outside of the allowable range, it is determined that the substrate to be inspected is defective. A defect in appearance on the substrate to be inspected is detected based on a pixel of which the value is outside of the allowable range.

10 Claims, 41 Drawing Sheets

(51) Int. Cl.
*G06T 7/00* (2017.01)
*G03F 7/20* (2006.01)

(56) References Cited

U.S. PATENT DOCUMENTS

| | | | |
|---|---|---|---|
| 6,087,673 A | 7/2000 | Shishido et al. | 250/559.45 |
| 6,236,057 B1 | 5/2001 | Shishido et al. | 250/559.45 |
| 6,317,513 B2 | 11/2001 | Michael et al. | 382/145 |
| 6,614,923 B1 | 9/2003 | Shishido et al. | 382/149 |
| 6,947,587 B1 | 9/2005 | Maeda et al. | 382/149 |
| 7,440,605 B2* | 10/2008 | Sasa | G01N 21/9501 382/141 |
| 8,160,351 B2 | 4/2012 | Sandstorm | 356/237.4 |
| 8,165,384 B1 | 4/2012 | Ma et al. | 382/149 |
| 2001/0030300 A1 | 10/2001 | Shishido et al. | 250/559.45 |
| 2003/0155077 A1 | 8/2003 | Hisai et al. | 156/345.32 |
| 2004/0066962 A1* | 4/2004 | Sasa | G01N 21/9501 382/141 |
| 2004/0086170 A1 | 5/2004 | Shishido et al. | 382/149 |
| 2005/0037272 A1 | 2/2005 | Tanaka | 430/30 |
| 2006/0002604 A1 | 1/2006 | Sakai et al. | 382/141 |
| 2006/0038987 A1 | 2/2006 | Maeda et al. | 356/237.5 |
| 2006/0067571 A1 | 3/2006 | Onishi | 382/149 |
| 2006/0159330 A1 | 7/2006 | Sakai et al. | 382/141 |
| 2006/0257015 A1 | 11/2006 | Katahata et al. | 382/145 |
| 2008/0037860 A1 | 2/2008 | Yamashita | 382/149 |
| 2008/0101685 A1 | 5/2008 | Maeda et al. | 382/149 |
| 2009/0028423 A1 | 1/2009 | Sandstrom | 382/149 |
| 2009/0214102 A1 | 8/2009 | Maeda et al. | 382/144 |
| 2010/0053319 A1 | 3/2010 | Sakai et al. | 348/125 |
| 2011/0063588 A1 | 3/2011 | Kashiyama et al. | |
| 2011/0170765 A1 | 7/2011 | Maeda et al. | 382/145 |
| 2012/0002860 A1 | 1/2012 | Sakai et al. | 382/149 |
| 2012/0045115 A1 | 2/2012 | Dong et al. | 382/149 |
| 2012/0128230 A1 | 5/2012 | Maeda et al. | 382/145 |
| 2012/0141012 A1 | 6/2012 | Sakai et al. | 382/149 |
| 2012/0185194 A1 | 7/2012 | Matsushita et al. | 702/83 |
| 2013/0002849 A1 | 1/2013 | Sakai | 348/86 |
| 2013/0307963 A1 | 11/2013 | Sakai et al. | 348/87 |
| 2015/0356727 A1 | 12/2015 | Urano et al. | 382/149 |
| 2016/0314575 A1 | 10/2016 | Matsuo et al. | |
| 2018/0144961 A1 | 5/2018 | Matsuo et al. | |

FOREIGN PATENT DOCUMENTS

| | | |
|---|---|---|
| JP | 02-078936 A | 3/1990 |
| JP | 06-129842 A | 5/1994 |
| JP | 08-110307 A | 4/1996 |
| JP | 08-334475 A | 12/1996 |
| JP | 09-0257720 A | 10/1997 |
| JP | 10-091788 A | 4/1998 |
| JP | 10-318950 A | 12/1998 |
| JP | 11-194154 A | 7/1999 |
| JP | 11-304718 A | 11/1999 |
| JP | 2002-175520 A | 6/2002 |
| JP | 2003-065969 A | 3/2003 |
| JP | 2003-243295 A | 8/2003 |
| JP | 2004-109106 A | 4/2004 |
| JP | 2005-321237 A | 11/2005 |
| JP | 2006-58155 A | 3/2006 |
| JP | 2006-098163 A | 4/2006 |
| JP | 2006-220644 A | 8/2006 |
| JP | 2006-242759 A | 9/2006 |
| JP | 2006-266943 A | 10/2006 |
| JP | 2007-208050 A | 8/2007 |
| JP | 2007-315770 A | 12/2007 |
| JP | 2008-39712 A | 2/2008 |
| JP | 2010-002307 A | 1/2010 |
| JP | 2010-256242 A | 11/2010 |
| JP | 2011-047724 A | 3/2011 |
| JP | 2011-66049 | 3/2011 |
| JP | 2011-196952 A | 10/2011 |
| JP | 4910412 B2 | 4/2012 |
| JP | 2013-104860 A | 5/2013 |
| JP | 2014-020961 A | 2/2014 |
| JP | 2014-126430 A | 7/2014 |
| JP | 2014-127062 A | 7/2014 |
| JP | 2015-040827 A | 3/2015 |
| JP | 2016-061683 A | 4/2016 |
| JP | 2016-206452 A | 12/2016 |
| JP | 6412825 B2 | 10/2018 |
| TW | 200643805 A | 12/2006 |
| TW | 201321743 A1 | 6/2013 |
| TW | 201415010 A | 4/2014 |
| WO | WO 2003/077291 A1 | 9/2003 |
| WO | WO 2014/045508 A1 | 3/2014 |
| WO | WO 2016/042692 | 3/2016 |

OTHER PUBLICATIONS

Office Action dated Apr. 26, 2017 in counterpart Taiwanese Patent Application No. 105111079.
Office Action dated Jul. 19, 2017 issued in corresponding Korean Application No. 10-2016-0049289.
Notice of Reasons for Refusal dated Nov. 6, 2018 in corresponding Japanese Patent Application No. 2015-088541.
Office Action dated Nov. 6, 2018 in corresponding Japanese Patent Application No. 2015-106601.
Decision to Grant a Patent dated Jan. 8, 2019 in counterpart Japanese Patent Application No. 2015-106601.

* cited by examiner

F I G. 8
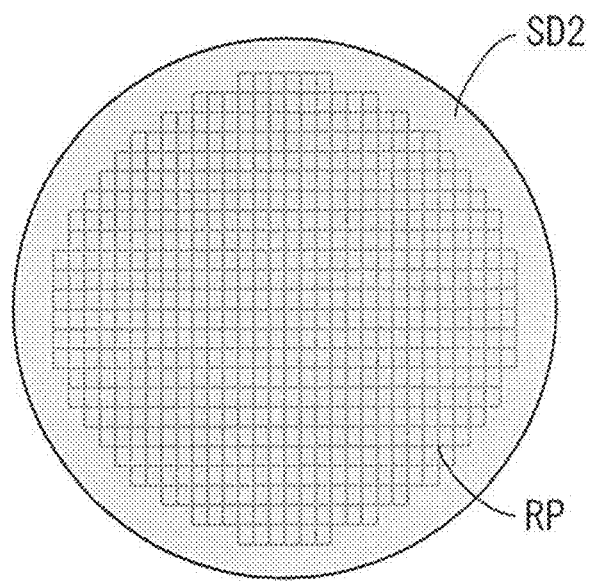
F I G. 9
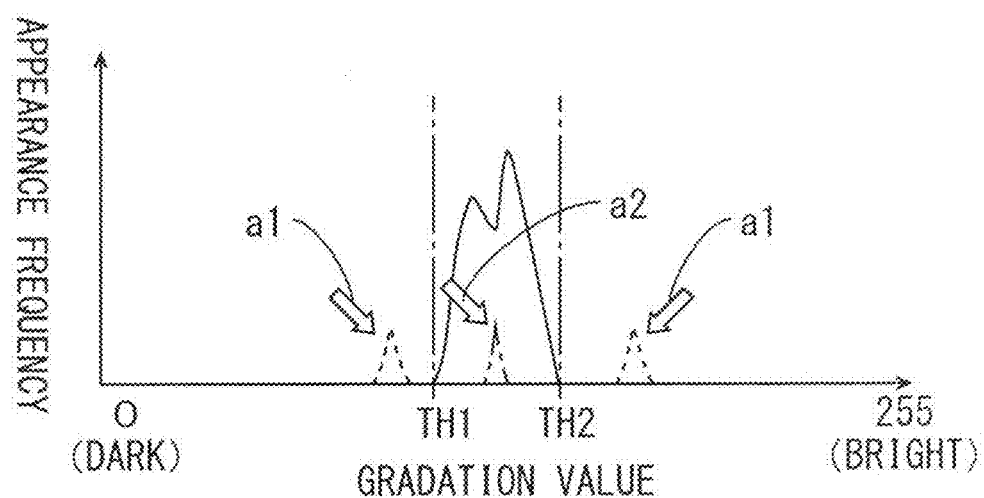

F I G. 10
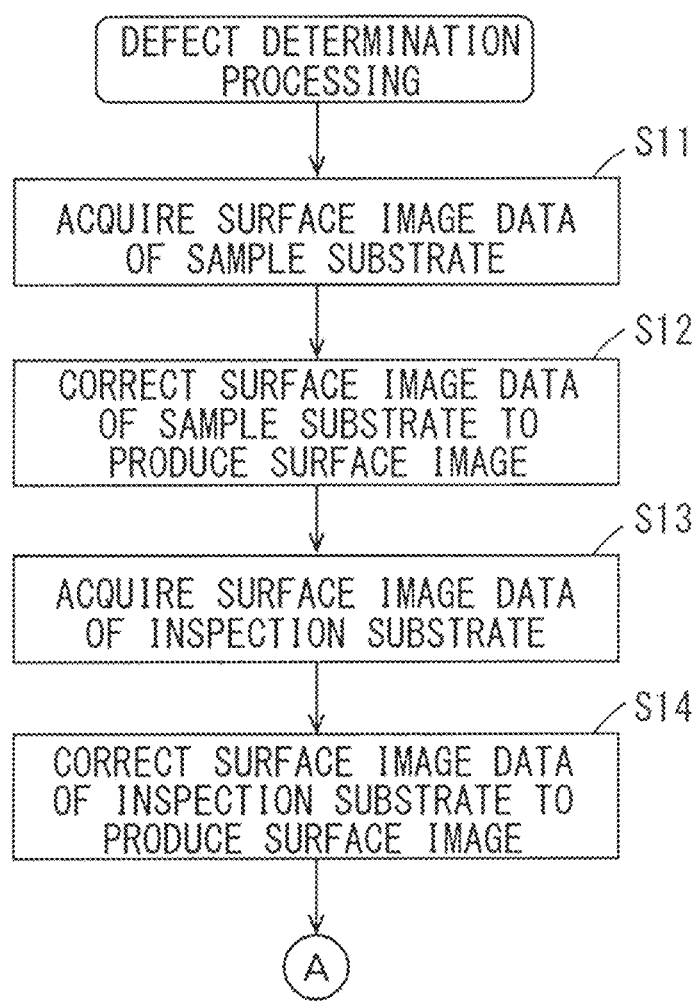

F I G. 3 1
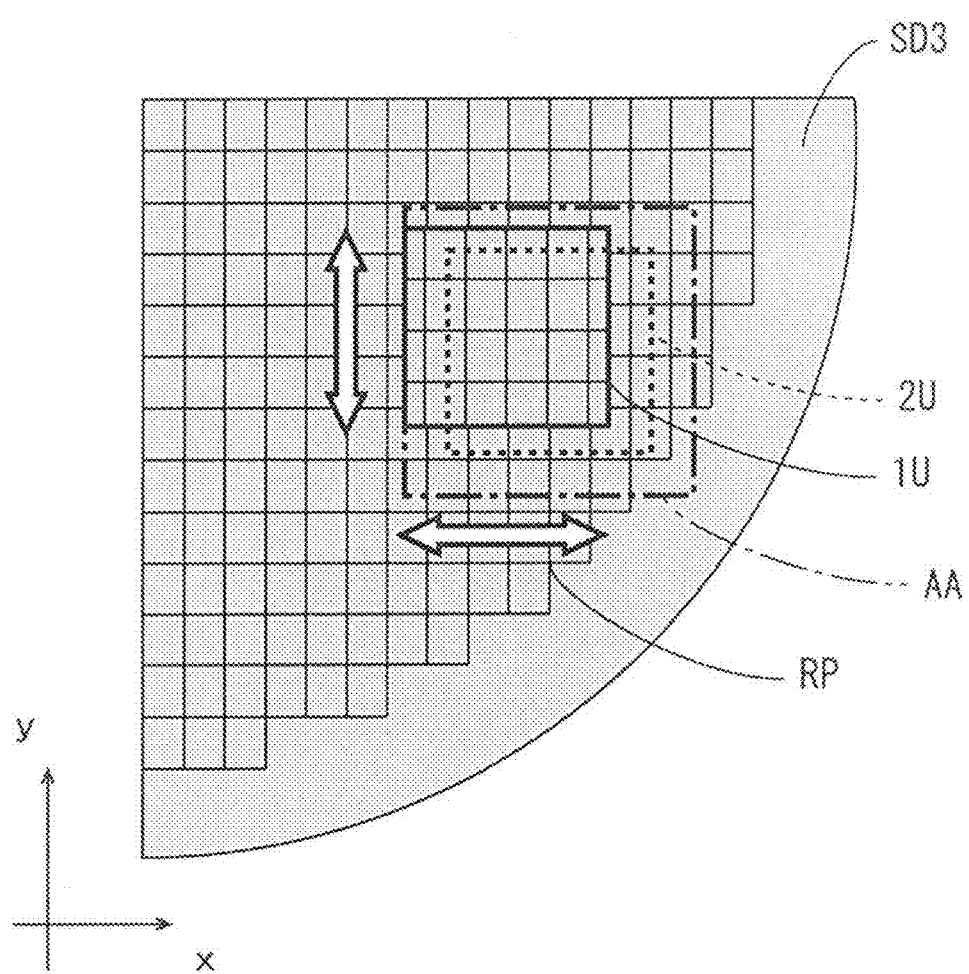

F I G. 3 2
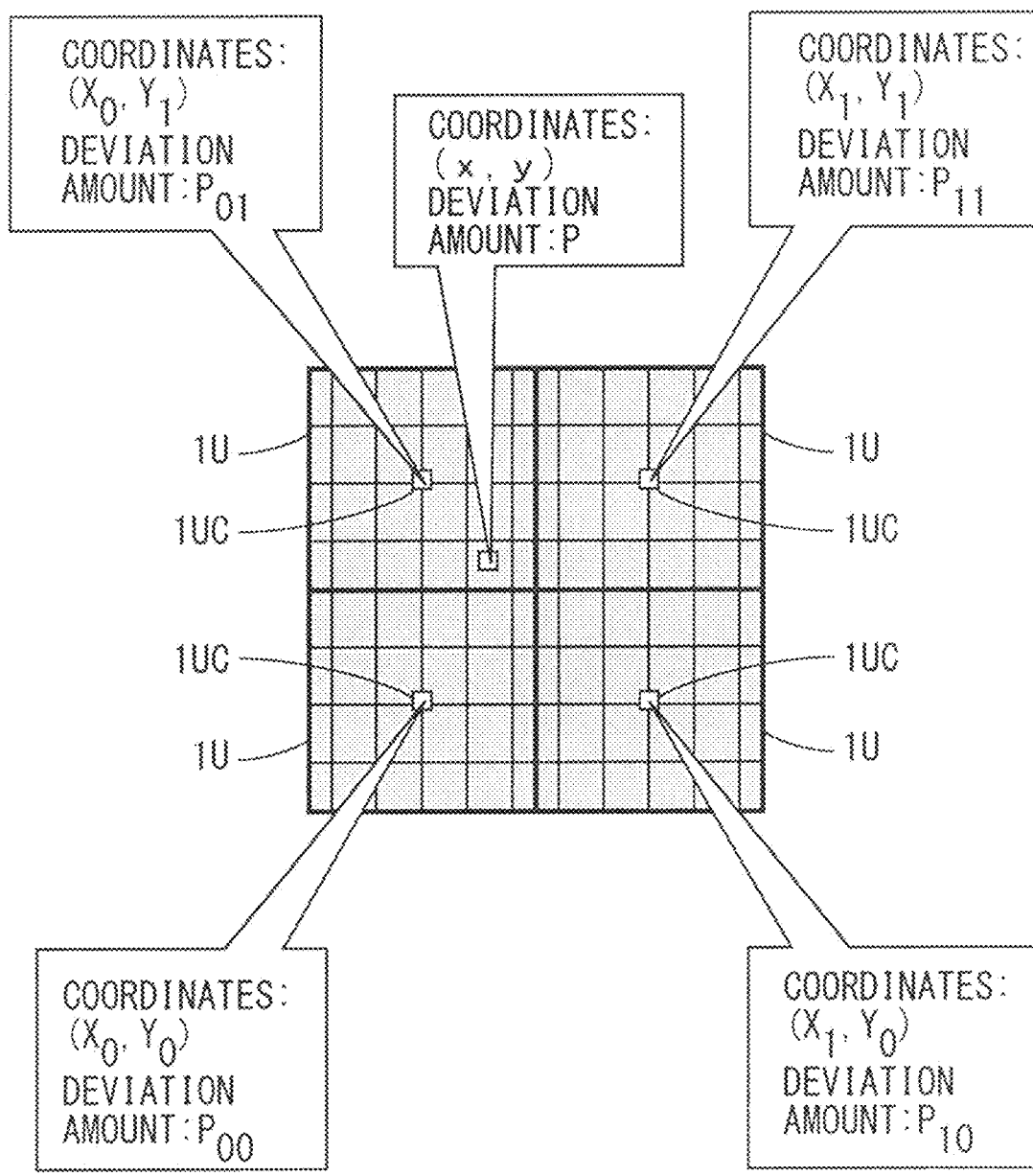

FIG. 40A

| (0, 0) | (0, 0) | (0, 0) | (0, 0) | (0, 0) |
|---|---|---|---|---|
| (0, 0) | (5, 0) | (5, 0) | (5, 0) | (0, 0) |
| (0, 0) | (5, 0) | (5, 0) | (5, 0) | (0, 0) |
| (0, 0) | (5, 0) | (5, 0) | (5, 0) | (0, 0) |
| (0, 0) | (0, 0) | (0, 0) | (0, 0) | (0, 0) |

FIG. 40B

| (0, 0) | (0, 0) | (0, 0) | (0, 0) | (0, 0) |
|---|---|---|---|---|
| (0, 0) | TARGET | TARGET | TARGET | (0, 0) |
| (0, 0) | TARGET | TARGET | TARGET | (0, 0) |
| (0, 0) | TARGET | TARGET | TARGET | (0, 0) |
| (0, 0) | (0, 0) | (0, 0) | (0, 0) | (0, 0) |

FIG. 40C

| (0, 0) | (0, 0) | (0, 0) | (0, 0) | (0, 0) |
|---|---|---|---|---|
| (0, 0) | (0, 0) | (0, 0) | (0, 0) | (0, 0) |
| (0, 0) | (0, 0) | (0, 0) | (0, 0) | (0, 0) |
| (0, 0) | (0, 0) | (0, 0) | (0, 0) | (0, 0) |
| (0, 0) | (0, 0) | (0, 0) | (0, 0) | (0, 0) |

INSPECTION DEVICE AND SUBSTRATE PROCESSING APPARATUS

CROSS-REFERENCE TO RELATED APPLICATIONS

This application is a divisional of U.S. patent application Ser. No. 15/136,336, filed Apr. 22, 2016, which claims the benefit of Japanese Patent Application Nos. JP 2015-088541, filed Apr. 23, 2015, JP 2015-106601, filed May 26, 2015 and JP 2015-106602, filed May 26, 2015, the contents of which are incorporated herein by reference.

BACKGROUND OF THE INVENTION

Field of the Invention

The present invention relates to an inspection device and a substrate processing apparatus including the inspection device.

Description of Related Art

In various processing steps for each type of substrates such as semiconductor substrates, substrates for liquid crystal display devices, substrates for plasma displays, substrates for optical discs, substrates for magnetic discs, substrates for magneto-optical discs, substrates for photomasks and other substrates, appearance inspection for a substrate is performed.

In a substrate processing apparatus described in JP 2011-66049 A, appearance inspection for a substrate is performed after a resist film is formed on the substrate and before exposure processing is performed on the substrate. In the appearance inspection for the substrate, surface image data of the substrate is produced by picking up of an image of the substrate by an imaging device. In the case where all of the surface image data has brightness in a predetermined allowable range, it is determined that the substrate is normal. On the one hand, in the case where at least part of the surface image data has brightness that is not in the allowable range, it is determined that the substrate is abnormal. In this manner, a defect in appearance on the substrate is detected.

BRIEF SUMMARY OF THE INVENTION

However, in a method of detecting a defect described in JP 2011-66049 A, even in the case where there is a defect in a surface of a substrate, if brightness of the reflected light from the defect is in the allowable range, it is determined that the substrate is normal. Therefore, a defect cannot be detected sometimes.

An object of the present invention is to provide an inspection device capable of performing appearance inspection for a substrate with high accuracy, and a substrate processing apparatus including the inspection device.

(1) An inspector according to one aspect of the present invention that performs appearance inspection for a substrate includes an image data acquirer that acquires image data of a substrate with no defect in appearance as first image data, and acquires image data of a substrate to be inspected as second image data by picking up an image of the substrate to be inspected, and a determiner that calculates values related to differences between gradation values of pixels of the of first image data acquired by the image data acquirer and gradation values of corresponding pixels of the of second image data acquired by the image data acquirer as pieces of difference information, and determines whether there is a defect in appearance on the substrate to be inspected based on whether each piece of calculated difference information is in a predetermined allowable range.

In the inspector, the image data of the substrate with no defect in appearance is acquired as the first image data, and the image data of the substrate to be inspected is acquired as the second image data. As for a normal portion of the substrate to be inspected, a difference between a gradation value of a pixel of the first image data and a gradation value of a corresponding pixel of the second image data is small. On the one hand, as for a defective portion of the substrate to be inspected, a difference between a gradation value of a pixel of the first image data and a gradation value of a corresponding pixel of the second image data is large. Therefore, even in the case where the gradation value of the pixel corresponding to a defective portion is close to the gradation value of the pixel corresponding to a normal portion, the above-mentioned difference corresponding to the defective portion is larger than the above-mentioned difference corresponding to the normal portion.

A value related to a difference between a gradation value of a pixel of the first image data and a gradation value of a corresponding pixel of the second image data is calculated as a piece of difference information. Thus, a piece of difference information for the pixel corresponding to the defective portion and a piece of difference information corresponding to the normal portion can be distinguished from each other. Therefore, an allowable range is determined in advance to include a piece of difference information corresponding to a normal portion and not to include a piece of difference information corresponding to a defective portion, whereby it is possible to determine whether there is a defect. As a result, a defect in appearance on the substrate can be detected with high accuracy.

(2) The determiner may detect a defect in appearance on the substrate based on a pixel of which the piece of difference information is outside of the allowable range.

In this case, in the case where there is a defect in appearance on the substrate to be inspected, a position and a shape of the defect can be identified.

(3) The pieces of difference information may include values acquired by addition of a constant value to values of the differences.

In this case, overall gradation values, of the image based on the pieces of difference information, corresponding to all of the pixels can be increased. Thus, a user can view the image based on the pieces of difference information without an uncomfortable feeling.

(4) The determiner may determine that there is a defect in appearance on the substrate to be inspected in the case where the number of pieces of difference information being outside of the allowable range is not less than a predetermined number.

Part of the pieces of difference information not corresponding to a defect may be outside of the allowable range due to noise, disturbance or the like. In the above-mentioned configuration, in the case where the number of the pieces of difference information outside of the allowable range is smaller a predetermined number, it is not determined that there is a defect. Therefore, determination error due to noise, disturbance or the like can be prevented.

(5) The determiner may perform smoothing of the first image data acquired by the image data acquirer, may produce first correction image data by subtracting a gradation value of each pixel of first image data after smoothing from a gradation value of each pixel of first image data before smoothing, may perform smoothing of the second image data acquired by the image data acquirer, may produce second correction image data by subtracting a gradation value of each pixel of second image data after smoothing from a gradation value of each pixel of second image data before smoothing, and may calculate differences between gradation values of pixels of the produced first correction image data and gradation values of pixels of the produced second correction image data as the pieces of difference information for the pixels of the first image data and the corresponding pixels of the second image data.

Normally, a gradation change resulting from a defect and normal surface structure of the substrate occurs more locally or dispersively than a gradation change resulting from a moire. Therefore, the first and second image data after smoothing includes a gradation change resulting from a moire, and does not include a gradation change resulting from a defect in appearance and a gradation change resulting from the surface structure. The first correction image data from which a moire is removed is produced by subtraction of a gradation value of each pixel of the first image data after smoothing from a gradation value of each pixel of the first image data before smoothing. Further, the second correction image data from which a moire is removed is produced by subtraction of a gradation value of each pixel of the second image data after smoothing from a gradation value of each pixel of the second image data before smoothing.

The pieces of difference information are calculated based on the first and second correction image data. It is determined that there is a defect in appearance on the substrate to be inspected based on the calculated difference information. Therefore, a reduction in detection accuracy for a defect due to a moire can be prevented, and appearance inspection for the substrate can be performed with high accuracy.

(6) The determiner may perform smoothing of the first and second image data by movement average filter processing.

In this case, the smoothing of the first and second image data can be easily performed in a short period of time.

(7) The determiner may perform smoothing of the first and second image data such that first and second image data after smoothing includes a gradation change resulting from a moire and does not include a gradation change resulting from a defect in appearance and normal surface structure.

In this case, first and second correction image data that do not include a gradation change due to a moire and includes a gradation change resulting from a defect in appearance and normal surface structure can be appropriately produced.

(8) The inspector may further include a substrate holding rotator that holds and rotates the substrate, wherein the image data acquirer may include an illuminator that irradiates a radial region extending in a radial direction of the substrate rotated by the substrate holding rotator with light, and a line sensor that receives light reflected by the radial region of the substrate.

In this case, first and second image data can be acquired with a simple configuration.

(9) An inspector according to another aspect of the present invention that performs appearance inspection for a substrate includes an image data acquirer that acquires image data of a substrate with no defect in appearance as first image data, and acquires image data of a substrate to be inspected as second image data by picking up an image of the substrate to be inspected, a range setter that sets an allowable range for determining whether there is a defect in appearance on the substrate, and a determiner that calculates values related to differences between gradation values of pixels of the first image data acquired by the image data acquirer and gradation values of pixels of the second image data acquired by the image data acquirer, the pixels of the first and second image data being considered to correspond to each other, and determines whether there is a defect in appearance on the substrate to be inspected based on whether each piece of calculated difference information is in the allowable range set by the range setter, wherein the range setter calculates, for each of a plurality of predetermined target pixels of the first image data, differences between gradation values of a target pixel and a plurality of pixels in a constant region including the target pixel, determines, for each of the plurality of predetermined target pixels of the first image data, a representative value in a range from a minimum value to a maximum value of a plurality of differences by a predetermined method based on the plurality of calculated differences, and respectively sets values related to a minimum value and a maximum value of the plurality of representative values respectively determined for the plurality of target pixels as a lower limit value and an upper limit value of the allowable range.

In the inspector, the image data of the substrate with no defect in appearance is acquired as first image data, and the image data of the substrate to be inspected is acquired as second image data. As for a normal portion of the substrate to be inspected, a difference between a gradation value of a pixel of the first image data and a gradation value of a corresponding pixel of the second image data is small. On the one hand, as for a defective portion of the substrate to be inspected, a difference between a gradation value of a pixel of the first image data and a gradation value of a corresponding pixel of the second image data is large. Therefore, even in the case where a gradation value of the pixel corresponding to a defective portion is close to a gradation value of the pixel corresponding to a normal portion, the above-mentioned difference corresponding to the defective portion is larger than the above-mentioned difference corresponding to the normal portion.

A value related to a difference between a gradation value of the first image data and a gradation value of a corresponding pixel of the second image data is calculated as a piece of difference information. Thus, the piece of difference information for the pixel corresponding to the defective portion, and the piece of difference information corresponding to the normal portion can be distinguished from each other. Therefore, an allowable range is determined in advance to include the piece of difference information corresponding to a normal portion and not to include the piece of difference information corresponding to a defective portion, whereby it is possible to determine whether there is a defect.

However, a pixel of the second image data considered to correspond to one pixel of the first image data sometimes deviates from the truly corresponding pixel. In this case, when an allowable range is set on assumption that a correspondence relationship between the first and second image data is accurate, the piece of difference information corresponding to a normal portion sometimes falls outside of the allowable range. Therefore, it becomes necessary to largely set the allowable range in order to prevent determination error resulting from a deviation. On the one hand, when the allowable range is set excessively largely, detection accuracy for a defect is reduced.

In the present invention, as for each of the plurality of target pixels of the first image data, differences between gradation values of the target pixel and gradation values of a plurality of pixels in a constant region including the target pixel are calculated. In this case, it is considered that a plurality of differences calculated for each target pixel are substantially equivalent to the differences between gradation values calculated by a determiner with a deviation being present in correspondence relationship between the first and second image data in the case where there is no defect for the substrate to be inspected.

A representative value that is in a range from a minimum value to a maximum value of a plurality of differences is determined by a predetermined method based on the plurality of differences calculated for each target pixel. In this case, when there is a deviation in correspondence relationship between the first and second image data, a representative value for each target pixel represents a difference between gradation values to be calculated in the case where a portion corresponding to each target pixel is normal.

Therefore, values for a minimum value and a maximum value of a plurality of representative values determined for the plurality of target pixels of the first image data are respectively set as a lower limit value and an upper limit value of the allowable range. Thus, as for a normal portion, a piece of difference information calculated with a deviation being present in correspondence relationship is less likely to fall outside of the allowable range. Therefore, a normal portion is less likely to be erroneously determined to be defective.

Further, a lower limit value and an upper limit value of the allowable range are limited to values for a minimum value and a maximum value of the representative value. Thus, as for a defective portion, the piece of difference information calculated with a deviation being in correspondence relationship is less likely to be included in the allowable range. Therefore, a defective portion is less likely to be erroneously determined to be normal. As a result, in the case where there is a deviation between a pixel of the first image data and a corresponding pixel of the second image data, a defect in appearance on the substrate can be detected with high accuracy.

(10) The predetermined method may be a method of determining, for each of the plurality of predetermined target pixels of the first image data, an average value of the differences between gradation values of the target pixels and the plurality of pixels in the constant region including the target pixels as the representative value.

Thus, a desired allowable range can be appropriately set according to a determination condition for a defect and the like.

(11) The predetermined method may be a method of determining, for each of the plurality of predetermined target pixels of the first image data, a maximum value of the differences between gradation values of the target pixels and the plurality of pixels in the constant region including the target pixels as the representative value.

Thus, a desired allowable range can be appropriately set according to a determination condition for a defect and the like.

(12) The pieces of difference information may include values acquired by addition of a constant value to differences between gradation values of pixels of the first image data and gradation values of pixels of the second image data, the pixels of the first and second image data being considered to correspond to each other, and values related to the minimum value and the maximum value of the plurality of representative values may include values acquired by respective addition of the constant value to the minimum value and the maximum value of the plurality of representative values.

In this case, the overall gradation values, of the image based on the pieces of difference information, corresponding to all of the pixels can be increased. Thus, the user can view the image based on the pieces of difference information without an uncomfortable feeling. Further, the constant value added to the differences between the gradation values is added to a minimum value and a maximum value of the plurality of representative values, so that the allowable range is appropriately set.

(13) The range setter may set a first value smaller than the minimum value of the plurality of representative values by a predetermined value as the lower limit value of the allowable range instead of the value related to the minimum value of the plurality of representative values, and may set a second value larger than the maximum value of the plurality of representative values by a predetermined value as the upper limit value of the allowable range instead of the value related to the maximum value of the plurality of representative values.

Part of the pieces of difference information not corresponding to a defect may be smaller than the value for the minimum value of the plurality of representative values due to noise, disturbance or the like. Further, part of the pieces of difference information not corresponding to a defect may be larger than a value for a maximum value of a plurality of representative values. In the above-mentioned configuration, even in the case where the piece of difference information is smaller than the value for the minimum value of the plurality of representative values, it is not determined that there is a defect as long as the piece of difference information is not less than the first value. Further, even in the case where the piece of difference information is larger than the value for the maximum value of the plurality of representative values, it is not determined that there is a defect as long as the piece of difference information is not more than the second value. Therefore, determination error due to noise, disturbance or the like can be prevented.

(14) The determiner may detect a defect in appearance on the substrate based on a pixel of which a piece of difference information is outside of the allowable range.

In this case, in the case where there is a defect in appearance on the substrate to be inspected, a position and a shape of the defect can be identified.

(15) The determiner may determine that there is a defect in appearance on the substrate to be inspected in the case where the number of pieces of difference information outside of the allowable range is not less than a predetermined number.

Part of the pieces of difference information not corresponding to a defect may be outside of the allowable range due to noise, disturbance or the like. In the above-mentioned configuration, in the case where the number of the pieces of difference information outside of the allowable range is smaller than the predetermined number, it is not determined that there is a defect. Therefore, determination error due to noise, disturbance or the like can be prevented.

(16) The determiner may perform smoothing of the first image data acquired by the image data acquirer, may produce first correction image data by subtracting a gradation value of each pixel of first image data after smoothing from a gradation value of each pixel of first image data before smoothing, may perform smoothing of the second image data acquired by the image data acquirer, may produce second correction image data by subtracting a gradation value of each pixel of second image data after smoothing from a gradation value of each pixel of second image data before smoothing, and may calculate differences between gradation values of pixels of the produced first correction data and gradation values of pixels of the produced second correction data, the pixels of the produced first and second correction data being considered to correspond to each other, as the pieces of difference information for the pixels of the first image data and corresponding pixels of the second image data, and the range setter may calculate, for each of a plurality of target pixels of the first correction image data produced by the determiner instead of the first image data, differences between a gradation value of the target pixel and gradation values of the plurality of pixels in the constant region including the target pixel, and may determine, for each of the plurality of target pixels of the first correction image data produced by the determiner instead of the first image data, the representative value in the range from the minimum value to the maximum value of the plurality of differences by the predetermined method based on the plurality of calculated differences.

Normally, a gradation change resulting from a defect and normal surface structure of the substrate occurs more locally or dispersively than a gradation change resulting from a moire. Therefore, the first and second image data after smoothing include a gradation change resulting from a moire, and does not include a gradation change resulting from a defect in appearance and a gradation change resulting from the surface structure. The first correction image data from which a moire is removed is produced by subtraction of a gradation value of each pixel of the first image data after smoothing from a gradation value of each pixel of the first image data before smoothing. Further, the second correction image data from which a moire is removed is produced by subtraction of a gradation value of each pixel of the second image data after smoothing from a gradation value of each pixel of the second image data before smoothing.

The pieces of difference information are calculated based on the first and second correction image data. Whether there is a defect in appearance on the substrate to be inspected is determined based on the pieces of calculated difference information. Therefore, a reduction in detection accuracy for a defect due to a moire is prevented, and appearance inspection for the substrate can be performed with high accuracy.

Further, as for each of the plurality of target pixels of the first correction image data, a difference between a gradation value of the target pixel and a gradation value a plurality of pixels in a constant region including the target pixel is calculated, and the above-mentioned representative value is determined based on the plurality of calculated differences. Therefore, the allowable range corresponding to the second correction image data is appropriately set.

(17) The determiner may perform smoothing of the first and second image data by movement average filter processing.

In this case, smoothing of the first and second image data can be easily performed in a short period of time.

(18) The determiner may perform smoothing of the first and second image data such that first and second image data after smoothing includes a gradation change resulting from a moire and not to include a gradation change resulting from a defect in appearance and normal surface structure.

In this case, the first and second correction image data that do not include a gradation change due to a moire and includes a gradation change resulting from a defect in appearance and the normal surface structure can be appropriately produced.

(19) The inspector may further include a substrate holding rotator that holds and rotates the substrate, wherein the image data acquirer may include an illuminator that irradiates a radial region extending in a radial direction of the substrate rotated by the substrate holding rotator with light, and a line sensor that receives light reflected by the radial region of the substrate.

In this case, the first and second image data can be acquired with a simple configuration.

(20) An inspector according to yet another aspect of the present invention that performs appearance inspection for a substrate includes an image data acquirer that acquires image data indicating a first image of a substrate with no defect in appearance as first image data, and acquires image data indicating a second image of a substrate to be inspected as second image data by picking up an image of the substrate to be inspected, a corrector that corrects correspondence relationships between pixels of the first image data and pixels of the second image data, and a determiner that calculates values related to differences between gradation values of pixels of the first image data acquired by the image data acquirer and gradation values of corresponding pixels of the second image data acquired by the image data acquirer as pieces of difference information based on the correspondence relationship corrected by the corrector, and determines whether there is a defect in appearance on the substrate to be inspected based on whether each piece of calculated difference information is in a predetermined allowable range, wherein the first image is constituted by a plurality of first unit images, the first image data includes a plurality of pieces of first unit image data respectively indicating the plurality of first unit images, the second image is constituted by a plurality of second unit images, the second image data includes a plurality of pieces of second unit image data respectively indicating the plurality of second unit images, and the corrector detects relative deviation amounts between first and second unit images by comparing the pieces of first unit image data of the plurality of first unit images and the pieces of the second unit image data of the plurality of second unit images, the plurality of first and second unit images being located at corresponding positions, calculates a deviation amount for every pixel of the first and second images based on a plurality of deviation amounts detected for the plurality of first and second unit images, and corrects the correspondence relationship between a pixel of the first image data and a pixel of the second image data based on the calculated deviation amount for every pixel to resolve the deviation.

In the inspector, the image data of the substrate with no defect in appearance is acquired as the first image data, and the image data of the substrate to be inspected is acquired as the second image data. As for a normal portion of the substrate to be inspected, a difference between a gradation value of a pixel of the first image data and a gradation value of a corresponding pixel of the second image is small. On the one hand, as for a defective portion of the substrate to be inspected, a difference between a gradation value of a pixel of the first image data and a gradation value of a corresponding pixel of the second image data is large. Therefore, even in the case where a gradation value of the pixel corresponding to the defective portion is close to a gradation value of the pixel corresponding to the normal portion, the above-mentioned difference corresponding to a defective portion is larger than the above-mentioned difference corresponding to a normal portion.

A value for a difference between a gradation value of a pixel of the first image data and a gradation value of a corresponding pixel of the second image data is calculated as a piece of difference information. In this case, the piece of difference information for the pixel corresponding to the defective portion and the piece of difference information for the normal portion can be distinguished from each other. Therefore, an allowable range is determined in advance to include the piece of difference information corresponding to a normal portion and not to include the piece of difference information corresponding to a defective portion, whereby it is possible to determine whether there is a defect.

However, local distortion that is not a defect sometimes occurs in the substrate to be inspected. In this case, a position of the pixel of the second image corresponding to a distorted portion deviates from the position of the truly corresponding pixel of the first image. Therefore, when the above-mentioned pieces of difference information are calculated on assumption that the correspondence relationship between the first and second image data is accurate, presence and absence of a defect cannot be accurately determined.

In the present invention, a relative deviation amount between the first and second unit images is detected by comparison between the pieces of first and second unit image data of the first and second unit images located at positions corresponding to each other. Thus, a relative deviation amount between respective positions is detected for a plurality of portions corresponding to each other between the first and second images.

A deviation amount for every pixel between the first and second images is calculated based on the plurality of detected deviation amounts. The correspondence relationship between a pixel of the first image data and a pixel of the second image data is corrected based on the calculated deviation amount for every pixel, and a deviation for every pixel is resolved.

Thus, even in the case where local distortion is present in the substrate to be inspected, the pixels corresponding to each other can be accurately distinguished by correction of the correspondence relationship between a pixel of the first image data and a corresponding pixel of the second image data. A value related to a difference between a gradation value of a pixel of the first image data and a gradation value of a corresponding pixel of the second image data is calculated as a piece of difference information based on the corrected correspondence relationship.

In this case, for a normal portion, a gradation value of the pixel of the first image and a gradation value of the pixel located at a corresponding position of the second image substantially coincide with each other, so that a piece of difference information is small. On the one hand, for a defective portion, a difference resulting from a defect occurs between a gradation value of the pixel of the first image and a gradation value of the pixel located at a corresponding position of the second image, so that a piece of difference information is large. Therefore, a defect in appearance on the substrate can be detected with high accuracy.

(21) The determiner may detect a defect in appearance on the substrate based on a pixel of which the piece of difference information is outside of the allowable range.

In this case, in the case where there is a defect in appearance on the substrate to be inspected, a position and a shape of a defect can be identified.

(22) The corrector may calculate, for first and second unit images located at positions corresponding to each other, a plurality of coincidence degrees indicating degrees of coincidence between pieces of one unit image data and pieces of another unit image data based on differences between gradation values of pixels located at corresponding positions, while moving the other unit image with respect to the one unit image, may detect a movement amount of the other unit image in the case where the calculated coincidence degree is maximized as a relative deviation amount between the first and second unit images.

In this case, a relative deviation amount between the first and second unit images is appropriately detected based on a difference in gradation value of a pixel corresponding to a normal portion.

(23) The corrector may calculate, for first and second unit images located at positions corresponding to each other, a plurality of coincidence degrees indicating degrees of coincidence between pieces of one unit image data and pieces of another unit image data based on differences between gradation values of pixels located at corresponding positions, while moving the other unit image with respect to the one unit image, may detect, in the case where magnitude of variations of the calculated coincidence degrees is larger than a predetermined threshold value, a movement amount of the other unit image in the case where the coincidence degree is in a predetermined range of the coincidence degree and the deviation amount is minimized as a relative deviation amount between the first and second unit images, and may interpolate, in the case where magnitude of variations of the calculated coincidence degrees is not more than the predetermined threshold value, a relative deviation amount between the first and second unit images based on a deviation amount detected for other first and second unit images adjacent to the first and second unit images.

When variations in coincidence degree are excessively large, part of the coincidence degree may be erroneously calculated. Essentially, it is considered that the first and second unit images corresponding to each other are located at positions corresponding to each other or positions in the vicinity of the positions. Therefore, a remarkably low coincidence degree is likely to be erroneously calculated.

In the above-mentioned configuration, in the case where the magnitude of variations in coincidence degree is larger than a threshold value, a movement amount of the other unit image in the case where the coincidence degree is in a predetermined range of the coincidence degree and a deviation amount is minimized is detected as a relative deviation amount between the first and second unit images. Therefore, the above-mentioned range is set not to include a remarkably low coincidence degree, so that detection of a relative deviation amount between the first and second unit images based on the erroneously calculated coincidence degree is prevented.

On the one hand, in the case where the plurality of calculated coincidence degrees indicate substantially the constant value, it is difficult to identify a coincidence degree in the case where the pieces of first and second unit image data truly coincide with each other. Therefore, it is difficult to detect an accurate deviation amount.

In the above-mentioned configuration, in the case where the magnitude of variations in coincidence degree is not more than a threshold value, a relative deviation amount between the first and second unit images is interpolated based on the detected deviation amount between the other first and second unit images adjacent to the first and second unit images. Thus, a deviation amount for every pixel can be appropriately calculated even for the substrate not having the surface structure.

(24) Each of the plurality of first and second unit images may include a representative pixel located at a predetermined position in the unit image, and the corrector may determine a relative deviation amount detected for each of the plurality of first and second unit images as a relative deviation amount for each representative pixel of each of the plurality of first and second unit images, and may interpolate a deviation amount of pixels except for the plurality of representative pixels of the first and second pixels based on the determined deviation amount for every representative pixel.

In this case, a deviation amount for every pixel between the first and second images can be easily calculated in a short period of time.

(25) The inspector may further include an emphasis processer that performs emphasis processing on the first and second image data such that contrast between the first and second images is emphasized under a predetermined condition, wherein the corrector may detect the relative deviation amount between the first and second unit images by comparing the pieces of first and second unit image data on which the emphasis processing is performed by the emphasis processer.

In this case, the surface structure of the substrate is emphasized in the pixel corresponding to a normal portion by emphasis of the contrast between the first unit image and the second unit image. Thus, the normal surface structure of the substrate can be accurately identified. As a result, detection error of the relative deviation amount between the first and second unit images is prevented.

(26) The inspector may further include an optimization processer that optimizes a deviation amount for every pixel calculated by the corrector, wherein the optimization processer may calculate differences between the deviation amount calculated for each pixel and correction amounts of a plurality of pixels surrounding the pixel, may determine whether to treat the pixel as a target of interpolation based on a result of calculation, and may determine, for each of one or a plurality of pixels that are treated as the target of interpolation, a deviation amount of the pixel based on a deviation amount calculated for one or a plurality of pixels that is not treated as a target of interpolation among pixels surrounding the pixel, and the corrector may perform correction of the correspondence relationship based on a deviation amount for every pixel optimized by the optimization processer.

In this case, erroneously calculated deviation amount is optimized. Thus, the correspondence relationship between a pixel of the first image and a pixel of the second image is appropriately corrected. Therefore, a defect in appearance on the substrate can be detected with high accuracy.

(27) The pieces of difference information may include values acquired by addition of a constant value to values of differences between gradation values of pixels of the first image data and gradation values of corresponding pixels of the second image data.

In this case, overall gradation values, of the image based on the pieces of difference information, corresponding to all of the pixels can be increased. Thus, the user can view the image based on the pieces of difference information without an uncomfortable feeling.

(28) The determiner may determine that there is a defect in appearance on the substrate to be inspected in the case where the number of pieces of difference information outside of the allowable range is not less than a predetermined number.

Part of the pieces of difference information not corresponding to a defect may be outside of the allowable range due to noise, disturbance or the like. In the above-mentioned configuration, in the case where the number of the pieces of difference information outside of the allowable range is smaller than the predetermined number, it is not determined that there is a defect. Therefore, determination error due to noise, disturbance or the like can be prevented.

(29) The determiner may perform smoothing of the first image data, may produce first correction image data by subtracting a gradation value of each pixel of first image data after smoothing from a gradation value of each pixel of first image data before smoothing, may perform smoothing of the second image data, may produce second correction image data by subtracting a gradation value of each pixel of second image data after smoothing from a gradation value of each pixel of second image data before smoothing, and may calculate differences between gradation values of pixels of the first correction image data produced based on correspondence relationships corrected by the corrector and gradation values of corresponding pixels of the second correction image data produced based on the correspondence relationships corrected by the corrector as the pieces of difference information for pixels of the first image data and corresponding pixels of the second image data.

Normally, a gradation change resulting from a defect and normal structure of the substrate occurs more locally or dispersively than a gradation change resulting from a moire. Therefore, the first and second image data after smoothing include a gradation change resulting from a moire, and does not include a gradation change resulting from a defect in appearance and a gradation change resulting from the surface structure. The first correction image data from which a moire is removed is produced by subtraction of a gradation value of each pixel of the first image data after smoothing from a gradation value of each pixel of the first image data before smoothing. Further, the second correction image data from which a moire is removed is produced by subtraction of a gradation value of each pixel of the second image data after smoothing from a gradation value of each pixel of the second image data before smoothing.

The pieces of difference information are calculated based on the first and second correction image data. It is determined whether there is a defect in appearance on the substrate to be inspected based on the pieces of calculated difference information. Therefore, a reduction in detection accuracy due to a moire is prevented, and the appearance inspection for the substrate can be performed with high accuracy.

(30) The determiner may perform smoothing of the first and second image data by movement average filter processing.

In this case, smoothing of the first and second image data can be easily performed in a short period of time.

(31) The determiner may perform smoothing of the first and second image data such that the first and second image data after smoothing includes a gradation change resulting from a moire and does not include a gradation change resulting from a defect in appearance and normal surface structure.

In this case, the first and second correction image data that do not include a gradation change resulting from a moire and includes a gradation change resulting from a defect in appearance and normal surface structure can be appropriately produced.

(32) The inspector may further include a substrate holding rotator that holds and rotates the substrate, wherein the image data acquirer may include an illuminator that irradiates a radial region extending in a radial direction of the substrate rotated by the substrate holding rotator with light, and a line sensor that receives light reflected by the radial region of the substrate.

In this case, the first and second image data can be acquired with a simple configuration.

(33) A substrate processor according to yet another aspect of the present invention arranged to be adjacent to an exposer that performs exposure processing on a substrate includes a coater that forms a photosensitive film on a substrate before exposure processing by the exposer, a developer that performs development processing on the photosensitive film on the substrate after the exposure processing by the exposer, and any of the above-mentioned inspector that performs appearance inspection for the substrate after the formation of the photosensitive film by the coater.

In the substrate processor, a photosensitive film is formed on the substrate before exposure processing, and development processing is performed on the substrate after the exposure processing. The appearance inspection for the substrate after the formation of a photosensitive film is performed by the above-mentioned inspector. Thus, even in the case where the gradation value of the pixel corresponding to a defective portion is close to the gradation value of the pixel corresponding to a normal portion in the second image data, the defect is distinguished from a normal portion based on the pieces of difference information. Further, in the case where there is a deviation of pixels corresponding to each other between the first and second image data, a defect in appearance on the substrate can be detected with high accuracy. Further, even in the case where local distortion occurs for the substrate to be inspected, a defect in appearance on the substrate can be detected with high accuracy. Thus, the appearance inspection for a photosensitive film on the substrate can be performed with high accuracy.

(34) The inspector performs the appearance inspection for the substrate after the formation of the photosensitive film by the coater and after the development processing by the developer.

In this case, the appearance inspection for a photosensitive film that has been patterned by the development processing can be performed with high accuracy.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 8 is a diagram showing a surface image of a non-defective sample substrate;

FIG. 9 is a diagram showing appearance frequency of a gradation value in surface image data of the non-defective sample substrate;

FIG. 10 is a flow chart of defect determination processing according to the first embodiment;

FIG. 31 is a diagram for conceptually explaining contents of each processing of the correspondence relationship correction processing of FIG. 29;

FIG. 32 is a diagram for conceptually explaining contents of each processing of the correspondence relationship correction processing of FIG. 29;

FIGS. 40A to 40C are diagrams showing a state of deviation amounts of a plurality of pixels optimized by the deviation amount optimization processing;

DESCRIPTION OF THE PREFERRED EMBODIMENTS

An inspection device and a substrate processing apparatus according to one embodiment of the present invention will be described below with reference to the drawings. In the following description, a substrate refers to a semiconductor substrate, a substrate for a liquid crystal display device, a substrate for a plasma display, a glass substrate for a photomask, a substrate for an optical disc, a substrate for a magnetic disc, a substrate for a magneto-optical disc, a substrate for a photomask or the like.

Figure 1:
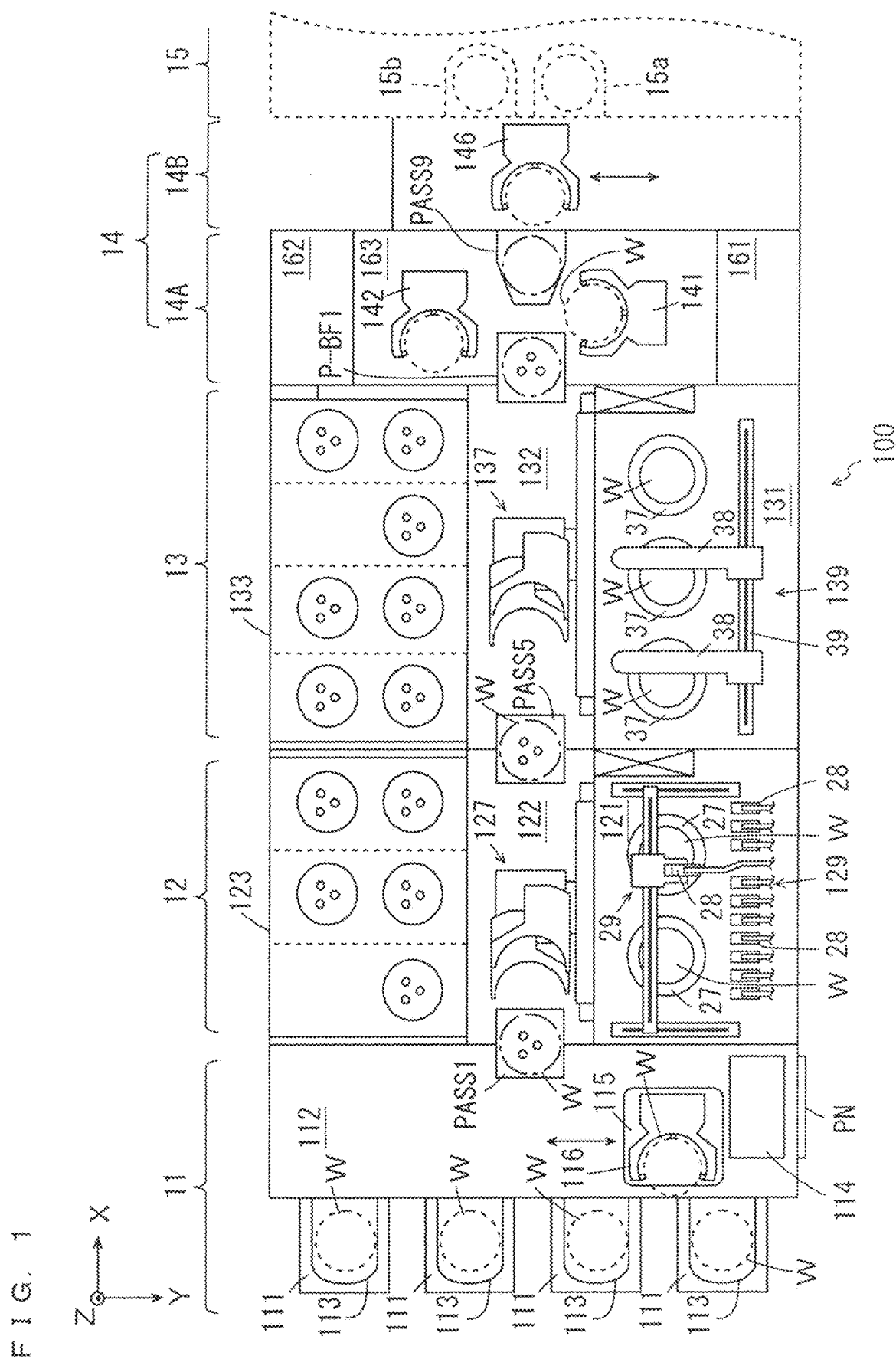
FIG. 1 is a schematic plan view showing the configuration of a substrate processing apparatus according to a first embodiment.

[1] First Embodiment (1) Overall Configuration of Substrate Processing Apparatus FIG. 1 is a schematic plan view showing the configuration of the substrate processing apparatus 100 according to the first embodiment. FIG. 1 and subsequently given diagrams are accompanied by arrows that indicate X, Y, and Z directions orthogonal to one another for clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out (indexer) block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

The indexer block 11 includes a plurality of carrier platforms 111 and a transport section (a transport space) 112. In each carrier platform 111, a carrier 113 for storing the plurality of substrates W in multiple stages is placed.

A controller 114 and a transport mechanism (a transport robot) 115 are provided in the transport section 112. The controller 114 includes a CPU (Central Processing Unit) and a memory, or a microcomputer, for example, and controls various constituent elements of the substrate processing apparatus 100. The transport mechanism 115 has a hand 116 for holding the substrate W. The transport mechanism 115 holds the substrate W by the hand 116 and transports the substrate W.

A main panel PN is provided on a side surface of the transport section 112. The main panel PN is connected to the controller 114. A user can confirm the processing status of the substrate W in the substrate processing apparatus 100 and other pieces of information on the main panel PN.

The first processing block 12 includes a coating processing section (a coating processing space) 121, a transport section (a transport processing space) 122 and a thermal processing section (a thermal processing space) 123. The coating processing section 121 and the thermal processing section 123 are provided to be opposite to each other with the transport section 122 sandwiched therebetween. Substrate platform PASS1, and substrate platforms PASS2 to PASS4 (see FIG. 4), described below, on which the substrates W are placed are provided between the transport section 122 and the transport section 112. A transport mechanism (a transport robot) 127 and a transport mechanism (a transport robot) 128 (see FIG. 4) that is described below, which transport the substrates W, are provided in the transport section 122.

The second processing block 13 includes a coating development processing section (a coating development processing space) 131, a transport section (a transport space) 132 and a thermal processing section (a thermal processing space) 133. The coating development processing section 131 and the thermal processing section 133 are provided to be opposite to each other with the transport section 132 sandwiched therebetween. Substrate platform PASS5, and substrate platforms PASS6 to PASS8 (see FIG. 4), described below, on which the substrates W are placed are provided between the transport section 132 and the transport section 122. A transport mechanism (a transport robot) 137 and a transport mechanism 138 (a transport robot) (see FIG. 4) that is described below, which transport the substrates W, are provided in the transport section 132.

The cleaning drying processing block 14A includes cleaning drying processing sections (cleaning drying processing spaces) 161, 162 and a transport section (a transport space) 163. The cleaning drying processing sections 161, 162 are provided to be opposite to each other with the transport section 163 sandwiched therebetween. Transport mechanisms (transport robots) 141, 142 are provided in the transport section 163. A placement buffer unit P-BF1 and a placement buffer unit P-BF2 (see FIG. 4) that is described below are provided between the transport section 163 and the transport section 132.

Further, a substrate platform PASS9 and placement cooling platforms P-CP (see FIG. 4) that are described below are provided to be adjacent to the carry-in carry-out block 14B between the transport mechanisms 141, 142. In the placement cooling platform P-CP, the substrate W is cooled to a temperature suitable for the exposure processing.

A transport mechanism (a transport robot) 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided at the exposure device 15.

Figure 2:
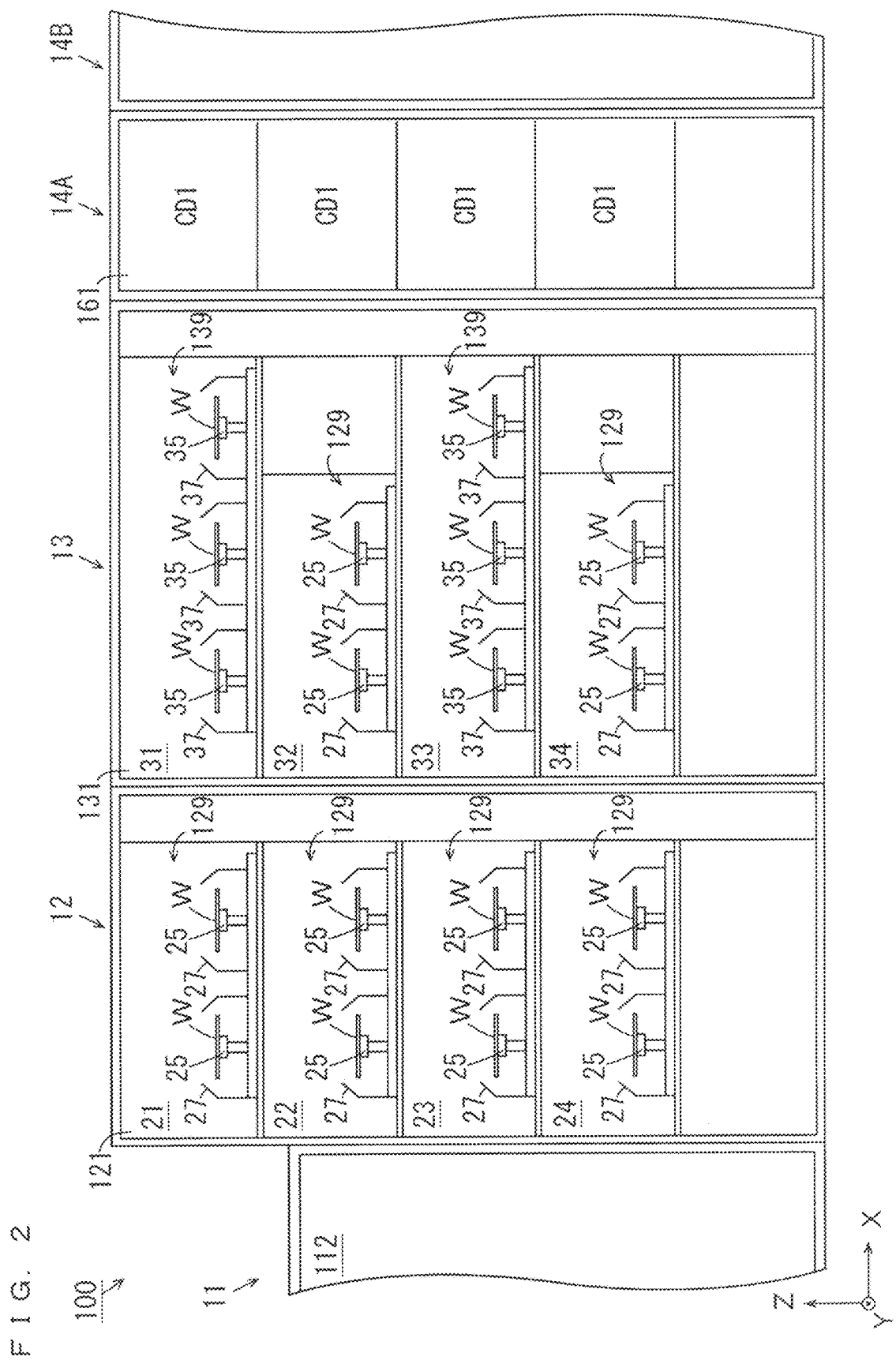
FIG. 2 is a schematic side view of the substrate processing apparatus mainly showing a coating processing section, a coating development processing section and a cleaning drying processing section.

FIG. 2 is a schematic side view of the substrate processing apparatus 100 mainly showing the coating processing section 121, the coating development processing section 131 and the cleaning drying processing section 161 of FIG. 1.

As shown in FIG. 2, in the coating processing section 121, coating processing chambers 21, 22, 23, 24 are provided in a stack. In the coating development processing section 131, development processing chambers 31, 33, and coating processing chambers 32, 34 are provided in a stack. In each of the coating processing chambers 21 to 24, 32, 34, a coating processing unit (a coater) 129 is provided. In each of the development processing chambers 31, 33, a development processing unit (a developer) 139 is provided.

Each coating processing unit 129 includes spin chucks 25 that hold the substrates W and cups 27 provided to cover the surroundings of the spin chucks 25. In the present embodiment, two pairs of the spin chucks 25 and the cups 27 are provided in each coating processing unit 129. Each spin chuck 25 is driven to be rotated by a driving device that is not shown (an electric motor, for example). Further, as shown in FIG. 1, each coating processing unit 129 includes a plurality of coating nozzles 28 that discharge a processing liquid and a nozzle transport mechanism (a nozzle transport robot) 29 that transports these coating nozzles 28.

In each coating processing unit 129, any one of the plurality of coating nozzles 28 is moved to a position above the substrate W by the nozzle transport mechanism 29. With the spin chuck 25 being rotated by a driving device (not shown), the processing liquid is discharged from the coating nozzle 28. Thus, the processing liquid is applied to an upper surface of the substrate W. Further, a rinse liquid is discharged to a peripheral portion of the substrate W from an edge rinse nozzle (not shown). Thus, the processing liquid adhering to the peripheral portion of the substrate W is removed.

In the present embodiment, in the coating processing unit 129 in each of the coating processing chambers 22, 24, a processing liquid for an anti-reflection film is supplied to the substrate W from the coating nozzle 28. In the coating processing unit 129 in each of the coating processing chambers 21, 23, a processing liquid for a resist film is supplied to the substrate W from the coating nozzle 28. In the coating processing unit 129 in each of the coating processing chambers 32, 34, a processing liquid for a resist cover film is supplied to the substrate W from the coating nozzle 28.

As shown in FIG. 2, each development processing unit 139 includes spin chucks 35 and cups 37 similarly to the coating processing unit 129. In the present embodiment, three pairs of the spin chucks 35 and the cups 37 are provided in the development processing unit 139. The spin chuck 35 is driven to be rotated by a driving device (not shown) (an electrical motor, for example). Further, as shown in FIG. 1, the development processing unit 139 includes two development nozzles 38 that discharge a development liquid and a moving mechanism (a moving robot) 39 that moves the development nozzles 38 in the X direction. In the development processing unit 139, one development nozzle 38 supplies a development liquid to each substrate W while moving in the X direction. Subsequently, the other development nozzle 38 supplies a development liquid to each substrate W while moving. In this case, the development liquid is supplied to the substrate W, so that a resist cover film on the substrate W is removed, and the development processing for the substrate W is performed.

A plurality (four in the present example) of cleaning drying processing units CD1 are provided in the cleaning drying processing section 161. In each cleaning drying processing unit CD1, cleaning and drying processing for the substrate W before the exposure processing are performed.

Figure 3:
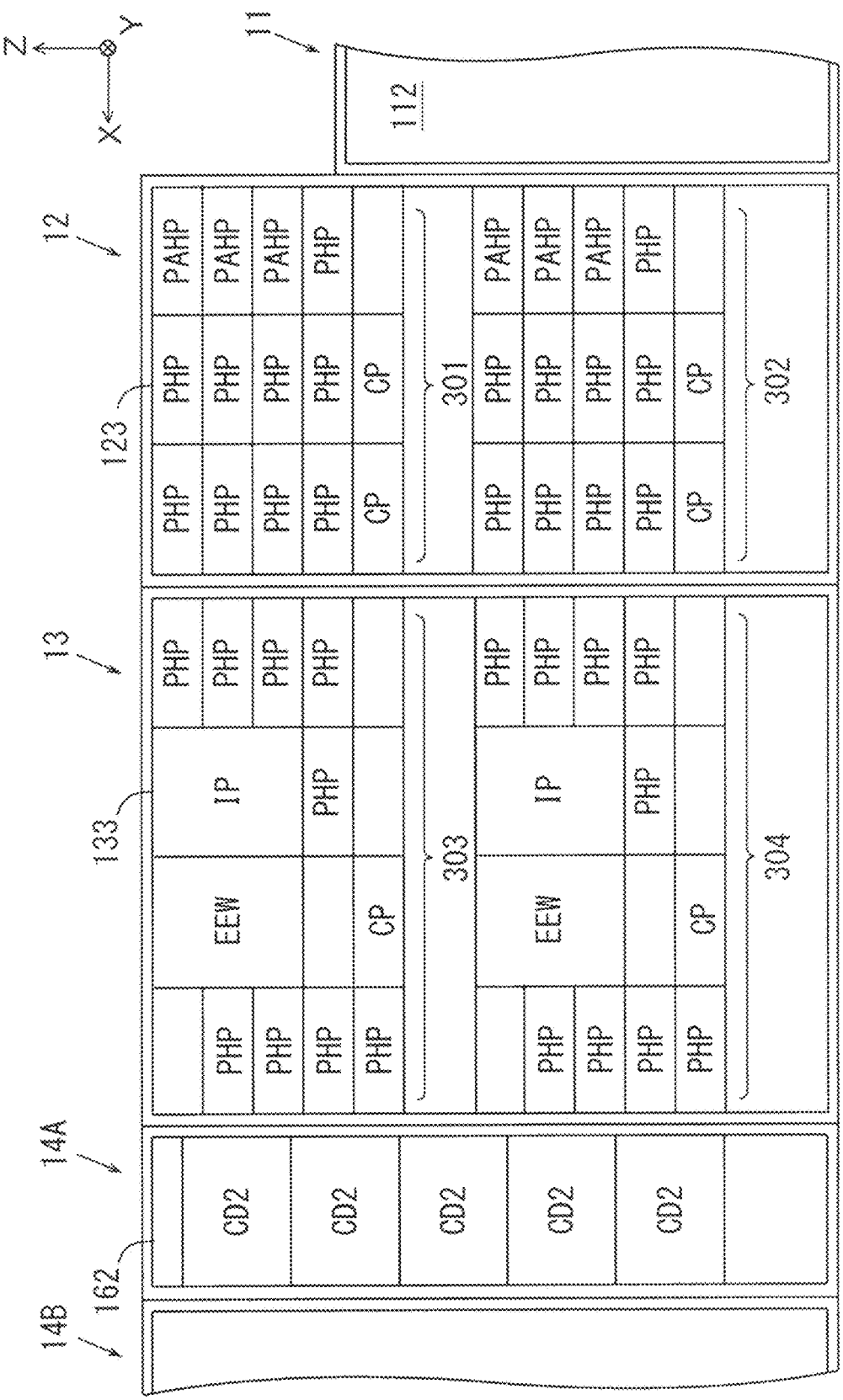
FIG. 3 is a schematic side view of the substrate processing apparatus mainly showing a thermal processing section and the cleaning drying processing section of FIG. 1.

FIG. 3 is a schematic side view of the substrate processing apparatus 100 mainly showing the thermal processing sections 123, 133 and the cleaning drying processing section 162 of FIG. 1.

As shown in FIG. 3, the thermal processing section 123 has an upper thermal processing section (an upper thermal processing space) 301 provided above, and a lower thermal processing section (a lower thermal processing space) 302 provided below. In each of the upper thermal processing section 301 and the lower thermal processing section 302, a plurality of thermal processing units PHP, a plurality of adhesion reinforcement processing units PAHP and a plurality of cooling units (a cooling plate) CP are provided.

In each thermal processing unit PHP, heating processing and cooling processing for the substrate W are performed. Hereinafter, the heating processing and the cooling processing in the thermal processing unit PHP are simply referred to as thermal processing. In the adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section (an upper thermal processing space) 303 provided above and a lower thermal processing section (a lower thermal processing space) 304 provided below. In each of the upper thermal processing section 303 and the lower thermal processing section 304, a cooling unit CP, an edge exposure unit EEW, an inspection unit IP, and a plurality of thermal processing units PHP are provided. In the edge exposure unit EEW, exposure processing (edge exposure processing) for a peripheral portion of the substrate W is performed. In the inspection unit IP, appearance inspection for the substrate W after the development processing is performed. An inspection device (an inspector) is constituted by the inspection unit IP and the controller 114 of FIG. 1. Details of the inspection unit IP will be described below. In the upper thermal processing section 303 and the lower thermal processing section 304, each thermal processing unit PHP provided to be adjacent to the cleaning drying processing block 14A is configured to be capable of carrying in the substrate W from the cleaning drying processing block 14A.

A plurality (four in the present example) of cleaning drying processing units CD2 are provided in the cleaning drying processing section 162. In each cleaning drying processing unit CD2, the cleaning and drying processing for the substrate W after the exposure processing are performed.

Figure 4:
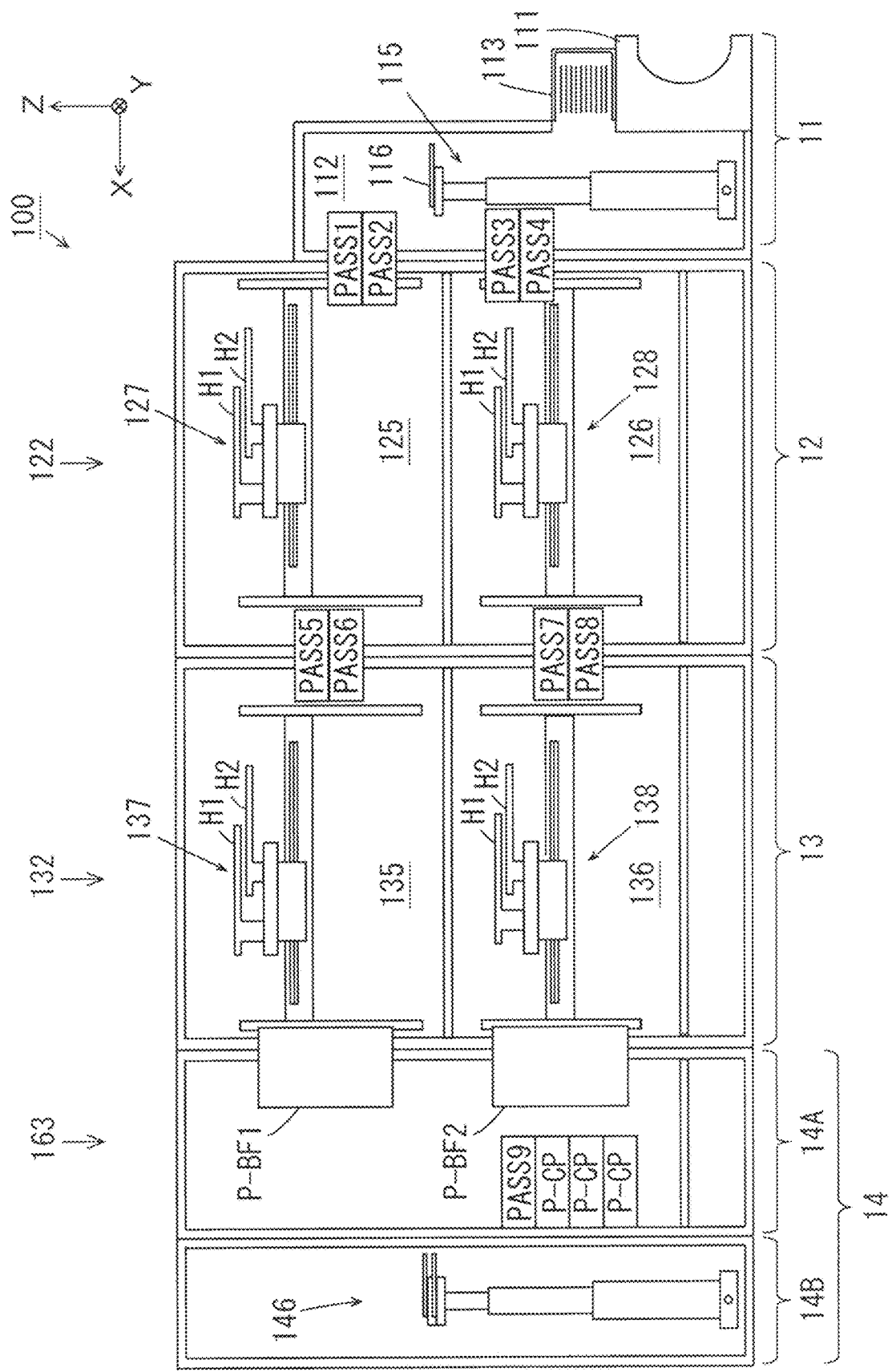
FIG. 4 is a schematic side view mainly showing a transport section of FIG. 1.

FIG. 4 is a schematic side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The transport mechanism 127 is provided in the upper transport chamber 125, and the transport mechanism 128 is provided in the lower transport chamber 126. Further, the transport mechanism 137 is provided in the upper transport chamber 135, and the transport mechanism 138 is provided in the lower transport chamber 136.

Each of the transport mechanisms 127, 128, 137, 138 has hands H1, H2. Each of the transport mechanisms 127, 128, 137, 138 can hold the substrate W using the hands H1, H2, and transport the substrate W by freely moving the hands H1, H2 in the X and Z directions.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling platforms P-CP are provided to be adjacent to the interface block 14 in the transport section 163.

The transport mechanism 127 is configured to be capable of transporting the substrate W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrate W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrate W among the substrate platforms PASS5, PASS6, the placement buffer unit P-BF1, the development processing chamber 31 (FIG. 2), the coating processing chamber 32 and the upper thermal processing section 303 (FIG. 3). The transport mechanism 138 is configured to be capable of transporting the substrate W among the substrate platforms PASS7, PASS8, the placement buffer unit P-BF2, the development processing chamber 33 (FIG. 2), the coating processing chamber 34 and the lower thermal processing section 304 (FIG. 3).

(2) Configuration of Inspection Units

Figure 5:
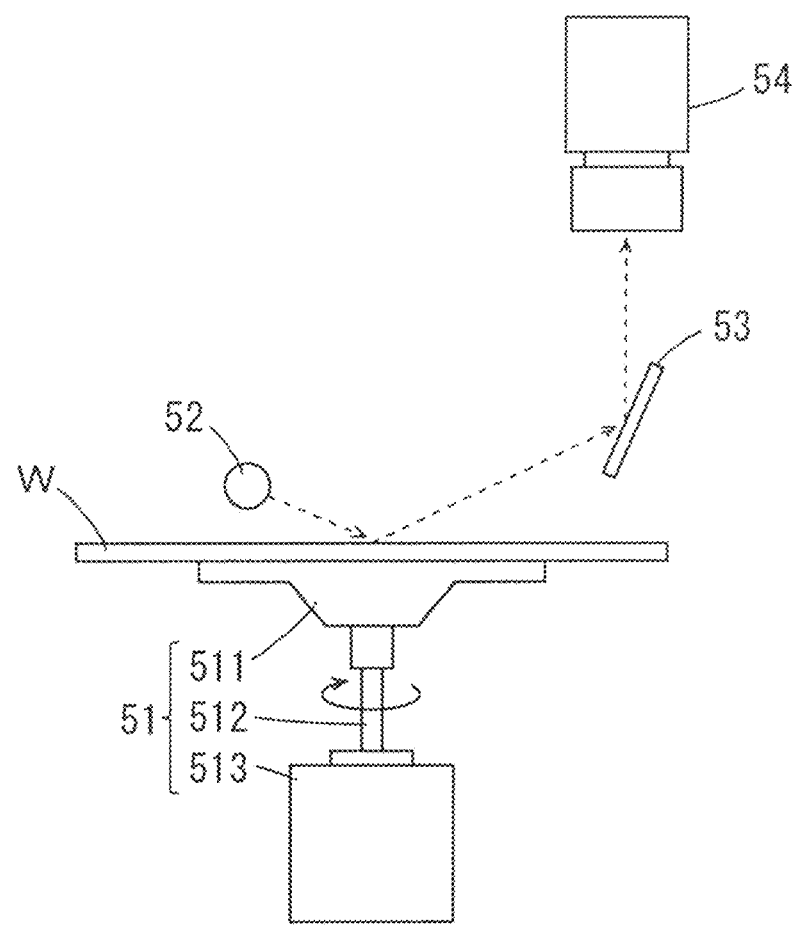
FIG. 5 is a schematic side view for explaining the configuration of an inspection unit.
Figure 6:
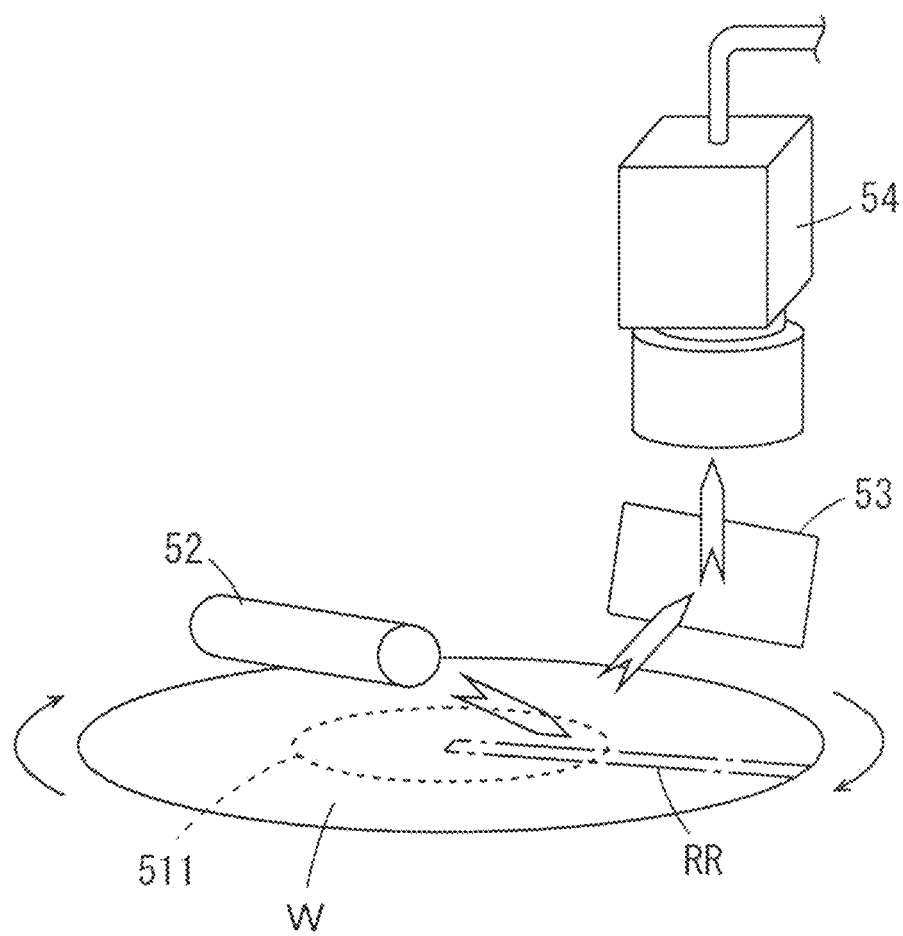
FIG. 6 is a schematic perspective view for explaining the configuration of the inspection unit.

FIGS. 5 and 6 are a schematic side view and a schematic perspective view for explaining the configuration of the inspection unit IP. As shown in FIG. 5, the inspection unit IP includes a holding rotator 51, an illuminator 52, a reflection mirror 53 and a CCD line sensor 54.

The holding rotator 51 includes a spin chuck 511, a rotation shaft 512, and a motor 513. The spin chuck 511 holds the substrate W in a horizontal attitude by sucking substantially the center of a lower surface of the substrate W under vacuum. The rotation shaft 512 and the spin chuck 511 are integrally rotated by the motor 513. Thus, the substrate W held by the spin chuck 511 is rotated about the shaft extending in a vertical direction (the Z direction). In the present example, a surface of the substrate W is directed upward. The surface of the substrate W is the surface of the substrate W on which a circuit pattern is formed.

As shown in FIG. 6, the illuminator 52 emits strip-shape inspection light. A line region (hereinafter referred to as a radial region) RR extending in a radial direction of the surface of the substrate W held by the spin chuck 511 is irradiated with the inspection light. The inspection light reflected by the radial region RR is further reflected by the reflection mirror 53, and is led to the CCD line sensor 54. The distribution of the light reception amount of the CCD line sensor 54 is equivalent to the distribution of the brightness of the reflected light in the radial region RR. Surface image data of the substrate W is produced based on the distribution of the light reception amount of the CCD line sensor 54. The surface image data shows an image of the surface of the substrate W (hereinafter referred to as a surface image). In the present example, the distribution of the light reception amount of the CCD line sensor 54 is supplied to the controller 114 of FIG. 1, and the surface image data is produced by the controller 114.

Figure 7A:
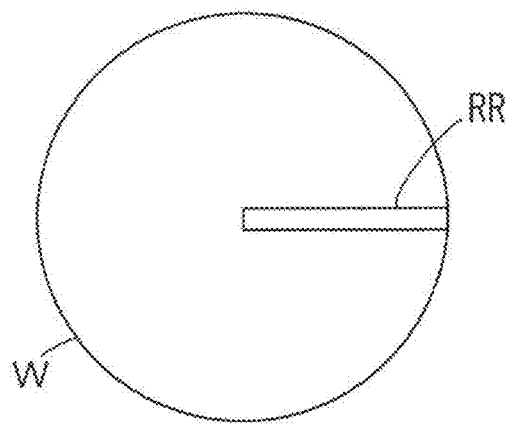
FIGS. 7A to 7F are diagrams for explaining production of surface image data.
Figure 7D:
Figure 7B:
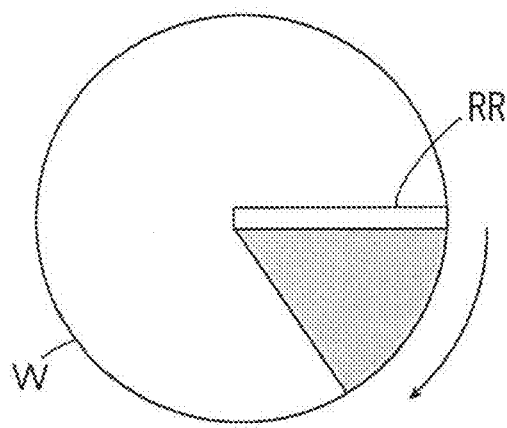
Figure 7E:
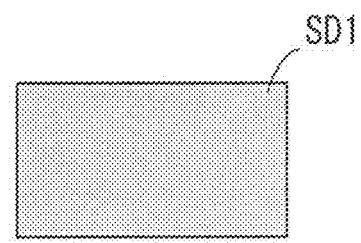
Figure 7C:
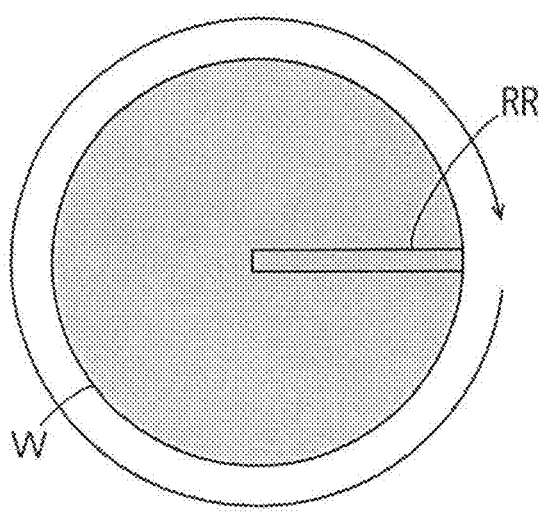
Figure 7F:
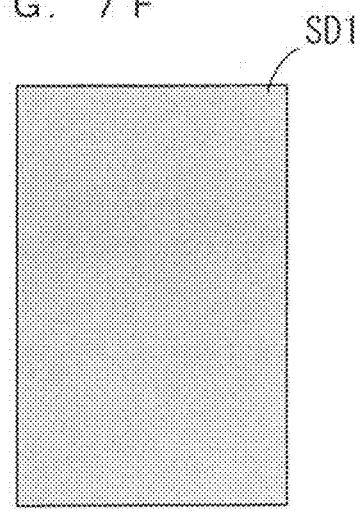

FIGS. 7A to 7F are diagrams for explaining the production of surface image data. In FIGS. 7A, 7B and 7C, illumination states of the inspection light on the substrate W are sequentially shown. In FIGS. 7D, 7E and 7F, the surface images corresponding to the surface image data produced in the states of the FIGS. 7A, 7B and 7C are shown. In FIGS. 7A to 7C, a dotted pattern is applied to the regions on the substrate W irradiated with the inspection light.

As shown in each of FIGS. 7A to 7C, the substrate W is rotated while the radial region RR on the substrate W is intermittently irradiated with the inspection light. Thus, the substrate W is successively irradiated with the inspection light in a circumferential direction of the substrate W. When the substrate W is rotated once, the entire surface of the substrate W is irradiated with the inspection light.

Based on the distribution of the light reception amount of the CCD line sensor 54 acquired in a period in which the substrate W is rotated once, the surface image data indicating a rectangular surface image SD1 is produced as shown in each of FIGS. 7D to 7F. In each of FIGS. 7D to 7F, the abscissa of the surface image SD1 corresponds to a position of each pixel of the CCD line sensor 54, and the ordinate of the surface image SD1 corresponds to a rotation angle of the substrate W. In this case, the distribution of the brightness of the reflected light on the surface of the substrate W in the radial direction of the substrate W is shown in a direction of the abscissa of the surface image SD1. Further, the distribution of the brightness of the reflected light on the surface of the substrate W in a circumferential direction of the substrate W is shown in a direction of the ordinate of the surface image SD1. At a time point where the substrate W is rotated once, the distribution of the brightness of the reflected light on the entire surface of the substrate W is acquired as the surface image data indicating one rectangular surface image SD1.

The acquired surface image data of the surface image SD1 is corrected to show the surface image in the shape (circular) of the substrate W. The appearance inspection for the substrate W is performed based on the corrected surface image data. In the present embodiment, the appearance inspection for the resist film that has been patterned by the development processing (hereinafter referred to as a resist pattern) is performed.

(3) Method of Appearance Inspection

The brightness of a normal portion of the surface image of the substrate W can be found based on surface image data of a non-defective sample substrate, for example. FIG. 8 is a diagram showing a surface image of a non-defective sample substrate. In a surface image SD2 of FIG. 8, the surface structure of the substrate W including a net-like resist pattern RP is shown. The surface structure of the substrate W does not mean a defect, but means the normally formed structure such as a circuit pattern and a resist pattern. In the present example, the brightness of the surface image SD2 is indicated by a gradation value of each pixel. The higher the gradation value is, the brighter the pixel is.

FIG. 9 is a diagram showing the appearance frequency of the gradation value in the surface image data of the non-defective sample substrate. In FIG. 9, the abscissa indicates the gradation value, and the ordinate indicates the appearance frequency of each gradation value. As shown in FIG. 9, in the present example, a lower limit value of the gradation value in the surface image data is TH1, and an upper limit value of the gradation value in the surface image data is TH2. Two peaks are shown between the lower limit value TH1 and the upper limit value TH2. The peak with a smaller gradation value between the two peaks is mainly based on the gradation value of the resist pattern RP of FIG. 8, and the peak with a larger gradation value is mainly based on the gradation value of the surface structure of the substrate W except for the resist pattern RP.

Normally, the gradation value of a defect is different from the gradation value of a normal portion. Therefore, as indicated by outlined arrows a1 and dotted lines, it can be determined that there is a defect in appearance on the substrate W in which a gradation value that falls outside of a range between the above-mentioned lower limit value TH1 and upper limit value TH2 is detected. Further, it can be determined that there is no defect in appearance on the substrate W in which a gradation value that falls outside of the range between the lower limit value TH1 and the upper limit value TH2 is not detected.

However, depending on a defect formed on the substrate W, as indicated by an outlined arrow a2 and one-dot and dash lines in FIG. 9, the gradation value of the pixel corresponding to the defect may be located between the above-mentioned lower limit value TH1 and the upper limit value TH2. In this case, it is determined that there is no defect in appearance by the above-mentioned determination method.

Figure 11:
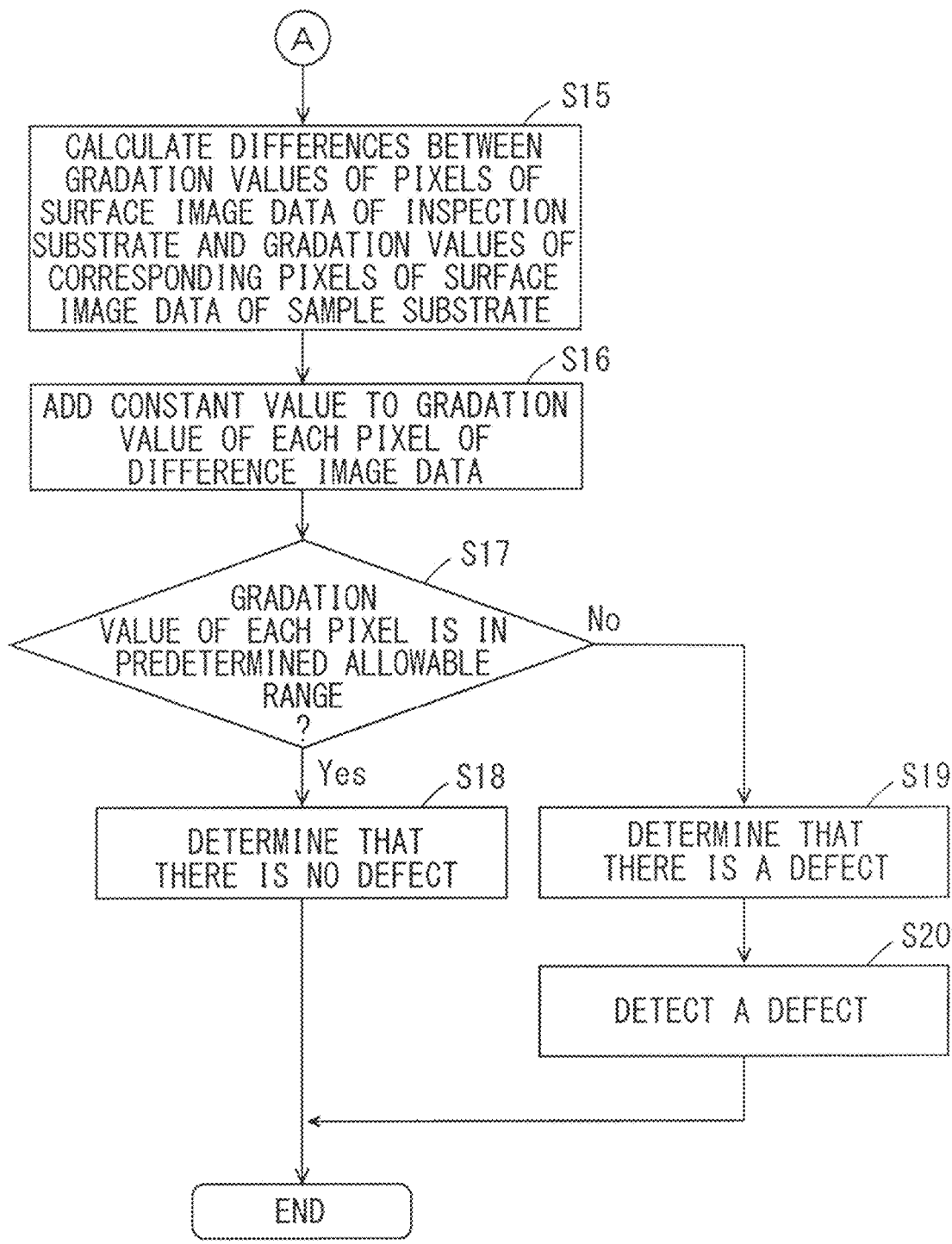
FIG. 11 is a flow chart of the defect determination processing according to the first embodiment.

In the present embodiment, defect determination processing, described below, is performed by the controller 114 of FIG. 1. FIGS. 10 and 11 are flow charts of the defect determination processing according to the first embodiment. FIGS. 12A to 12E are diagrams showing a plurality of surface images generated in the defect determination processing. In the following description, a substrate W to be inspected is referred to as an inspection substrate W.

Figure 12A:
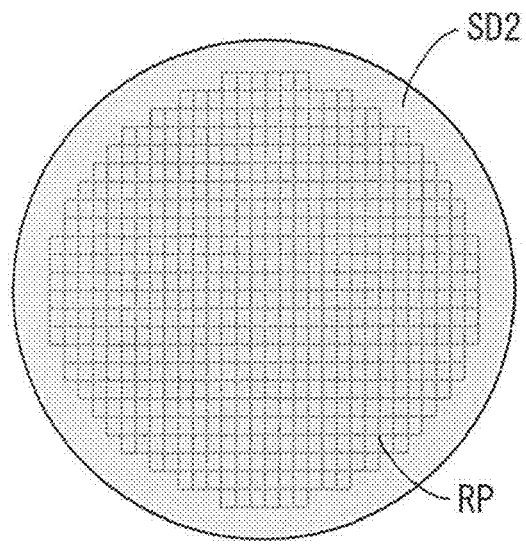
FIGS. 12A to 12E are diagrams showing a plurality of surface images produced in the defect determination processing.

Inspection is performed in advance with high accuracy before start of the defect determination processing, and the substrate that is determined to be non-defective in the inspection is prepared as a sample substrate. As shown in FIG. 10, the controller 114 first acquires the surface image data of the non-defective sample substrate (step S11), and corrects the acquired surface image data to produce a surface image in the shape of the substrate W (step S12). In the present embodiment, the surface image data is acquired by the above-mentioned inspection unit IP. The surface image data may be acquired by another device instead of the inspection unit IP. In FIG. 12A, a surface image SD2 of the sample substrate produced by the processing of the step S12 is shown. In the surface image SD2 of FIG. 12A, the surface structure of the sample substrate including the resist pattern RP is shown.

Figure 12B:
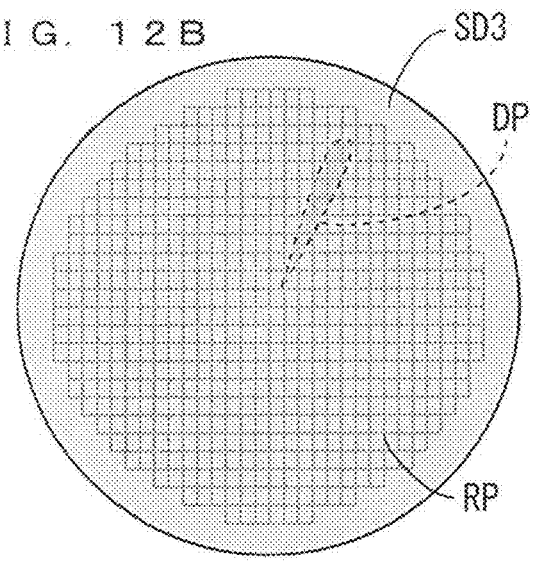

Next, the controller 114 acquires the surface image data of the inspection substrate W similarly to the processing of the steps S11 and S12 (step S13), and corrects the acquired surface image data to produce the surface image in the shape of the substrate W (step S14). In FIG. 12B, a surface image SD3 of the inspection substrate W produced by the processing of the step S14 is shown. In the surface image SD3 of FIG. 12B, a defect DP in appearance is shown in addition to the surface structure of the inspection substrate W. In each of the FIG. 12B and FIGS. 12C, 12D and 12E, described below, an outer edge of the defect DP is indicated by a dotted line in order to facilitate understanding of the shape of the defect DP.

Subsequently, as shown in FIG. 11, the controller 114 calculates a difference between a gradation value of a pixel of the surface image data of the inspection substrate W and a gradation value of a corresponding pixel of the surface image data of the sample substrate (step S15). More specifically, the controller 114 subtracts a gradation value of each pixel of the surface image SD2 of the sample substrate from a gradation value of each pixel of the surface image SD3 of the inspection substrate W.

In this case, a correspondence relationship between the pixel of the surface image SD2 and the pixel of the surface image SD3 can be found by pattern matching between the surface structure of the sample substrate included in the surface image SD2 and the surface structure of the inspection substrate W included in the surface image SD3, for example. Alternatively, the above-mentioned correspondence relationship can be found based on a positional relationship between a cutout (an orientation flat or notch) for positioning that is commonly formed in the sample substrate and the inspection substrate W, and each pixel, for example.

In the surface image SD3 of the inspection substrate W, an image similar to the surface structure of the sample substrate included in the surface image SD2 is included together with the image of the defect DP. Therefore, as for the pixel corresponding to a normal portion of the inspection substrate W, a difference acquired by the processing of the step S15 is small. On the one hand, in the case where there is a defect in appearance on the inspection substrate W, as for the pixel corresponding to the defective portion, the above-mentioned difference is large. Thus, a difference in gradation value of the pixel corresponding to a defective portion and a difference in gradation value of the pixel corresponding to a normal portion can be distinguished from each other.

Figure 12C:
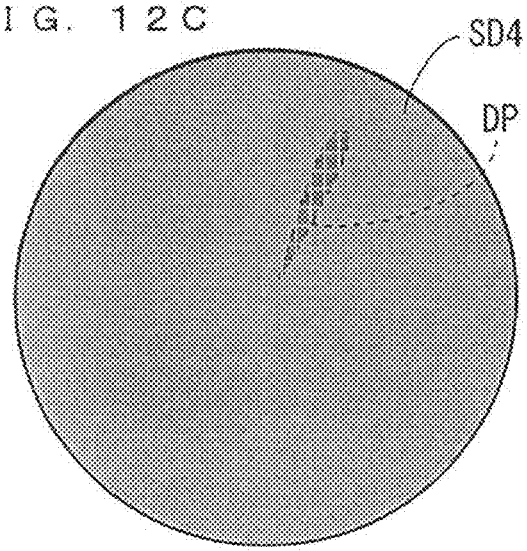

In the following description, surface image data made of the differences acquired by the processing of the step S15 is referred to as difference image data. In FIG. 12C, a surface image SD4 indicated by the difference image data is shown. In the surface image SD4 of FIG. 12C, the brightness of the defect DP is sufficiently darker than the brightness of a normal portion of the inspection substrate W.

Figure 12D:
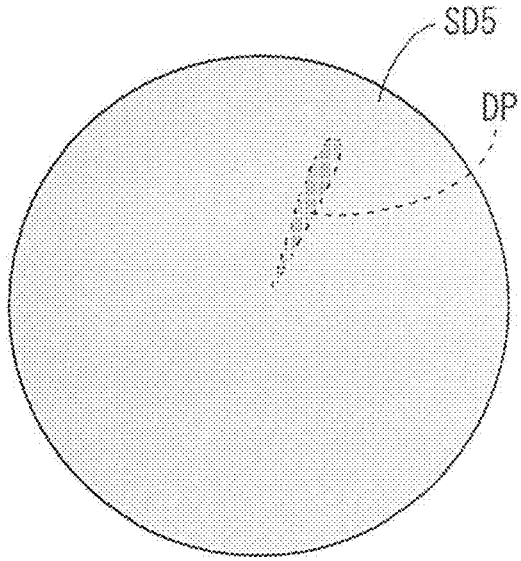

Next, the controller 114 adds a constant value to a gradation value of each pixel of the difference image data (step S16). Hereinafter, the surface image data after the processing of the step S16 is referred to as determination image data. For example, a center value of a range of gradation values is added to a gradation value of each pixel. Specifically, in the case where gradation values are indicated by numerical values of not less than 0 and not more than 255, 128 is added to a gradation value of each pixel. In FIG. 12D, a surface image SD5 indicated by the determination image data is shown. The surface image SD5 of FIG. 12D has appropriate brightness.

The controller 114 displays the produced surface image SD5 in the main panel PN of FIG. 1, for example. In this case, the user can view the surface image SD5 of FIG. 12D without an uncomfortable feeling. In the case where the user does not view the surface image SD5, the processing of the above-mentioned step S16 does not have to be performed.

Thereafter, the controller 114 determines whether a gradation value of each pixel of the determination image data is in a predetermined allowable range (step S17). In the present embodiment, the allowable range is determined in advance as a parameter specific to the device to include gradation values of pixels corresponding to normal portions of the determination image data, and not to include gradation values of pixels corresponding to defective portions of the determination image data.

In the case where a gradation value of each pixel of the determination image data is in the allowable range, the controller 114 determines that there is no defect in appearance on the inspection substrate W (step S18), and ends the defect determination processing. On the one hand, in the case where a gradation value of any pixel is outside of the allowable range, the controller 114 determines that there is a defect in appearance on the inspection substrate W (step S19). Further, the controller 114 detects the defect by extracting one or a plurality of pixels of which a gradation value is outside of the allowable range (step S20), and ends the defect determination processing.

Figure 12E:
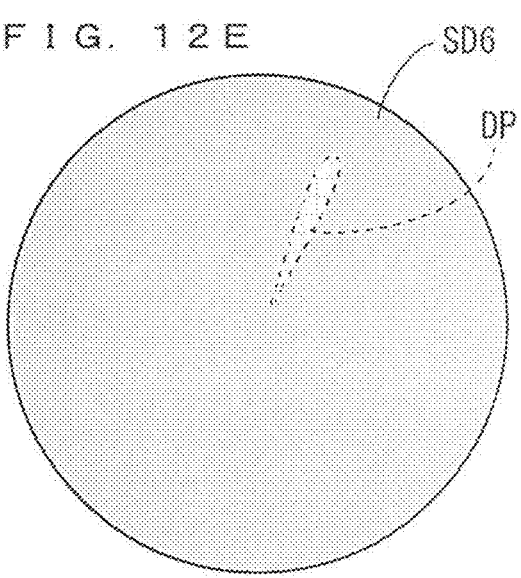

In the above-mentioned step S20, as shown in FIG. 12E, the controller 114 may produce a surface image SD6 showing the extracted defect DP. Further, the controller 114 may display the produced surface image SD6 in the main panel PN of FIG. 1. As described above, a position and a shape of the defect can be identified by the detection of a defect in appearance on the inspection substrate W.

For the inspection substrate W that is determined to be defective in the defect determination processing, after the inspection substrate W is carried out from the substrate processing apparatus 100, processing different from the processing for the substrate W that is determined to be non-defective is performed. For example, detailed examination, regeneration processing, or the like is performed on the inspection substrate W that is determined to be defective.

(4) Overall Operation of Substrate Processing Apparatus

The operation of the substrate processing apparatus 100 will be described with reference to FIGS. 1 to 4. The carrier 113 in which the unprocessed substrates W are stored is placed on the carrier platform 111 (FIG. 1) in the indexer block 11. The transport mechanism 115 transports the unprocessed substrate W from the carrier 113 to the substrate platform PASS1, PASS3 (FIG. 4). Further, the transport mechanism 115 transports the processed substrate W that is placed on the substrate platform PASS2, PASS4 (FIG. 4) to the carrier 113.

In the first processing block 12, the transport mechanism 127 (FIG. 4) sequentially transports the substrate W placed on the substrate platform PASS1 (FIG. 4) to the adhesion reinforcement processing unit PAHP (FIG. 3), the cooling unit CP (FIG. 3), the coating processing chamber 22 (FIG. 2), the thermal processing unit PHP (FIG. 3), the cooling unit CP (FIG. 3), the coating processing chamber 21 (FIG. 2), the thermal processing unit PHP (FIG. 3) and the substrate platform PASS5 (FIG. 4).

In this case, after the adhesion reinforcement processing is performed on the substrate W in the adhesion reinforcement processing unit PAHP, the substrate W is cooled to a temperature suitable for formation of the anti-reflection film in the cooling unit CP. Next, an anti-reflection film is formed on the substrate W by the coating processing unit 129 (FIG. 2) in the coating processing chamber 22. Subsequently, after the thermal processing for the substrate W is performed in the thermal processing unit PHP, the substrate W is cooled to a temperature suitable for the formation of a resist film in the cooling unit CP. Next, in the coating processing chamber 21, a resist film is formed on the substrate W by the coating processing unit 129 (FIG. 2). Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 4) to the substrate platform PASS2 (FIG. 4).

The transport mechanism 128 (FIG. 4) sequentially transports the substrate W placed on the substrate platform PASS3 (FIG. 4) to the adhesion reinforcement processing unit PAHP (FIG. 3), the cooling unit CP (FIG. 3), the coating processing chamber 24 (FIG. 2), the thermal processing unit PHP (FIG. 3), the cooling unit CP (FIG. 3), the coating processing chamber 23 (FIG. 2), the thermal processing unit PHP (FIG. 3), and the substrate platform PASS7 (FIG. 4). Further, the transport mechanism 128 (FIG. 4) transports the substrate W after the development processing that is placed on the substrate platform PASS8 (FIG. 4) to the substrate platform PASS4 (FIG. 4). The contents of processing for the substrate W in the coating processing chambers 23, 24 (FIG. 2) and the lower thermal processing section 302 (FIG. 3) are similar to the contents of processing for the substrate W in the above-mentioned coating processing chambers 21, 22 (FIG. 2) and upper thermal processing section 301 (FIG. 3).

In the second processing block 13, the transport mechanism 137 (FIG. 4) sequentially transports the substrate W after the resist film formation that is placed on the substrate platform PASS5 (FIG. 4) to the coating processing chamber 32 (FIG. 2), the thermal processing unit PHP (FIG. 3), the edge exposure unit EEW (FIG. 3), and the placement buffer unit P-BF1 (FIG. 4).

In this case, a resist cover film is formed on the substrate W by the coating processing unit 129 in the coating processing chamber 32. Subsequently, the edge exposure processing for the substrate W is performed in the edge exposure unit EEW after the thermal processing is performed on the substrate W in the thermal processing unit PHP, and the substrate W is placed on the placement buffer unit P-BF1.

Further, the transport mechanism 137 (FIG. 4) takes out the substrate W after the exposure processing and the thermal processing from the thermal processing unit PHP (FIG. 3) adjacent to the cleaning drying processing block 14A, and sequentially transports the substrate W to the cooling unit CP (FIG. 3), the development processing chamber 31 (FIG. 2), the thermal processing unit PHP (FIG. 3), the inspection unit IP (FIG. 3), and the substrate platform PASS6 (FIG. 4).

In this case, after the substrate W is cooled to a temperature suitable for the development processing in the cooling unit CP, the development processing for the substrate W is performed by the development processing unit 139 in the development processing chambers 31. Subsequently, after the thermal processing for the substrate W is performed in the thermal processing unit PHP, the appearance inspection for the substrate W is performed in the inspection unit IP. The substrate W after the appearance inspection is placed on the substrate platform PASS6.

The transport mechanism 138 (FIG. 4) sequentially transports the substrate W after the resist film formation that is placed on the substrate platform PASS7 (FIG. 4) to the coating processing chamber 34 (FIG. 2), the thermal processing unit PHP (FIG. 3), the edge exposure unit EEW (FIG. 3), and the placement buffer unit P-BF2 (FIG. 4). Further, the transport mechanism 138 (FIG. 4) takes out the substrate W after the exposure processing and the thermal processing from the thermal processing unit PHP (FIG. 3) adjacent to the cleaning drying processing block 14A, and sequentially transports the substrate W to the cooling unit CP (FIG. 3), the development processing chamber 33 (FIG. 2), the thermal processing unit PHP (FIG. 3), the inspection unit IP (FIG. 3), and the substrate platform PASS8 (FIG. 4). The contents of processing for the substrate W in the coating processing chamber 34, the development processing chamber 33 and the lower thermal processing section 304 are similar to the contents of the processing for the substrate W in the above-mentioned coating processing chamber 32, the development processing chamber 31, and the upper thermal processing section 303.

In the cleaning drying processing block 14A, the transport mechanism 141 (FIG. 1) sequentially transports the substrate W placed on the placement buffer unit P-BF1, P-BF2 (FIG. 4) to the cleaning drying processing unit CD1 in the cleaning drying processing section 161 (FIG. 2), and the placement cooling platform P-CP (FIG. 4). In this case, after the cleaning and drying processing for the substrate W are performed in the cleaning drying processing unit CD1, the substrate W is cooled to a temperature suitable for the exposure processing in the exposure device 15 (FIGS. 1 to 3) in the placement cooling platform P-CP.

The transport mechanism 142 (FIG. 1) transports the substrate W after the exposure processing that is placed on the substrate platform PASS9 (FIG. 4) to the cleaning drying processing unit CD2 in the cleaning drying processing section 162 (FIG. 3), and transports the substrate W after the cleaning and drying processing from the cleaning drying processing unit CD2 to the thermal processing unit PHP in the upper thermal processing section 303 (FIG. 3) or the thermal processing unit PHP in the lower thermal processing section 304 (FIG. 3). In this thermal processing unit PHP, the exposure bake (PEB) processing is performed.

In the interface block 14, the transport mechanism 146 (FIG. 1) transports the substrate W before the exposure processing that is placed on the placement cooling platform P-CP (FIG. 4) to the substrate inlet 15a of the exposure device 15 (FIG. 1). Further, the transport mechanism 146 (FIG. 1) takes out the substrate W after the exposure processing from the substrate outlet 15b of the exposure device 15 (FIG. 1), and transports the substrate W to the substrate platform PASS9 (FIG. 4).

In the case where the exposure device 15 cannot receive the substrate W, the substrate W before the exposure processing is temporarily stored in the placement buffer unit P-BF1, P-BF2. Further, in the case where the development processing unit 139 in the second processing block 13 (FIG. 2) cannot receive the substrate W after the exposure processing, the substrate W after the exposure processing is temporarily stored in the placement buffer unit P-BF1, P-BF2.

(5) Effects

In the defect determination processing according to the first embodiment, the surface image data of the sample substrate with no defect in appearance is acquired, and the surface image data of the inspection substrate W is acquired. For a normal portion of the inspection substrate W, a difference between a gradation value of a pixel of the surface image data of the inspection substrate W and a gradation value of a corresponding pixel of the surface image data of the sample substrate is small. On the one hand, for the pixel corresponding to a defective portion, the above-mentioned difference is large. Therefore, even in the case where a gradation value of the pixel corresponding to a defective portion is close to a gradation value of the pixel corresponding to a normal portion, the above-mentioned difference corresponding to a defective portion is larger than the above-mentioned difference corresponding to a normal portion.

A difference between a gradation value of a pixel of the surface image data of the inspection substrate W and a gradation value of a corresponding pixel of the surface image data of the sample substrate is calculated, and the difference image data is produced. Thus, a difference for the pixel corresponding to a defective portion and a difference for the pixel corresponding to a normal portion can be distinguished from each other. Therefore, the allowable range is determined in advance to include differences corresponding to normal portions and not to include differences corresponding to defective portions, whereby it is possible to determine whether there is a defect. As a result, a defect in appearance on the substrate W can be detected with high accuracy.

(6) Modified Example of Defect Determination Processing

In the step S17 of the above-mentioned defect determination processing, it is determined that there is a defect in appearance on the inspection substrate W in the case where a gradation value of each pixel of the determination image data is outside of the allowable range. However, the present invention is not limited to this.

In the determination image data, gradation values of part of the pixels not corresponding to a defect may be outside of the allowable range due to noise, disturbance or the like. In the defect determination processing, the following processing may be performed instead of the processing of the step S17 of FIG. 11.

Figure 13:
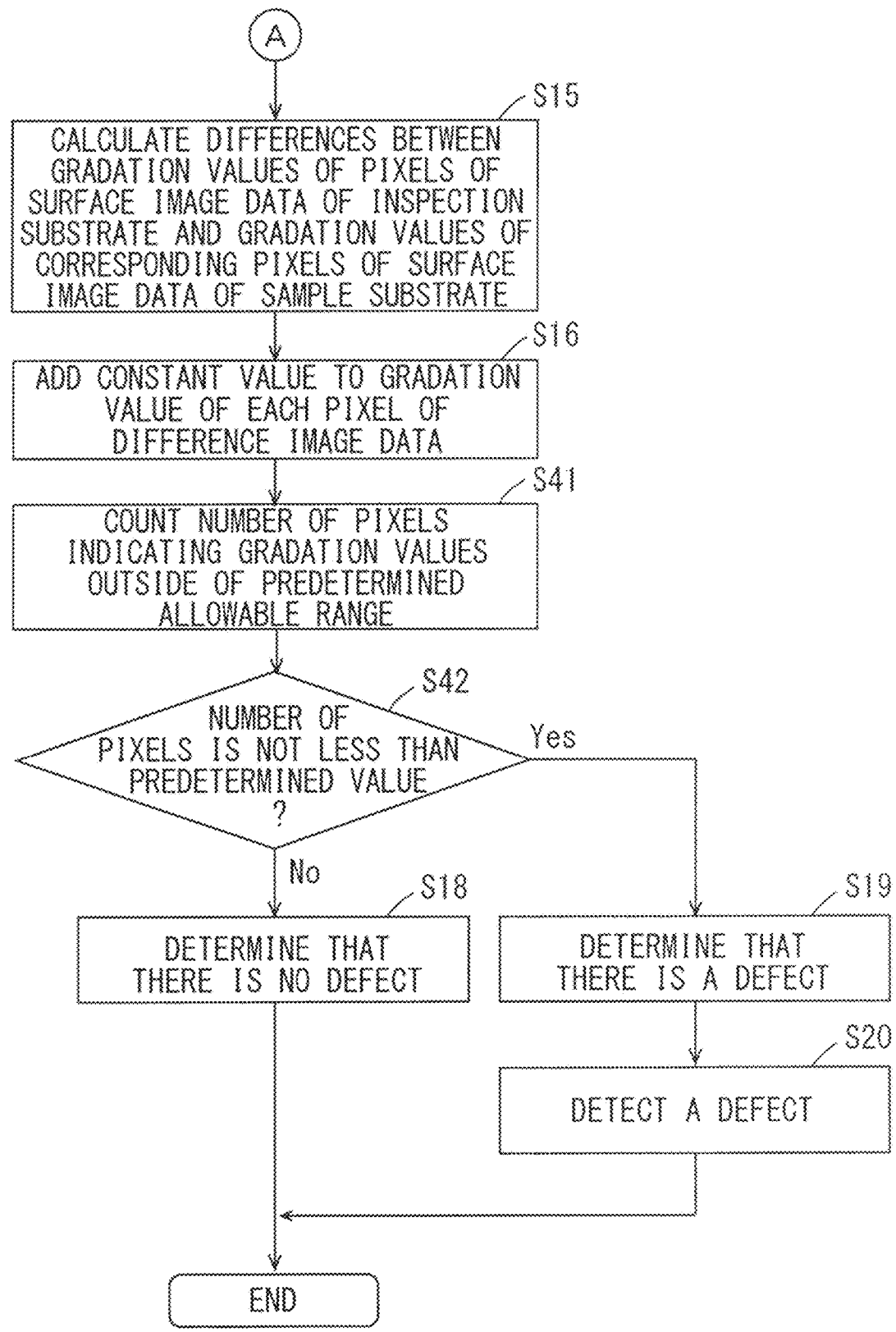
FIG. 13 is a flow chart showing a modified example of the defect determination processing according to the first embodiment.

FIG. 13 is a flow chart showing the modified example of the defect determination processing according to the first embodiment. In the present example, the controller 114 performs the processing of the steps S11 to S16 of FIGS. 10 and 11, and then, counts the number of pixels indicating the gradation values outside of the allowable range instead of the processing of the step S17 (step S41). Further, the controller 114 determines whether the counted number is not less than a predetermined number (step S42). Further, in step S42, the controller 114 determines that there is no defect in appearance on the inspection substrate W in the case where the counted number is smaller than the predetermined number (step S18). On the one hand, the controller 114 determines that there is a defect in appearance on the inspection substrate W in the case where the counted number is not less than the predetermined number (step S19).

In this case, in the case where the number of pixels indicating the gradation values outside of the allowable range is smaller than the predetermined number, it is not determined that there is a defect. Therefore, determination error due to noise, disturbance or the like can be prevented.

[2] Second Embodiment

The substrate processing apparatus according to the second embodiment has the same configuration and operation as the substrate processing apparatus 100 according to the first embodiment except for the following point. In the substrate processing apparatus according to the present embodiment, the controller 114 (FIG. 1) performs moire removal processing in the above-mentioned defect determination processing. The moire removal processing will be described below.

(1) Moire

Figure 14:
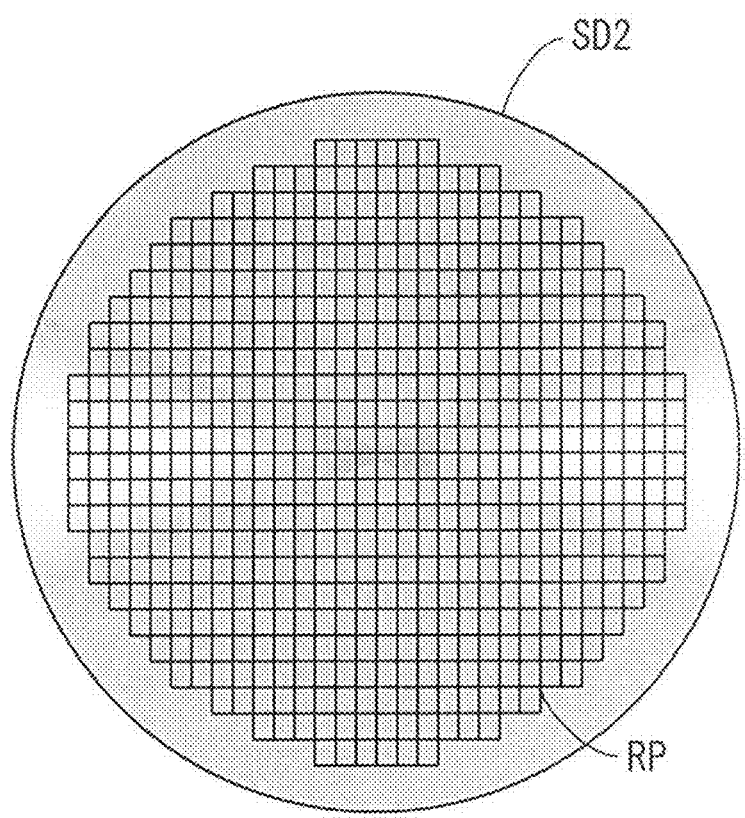
FIG. 14 is a diagram schematically showing moires that occurs in the surface image.

In the defect determination processing, a moire (fringes) may occur in the surface images SD2, SD3 produced by the steps S12 and S14. FIG. 14 is a diagram schematically showing moires that have occurred in the surface image SD2. In FIG. 14, an example in which a plurality (two in the present example) of moires are present in the surface image SD2 of the sample substrate is shown. Each moire of FIG. 14 has a form of a sector, and the brightness successively changes in a circumferential direction.

A moire is likely to occur in the case where there is a periodical pattern in the surface image. For the substrate W that is processed in the substrate processing apparatus 100, a plurality of circuit patterns respectively corresponding to a plurality of devices are formed. These circuit patterns have the same configuration as one another. Therefore, the plurality of circuit patterns become a periodical pattern on the substrate W.

For example, the resist pattern RP corresponds to a plurality of circuit patterns, and becomes a periodical pattern in the substrate W. Therefore, moires as shown in FIG. 14 are likely to occur in the surface images SD2, SD3 of FIGS. 12A and 12B including the resist pattern RP.

Further, in the process of manufacturing the substrate W, photo lithography processing including the resist film formation processing, the exposure processing, and the development processing, described above, is performed a plurality of number of times on one substrate W. Therefore, except for the initial processing, at least part of the circuit pattern is formed on the substrate W. Even if another film such as a resist film is formed on the circuit pattern, inspection light is transmitted through these films in the inspection unit IP. Thus, a moire sometimes occurs in the surface image due to the circuit pattern that is formed in advance.

Further, the circuit pattern of the substrate W has periodicity also in a circumferential direction of the substrate W. As described above, the surface image is produced by irradiation of a constant radial region RR (FIGS. 7A to 7C) with the inspection light while the substrate W is rotated, and reception of the reflected light by the CCD line sensor 54. Therefore, a method of producing the surface image with such rotation of the substrate W may be a reason why a moire occurs in the surface image.

When a moire occurs in the surface image SD3 of FIG. 12B, it may not be possible to distinguish between a defect in appearance on the substrate W and a moire in the surface image SD3. Further, a moire that occurs in the surface image SD2 of FIG. 12A and a moire that occurs in the surface image SD3 of FIG. 12B may be different from each other. In this case, it becomes necessary to widely set the allowable range in advance such that a gradation value resulting from a moire not a defect is in the allowable range in the step S17 of the defect determination processing (FIG. 11).

(2) Moire Removal Processing

In the present embodiment, during the defect determination processing, the moire removal processing for removing a moire from the surface image SD2 of the sample substrate is performed, and the moire removal processing for removing a moire from the surface image SD3 of the inspection substrate W is performed. In the present example, the controller 114 of FIG. 1 performs the moire removal processing.

Figure 15:
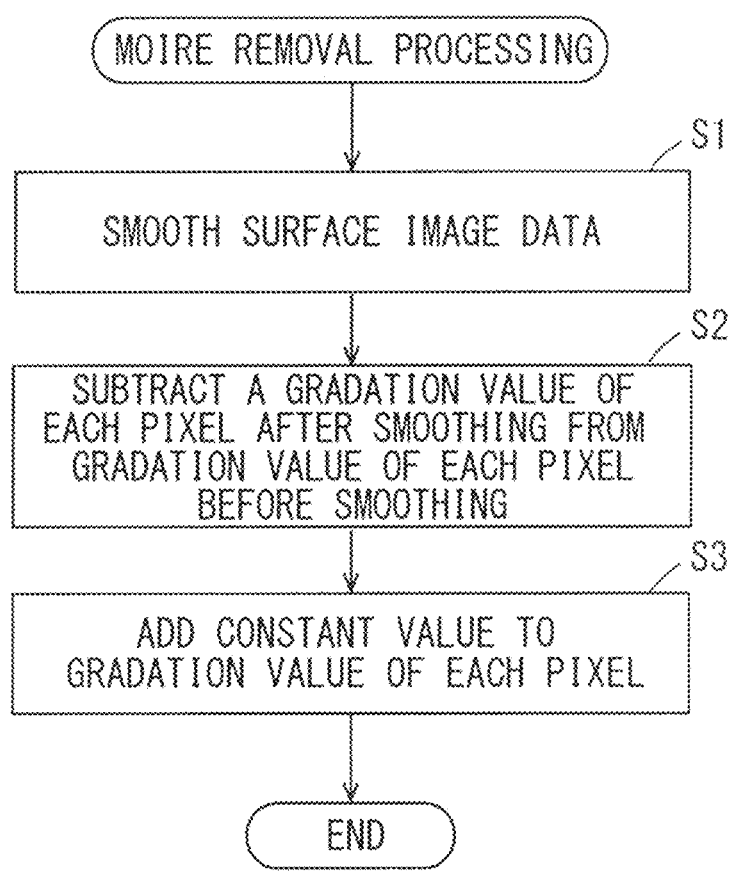
FIG. 15 is a flow chart of moire removal processing.

FIG. 15 is a flow chart of the moire removal processing. FIGS. 16A to 17B are diagrams for explaining the change of the surface image SD3 in the case where the moire removal processing is performed for the inspection substrate W. In the example of FIGS. 15 to 17B, moires are removed from the surface image SD3 of the inspection substrate W having a defect DP in appearance.

Figure 16A:
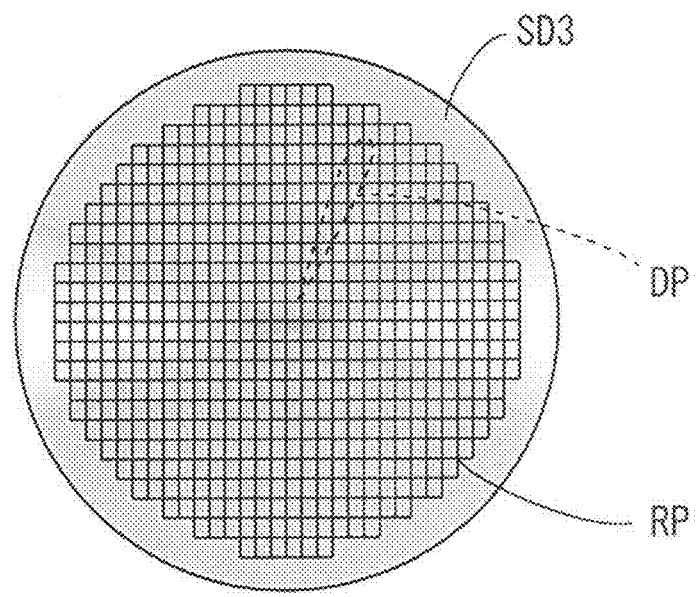
FIGS. 16A and 16B are diagrams for explaining a change in surface image in the case where the moire removal processing is performed for an inspection substrate.

In FIG. 16A, the surface image SD3 before the moire removal processing is shown. In the surface image SD3 of FIG. 16A, moires and a defect DP of the inspection substrate W are shown. In each of FIGS. 16A, 17A and 17B, described below, an outer edge of the defect DP is indicated by a dotted line in order to facilitate understanding of the shape of the defect DP. Further, as shown in FIG. 16A, the surface structure of the inspection substrate W including a net-like resist pattern RP is shown in this surface image SD3.

As shown in FIG. 15, the controller 114 first performs smoothing of the surface image data (step S1). The smoothing of the surface image data refers to reducing contrast variations of the surface image SD3. For example, the surface image data is smoothed by movement average filter processing. In the movement average filter processing, an average of gradation values is calculated for the specified number of peripheral pixels around a target pixel, and the average value is set as a gradation value of the target pixel. In the present example, all pixels of the surface image SD3 are target pixels, and a gradation value of each pixel is changed to an average value of the peripheral pixels. The number of the peripheral pixels in the movement average filter processing is 100 (in a lateral direction) and 100 (in a longitudinal direction), for example. The number of peripheral pixels in the movement average filter processing may be suitably set according to the presumed magnitude of a defect, the presumed magnitude of a moire, and the like.

The surface image data can be easily smoothed in a short period of time by the movement average filter processing. The smoothing of the surface image data may be performed by another smoothing processing such as Gaussian filter processing or Median filter processing instead of the movement average filter processing.

Figure 16B:
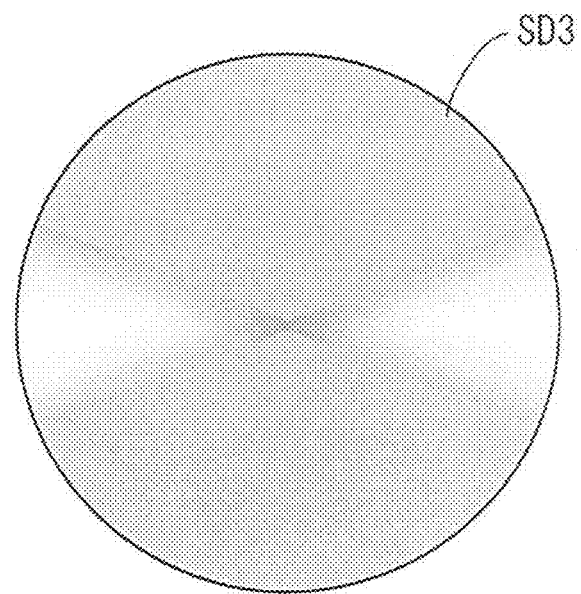

In FIG. 16B, the surface image SD3 after smoothing in the step S1 of FIG. 15 is shown. Variations in gradation value due to a defect and variations in gradation value due to the surface structure of the inspection substrate W occur more locally or more dispersively than variations in gradation value due to a moire. Therefore, variations in gradation value due to a defect and variations in gradation value due to the surface structure of the inspection substrate W are removed by the processing of the step S1. On the one hand, variations in gradation value due to a moire successively occur in a wide range, thereby not being removed by the processing of the step S1. Therefore, in the surface image SD3 of FIG. 16B, only moires are shown, and the defect DP and the surface structure of the inspection substrate W are not shown.

Figure 17A:
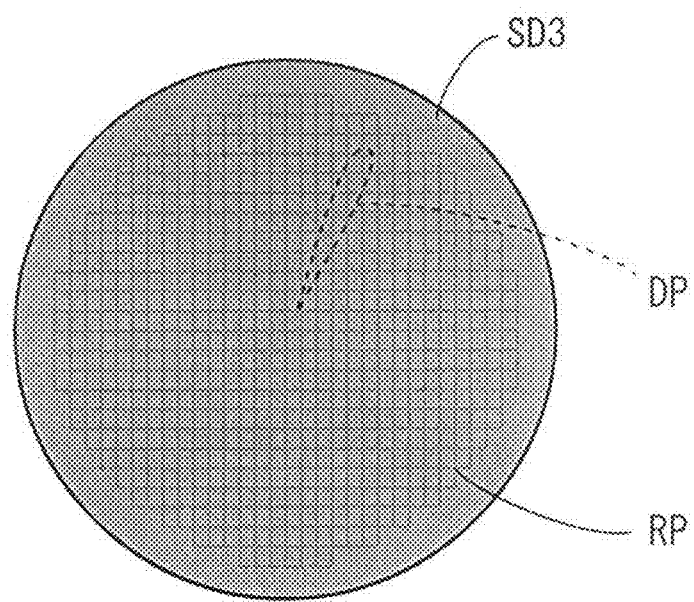
FIGS. 17A and 17B are diagrams for explaining a change in surface image in the case where the moire removal processing is performed for the inspection substrate.

Then, as shown in FIG. 15, the controller 114 subtracts a gradation value of each pixel of the surface image data after smoothing from a gradation value of each pixel of the surface image data before smoothing (step S2). Thus, moires are removed from the surface image SD3. Hereinafter, the surface image data after the processing of the step S2 are referred to as correction image data. In FIG. 17A, the surface image SD3 corresponding to the correction image data is shown. In the surface image SD3 of FIG. 17A, only the defect DP and the surface structure of the inspection substrate W are shown, and the moires are not shown. Further, the surface image SD3 is overall dark.

Figure 17B:
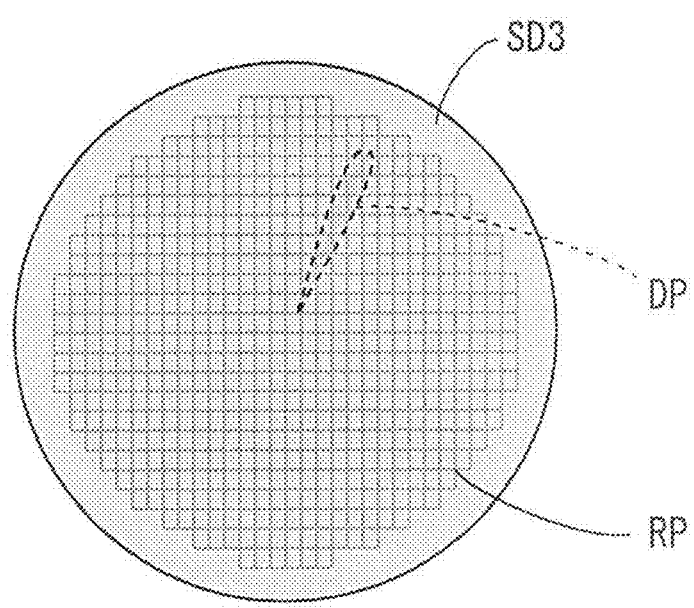

Next, as shown in FIG. 15, the controller 114 adds a constant value to a gradation value of each pixel of the correction image data (step S3). Hereinafter, the surface image data after the processing of the step S3 is referred to as addition image data. For example, a center value of a range of gradation values is added to a gradation value of each pixel similarly to the processing of the step S16 of FIG. 11. In FIG. 17B, the surface image SD3 corresponding to addition image data is shown. The surface image SD3 of FIG. 17B has the appropriate brightness.

Thus, the controller 114 ends the moire removal processing. After the moire removal processing is ended, the controller 114 displays the produced surface image SD3 in the main panel PN of FIG. 1, for example. Thus, the user can view the surface image SD3 of FIG. 17B without an uncomfortable feeling. In the case where the user does not view the surface image SD3, the processing of the above-mentioned step S3 does not have to be performed.

While the moire removal processing in the case where moires are removed from the surface image SD3 of the inspection substrate W is described in the examples of FIGS. 15 to 17B, processing similar to the above-mentioned example is performed also in the case where moires are removed from the surface image SD2 of the sample substrate.

(3) Method of Appearance Inspection

Figure 18:
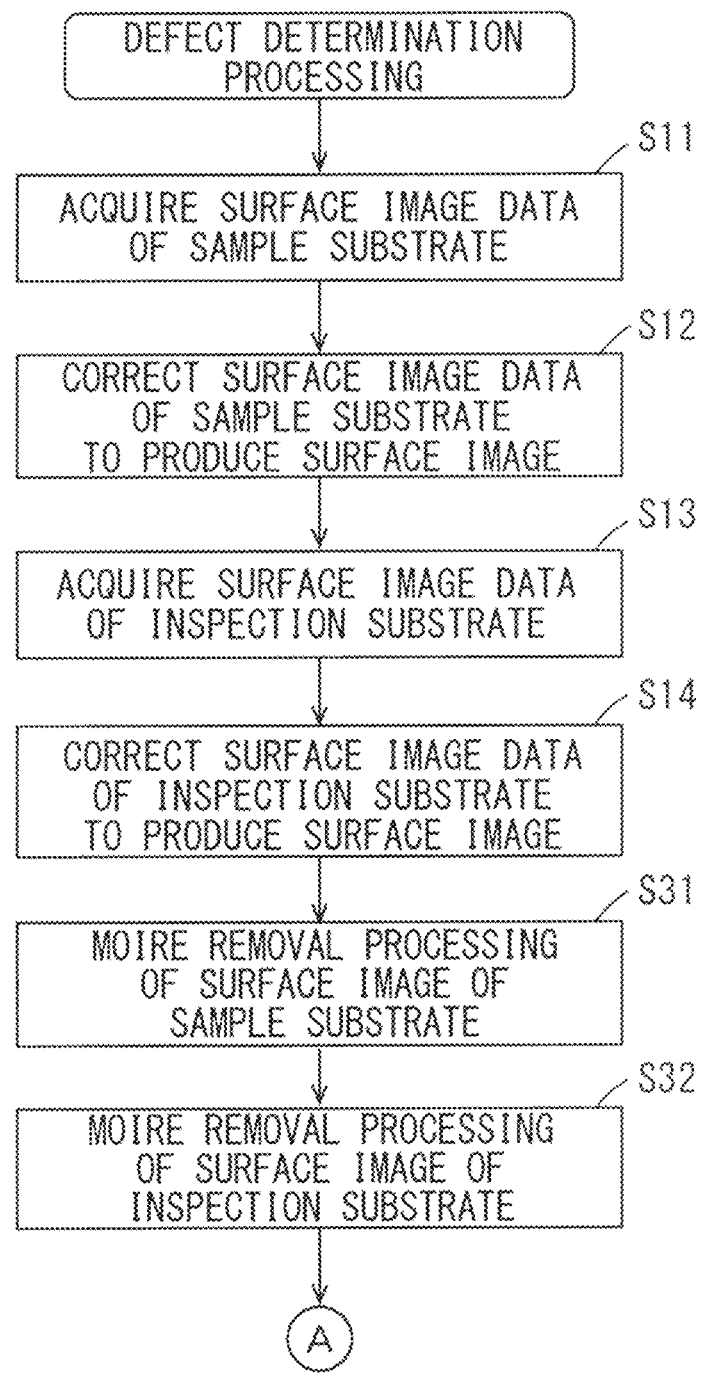
FIG. 18 is a flow chart showing part of the defect determination processing according to a second embodiment.

FIG. 18 is a flow chart showing part of the defect determination processing according to the second embodiment. As shown in FIG. 18, after performing the processing of the steps S11 to S14 similarly to the first embodiment, the controller 114 performs the moire removal processing for the surface image SD2 of the sample substrate (step S31). Subsequently, the controller 114 performs the moire removal processing for the surface image SD3 of the inspection substrate W (step S32). Thereafter, the controller 114 performs subsequent processing after the step S15 of FIG. 11 based on the surface images SD2, SD3 on which the moire removal processing is performed.

(4) Effects

In the present embodiment, in the appearance inspection for the substrate W in the inspection unit IP, the moire removal processing is performed for the surface image SD2 of the sample substrate and the surface image SD3 of the inspection substrate W. In the moire removal processing, the acquired surface image data is smoothed, and a gradation value of each pixel of the surface image data after smoothing is subtracted from a gradation value of each pixel of the surface image data before smoothing. Thus, the correction image data from which a moire is removed is produced. The surface images SD2, SD3 from which moires are removed are acquired based on the correction image data.

In this case, in the inspection substrate W including the defect DP, it is easy to distinguish the defect DP and the moire from each other. Further, in the step S16 of the defect determination processing, an occurrence of variations in gradation value resulting from the moire in the determination image data is prevented. Therefore, it is not necessary to consider the variations in gradation value resulting from the moire, so that an allowable range used in the step S17 is prevented from being wide. Thus, presence and absence of a defect in appearance can be accurately determined.

[3] Third Embodiment

The substrate processing apparatus according to the third embodiment has the same configuration and operation as the substrate processing apparatus 100 according to the first embodiment except for the following point. In the substrate processing apparatus according to the present embodiment, the defect determination processing performed by the controller 114 (FIG. 1) is partially different from the defect determination processing performed in the first embodiment.

(1) Method of Appearance Inspection

Figure 19:
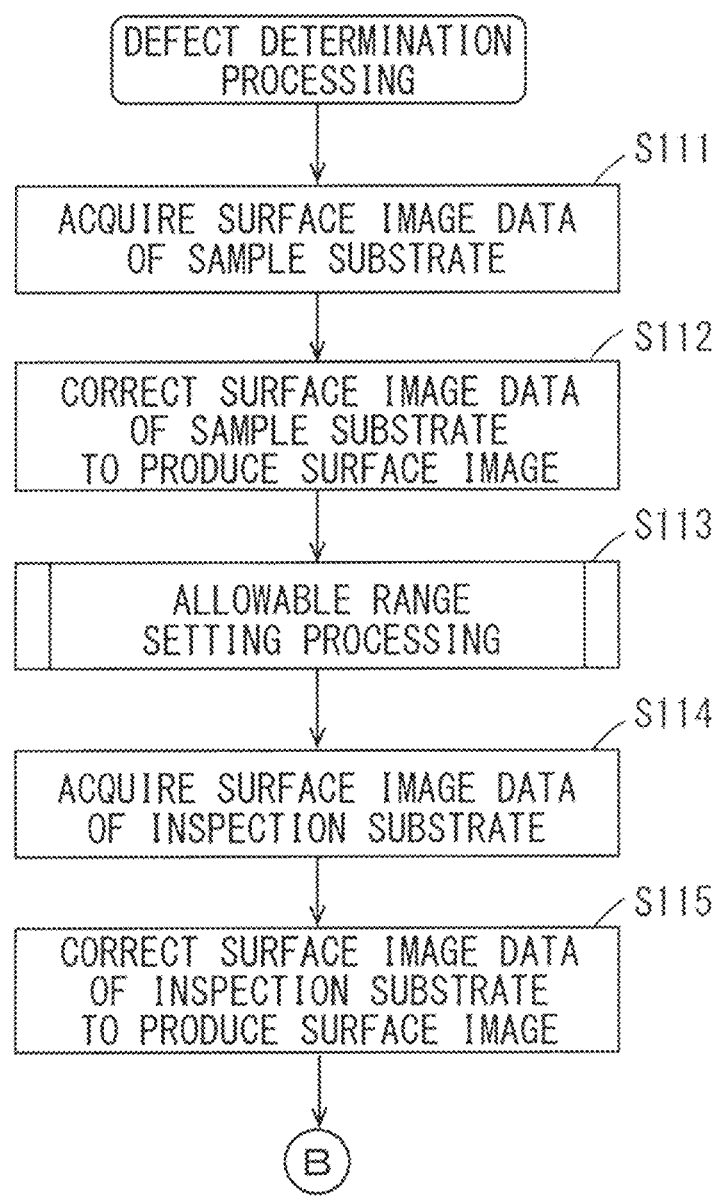
FIGS. 19 and 20 are flow charts of the defect determination processing according to a third embodiment.
Figure 20:
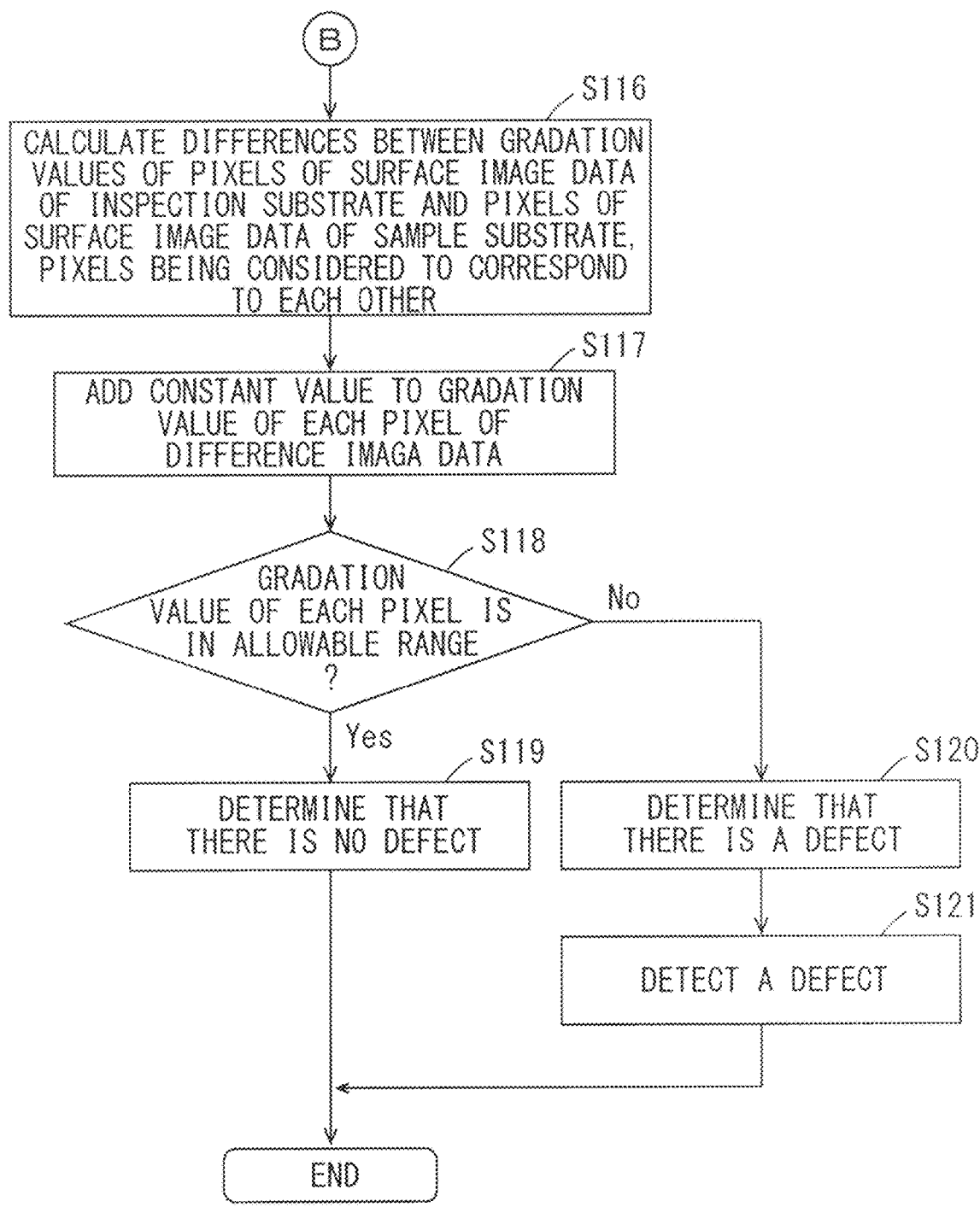

FIGS. 19 and 20 are flow charts of the defect determination processing according to the third embodiment. Also in the present embodiment, inspection is performed in advance with high accuracy before the start of the defect determination processing, and the substrate that is determined to be non-defective in the inspection is prepared as a sample substrate.

As shown in FIG. 19, the controller 114 first acquires the surface image data of the non-defective sample substrate (step S111), and corrects the acquired surface image data to produce a surface image in the shape of the substrate W (step S112). In the present embodiment, the surface image data is acquired by the above-mentioned inspection unit IP. The surface image data may be acquired by another device instead of the inspection unit IP. In this case, the surface image SD2 of FIG. 12A is acquired, for example.

Subsequently, the controller 114 performs allowable range setting processing based on the corrected surface image data of the sample substrate (step S113). In the allowable range setting processing, an allowable range used in processing of the step S118, described below, is set. The details of the allowable range setting processing will be described below.

Then, the controller 114 acquires the surface image data of the inspection substrate W (step S114), and corrects the acquired surface image data to produce the surface image in a shape of the substrate W (step S115), similarly to the processing of the steps S111 and S112. In this case, the surface image SD3 of FIG. 12B is acquired, for example.

Then, as shown in FIG. 20, the controller 114 calculates a difference between a gradation value of a pixel of the surface image data of the inspection substrate W and a gradation value of a pixel of the surface image data of the sample substrate, the pixels of the surface image data of the inspection substrate W and the sample substrate being considered to correspond to each other (step S116). More specifically, the controller 114 subtracts a gradation value of each pixel of the surface image SD2 from a gradation value of each pixel of the surface image SD3, the pixels of the surface images SD2, SD3 being considered to correspond to each other.

In this case, the pixel of the surface image data SD2 and the pixel of the surface image data SD3, the pixels of the surface image data SD2, SD3 being considered to correspond to each other, are found by pattern matching between the surface structure of the sample substrate included in the surface image SD2 and the surface structure of the inspection substrate W included in the surface image SD3, for example. Alternatively, the pixel of the surface image SD2 and the pixel of the surface image SD3, the pixels of the surface images SD2, SD3 being considered to correspond to each other, are found based on a positional relationship between a cutout for positioning of each of the sample substrate and the inspection substrate W and each pixel of the CCD line sensor 54 of FIG. 6, for example. A cutout is an orientation flat or a notch, for example.

For the surface image SD3 of the inspection substrate W, an image of a defect DP and an image similar to the surface structure of the sample substrate included in the surface image SD2 is included. Therefore, as for a pixel corresponding to a normal portion of the inspection substrate W, a difference acquired by the processing of the step S116 is small. On the one hand, in the case where a defect in appearance is present for the inspection substrate W, as for a pixel corresponding to a defective portion, the above-mentioned difference is large. Thus, a difference in gradation value for the pixel corresponding to a defective portion, and a difference in gradation value for the pixel corresponding to a normal portion can be distinguished from each other.

In the following description, the surface image data made of the differences acquired by the processing of the step S116 is referred to as difference image data. In this case, the surface image SD4 of FIG. 12C is acquired based on the difference image data, for example.

Next, the controller 114 adds a constant value to a gradation value of each pixel of the difference image data (step S117). Hereinafter, the surface image data after the processing of the step S117 is referred to as determination image data. For example, a center value of a range of gradation values is added to a gradation value of each pixel. Specifically, in the case where the gradation values are indicated by numerical values of not less than 0 and not more than 255, 128 is added to a gradation value of each pixel. In this case, the surface image SD5 of FIG. 12D is acquired based on the determination image data, for example.

The controller 114 displays the produced surface image SD5 in the main panel PN of FIG. 1, for example. In this case, the user can view the surface image SD5 of FIG. 12D without an uncomfortable feeling. In the case where the user does not view the surface image SD5, the above-mentioned processing of the step S117 does not have to be performed.

Thereafter, the controller 114 determines whether a gradation value of each pixel of the determination image data is in the allowable range set in the allowable range setting processing of the step S113 (step S118). In the present embodiment, the allowable range is basically set to include gradation values of pixels of the determination image data corresponding to normal portions, and not to include gradation values of pixels of the determination image data corresponding to defective portions.

In the case where a gradation value of each pixel of the determination image data is in the allowable range, the controller 114 determines that there is no defect in appearance on the inspection substrate W (step S119), and ends the defect determination processing. On the one hand, in the case where a gradation value of any pixel is outside of the allowable range, the controller 114 determines that there is a defect in appearance on the inspection substrate W (step S120). Further, the controller 114 detects the defect by extracting one or a plurality of pixels of which a gradation value is outside of the allowable range (step S121), and ends the defect determination processing.

In the above-mentioned step S121, the controller 114 may produce the surface image SD6 indicating the extracted defect DP as shown in FIG. 12E. Further, the controller 114 may display the produced surface image SD6 in the main panel PN of FIG. 1. As described above, the position and the shape of the defect can be identified by detection of a defect in appearance on the inspection substrate W.

For the inspection substrate W that is determined to be defective in the defect determination processing, after the inspection substrate W is carried out from the substrate processing apparatus 100, different processing from the processing for the substrate W that is determined to be non-defective is performed, for example. For the inspection substrate W that is determined to be defective, detailed inspection, regeneration processing or the like is performed.

(2) Allowable Range Setting Processing

As described above, in the processing of the step S116 of the defect determination processing, a difference between a gradation value of the pixel of the surface image data of the inspection substrate W and a gradation value of the pixel of the surface image data of the sample substrate, the pixels of the surface image data of the inspection substrate W and the sample substrate being considered to correspond to each other, is calculated. At this time, the pixel of the surface image data of the inspection substrate W considered to correspond to the pixel of the surface image data of the sample substrate sometimes deviates from the truly corresponding pixel. Such a deviation in a correspondence relationship between the pixels occurs due to an arrangement condition of the inspection substrate W at the time of production of the surface image data or the surface structure of the inspection substrate W, for example.

Figure 21A:
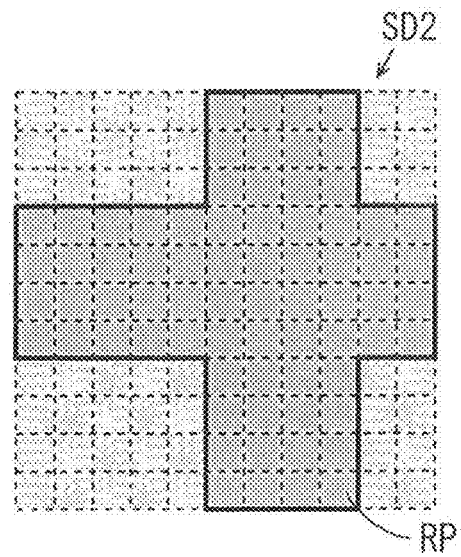
FIGS. 21A to 21C are diagrams for explaining difference image data produced with a deviation being present in a correspondence relationship between a pixel of the surface image data of the inspection substrate and a pixel of the surface image data of the sample substrate.
Figure 21B:
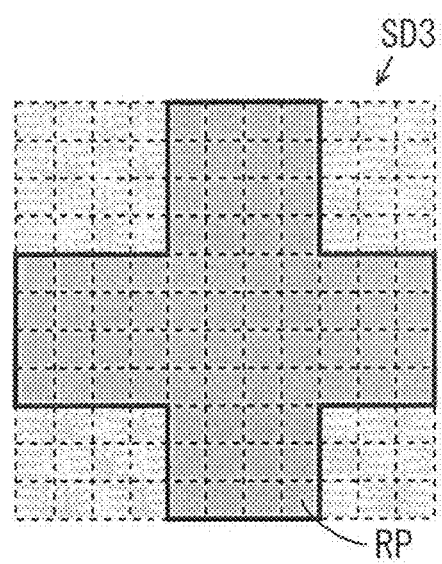
Figure 21C:
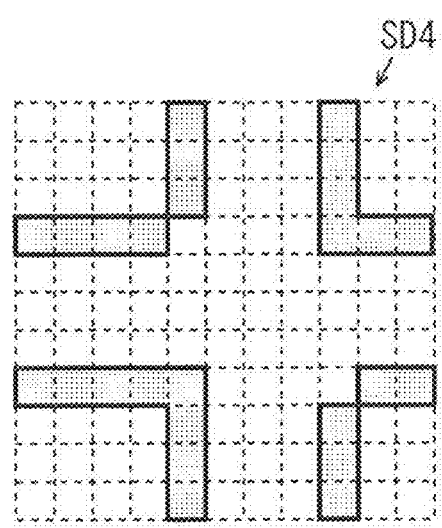

FIGS. 21A to 21C are diagrams for explaining difference image data produced with a deviation being present in a correspondence relationship between the pixel of the surface image data of the inspection substrate W and the pixel of the surface image data of the sample substrate. A partially enlarged diagram of the surface image SD2 of the sample substrate is shown in FIG. 21A. A partially enlarged diagram of the surface image SD3 of the inspection substrate W considered to correspond to the surface image SD2 of FIG. 21A is shown in FIG. 21B. The surface image SD4 showing differences between the surface images SD2, SD3 of FIGS. 21A and 21B is shown in FIG. 21C. In FIGS. 21A to 21C, pixels on the surface image are indicated by dotted lines. Further, in the surface image SD4 of FIG. 21C, pixels having differences (a gradation value) of 0 are indicated in white, and pixels having differences (gradation value) of other than 0 are indicated by a dotted pattern.

Assuming that correspondence relationship between each set of pixels of the surface image data of the inspection substrate W and the pixel of the surface image data of the sample substrate is accurate, it is considered that a difference between a gradation value of a pixel of the surface image data of the inspection substrate W and a gradation value of a corresponding pixel of the surface image data of the sample substrate is ideally 0 for a normal portion. However, in the example of FIGS. 21A and 21B, each pixel of the surface image SD3 considered to correspond to each pixel of the surface image SD2 deviates by one pixel from the actual corresponding pixel in the longitudinal direction and the lateral direction. In this case, as shown in FIG. 21C, a difference (a gradation value) is not 0 for part of the pixels in the surface image SD4.

Figure 22A:
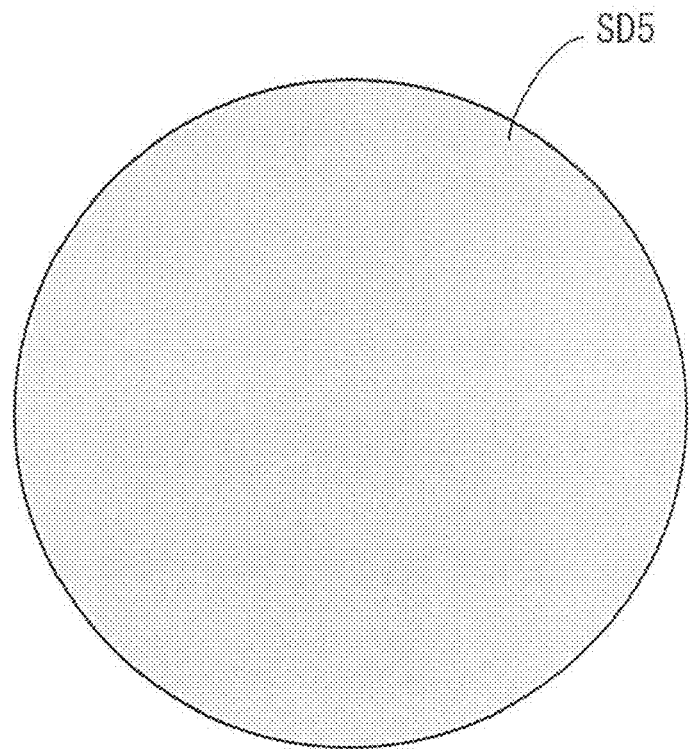
FIGS. 22A and 22B are diagrams showing variations of determination image data acquired for every inspection substrate.
Figure 22B:
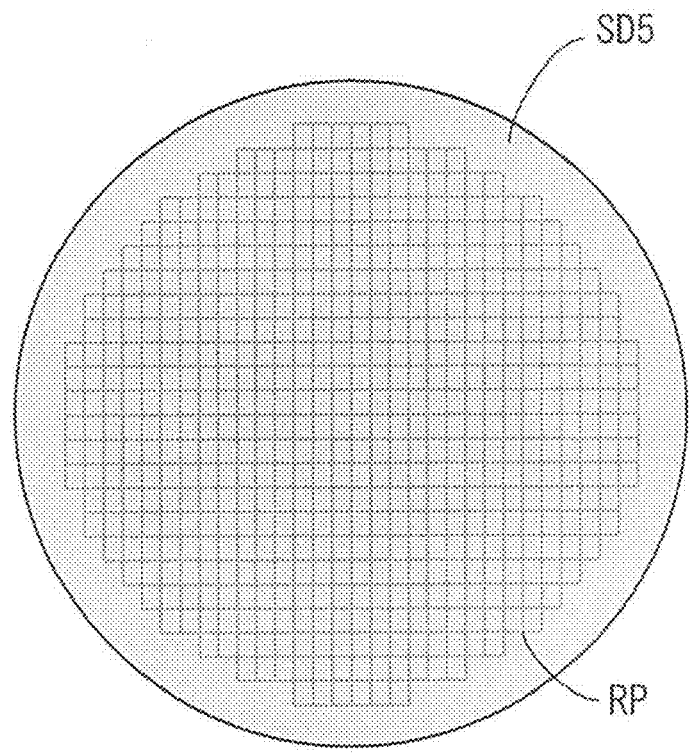

Therefore, in the case where similar defect determination processing is performed for a plurality of inspection substrates W, a difference may occur in the determination image data for normal portions acquired for every inspection substrate W. FIGS. 22A and 22B are diagrams showing variations in determination image data acquired for every inspection substrate W. In FIG. 22A, one example of the surface image SD5 of the determination image data produced with a deviation not being present in the correspondence relationship between the pixels is shown. In FIG. 22B, one example of the surface image SD5 of the determination image data generated with a deviation being present in the correspondence relationship between the pixels is shown.

As shown in FIG. 22A, a resist pattern RP does not appear in the surface image SD5 produced with a deviation not being present in the correspondence relationship between the pixels. On the one hand, as shown in FIG. 22B, part of the resist pattern RP appears in the surface image SD5 that is produced with a deviation being present in the correspondence relationship between the pixels. In this case, it becomes necessary to largely set the allowable range such that a gradation value of the determination image data corresponding to the normal surface structure is in the allowable range even with a deviation being present in the correspondence relationship between the pixels. Thus, determination error resulting from the deviation in correspondence relationship between the pixels can be prevented. On the one hand, when the allowable range is set excessively large, detection accuracy for a defect is reduced.

In the present embodiment, allowable range setting processing, described below, is performed in order to appropriately set the allowable range while a deviation in correspondence relationship between the surface image data of the inspection substrate W and the surface image data of the sample substrate is considered.

Figure 23:
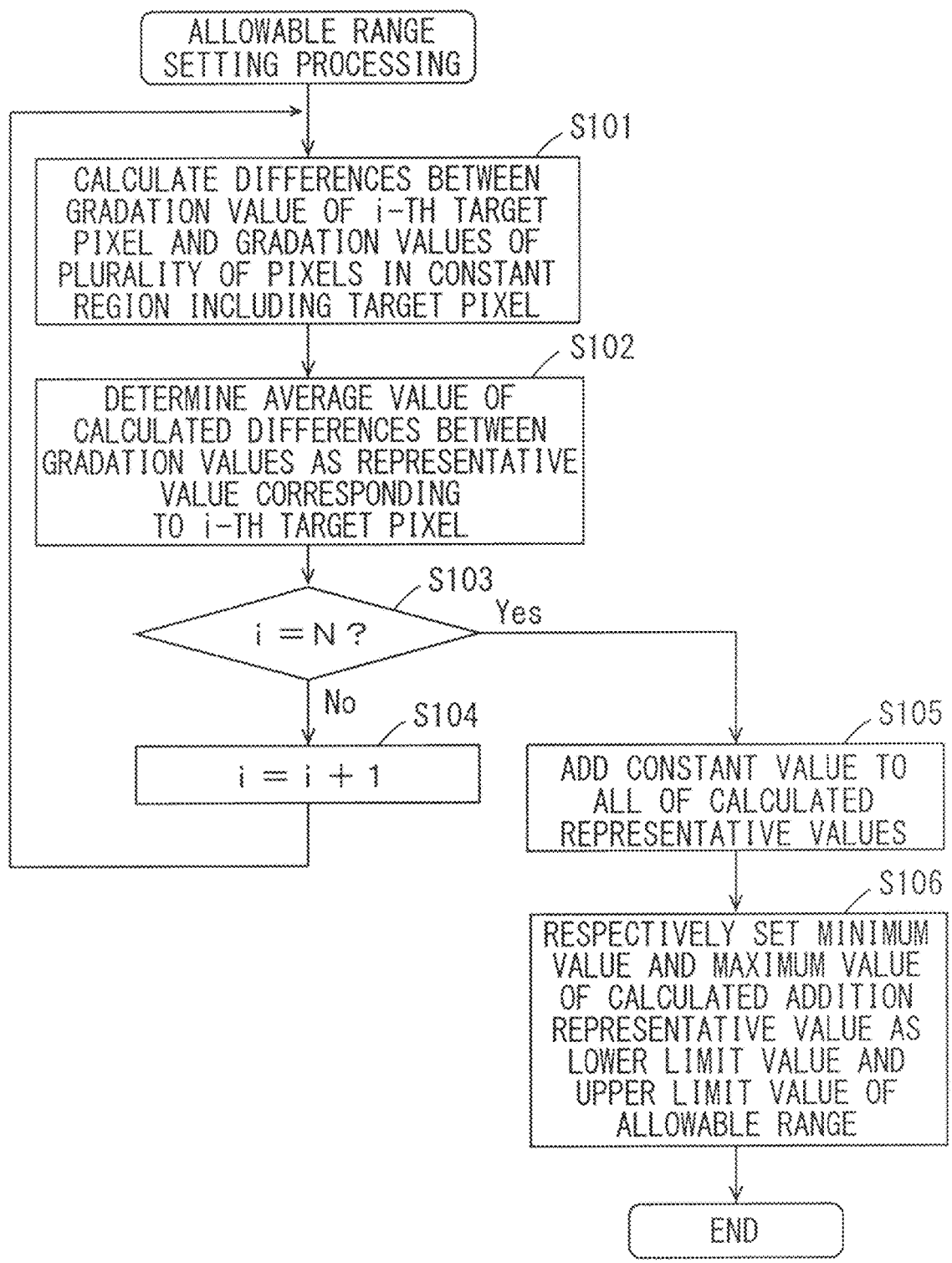
FIG. 23 is a flow chart of allowable range setting processing.

FIG. 23 is a flow chart of the allowable range setting processing. In the present example, N pixels of the surface image SD2 (FIG. 12A) of the sample substrate produced in the step S112 of FIG. 19 are determined as target pixels in advance. N indicates the number not less than 2 and not more than the number of all pixels of the surface image data of the sample substrate. In the present embodiment, N is the number of all pixels of the surface image data.

As shown in FIG. 23, the controller 114 calculates differences between a gradation value of an i-th (i is a natural number) target pixel and gradation values of a plurality of pixels in a constant region including the target pixel of the surface image data of the sample substrate (step S101). An initial value of the variable i is 1. The constant region is set to include the constant number of pixels from the target pixel with the target pixel being the center, for example.

It is considered that a plurality of differences calculated in the step S101 are substantially equivalent to the differences in gradation value calculated with a deviation being present in the correspondence relationship between the sample substrate and the inspection substrate W regarding the i-th target pixel in the case where the inspection substrate W is non-defective. The controller 114 determines an average value of the calculated differences in gradation value as a representative value corresponding to the i-th target pixel (step S102). In the case where there is a deviation in correspondence relationship between the pixels, and a portion of the inspection substrate W considered to correspond to the i-th target pixel is normal, the determined representative value represents a difference in gradation value to be calculated as the difference image data.

In the case where each pixel of the surface image data of the sample substrate is indicated by a plane coordinate system made of an x axis and a y axis, a constant region is set to include 9 pixels located at coordinates (a−1, b−1), (a−1, b), (a−1, b+1), (a, b−1), (a, b), (a, b+1), (a+1, b−1), (a+1, b), and (a+1, b+1) around the coordinates (a, b) of the target pixel, for example.

In this case, letting a gradation value of the target pixel of the coordinates (u,v) be expressed by P(u, v), representative value P'(a, b) determined by the processing of the steps S101 and S102 can be expressed by a following formula (1), for example.

$$P'(a,b)=[\{(a-1,b-1)+P(a-1,b)+P(a-1,b+1)+P(a,b-1)+P(a,b)+P(a,b+1)+P(a+1,b-1)+P(a+1,b)+P(a+1,b+1)\}-P(a,b)\times 9]/9 \quad (1)$$

As for the pixel of the coordinates (a, b) in the inspection substrate W, the above-mentioned representative value P'(a, b) represents a gradation value of the difference image data that may be calculated with a deviation of 1 pixel being present in the correspondence relationship.

After the representative value corresponding to the i-th target pixel is determined as describe above, the controller 114 determines whether a value of the variable i is N (step S103). In the case where the variable i is not N, the controller 114 adds 1 to the variable i (step S104), and proceeds to the processing of the step S101. Thus, the controller 114 determines a representative value corresponding to the next target pixel. On the one hand, in the case where the variable i is N, the controller 114 adds a constant value to all of the calculated representative values (step S105).

Hereinafter, the representative value to which a constant value is added in the step S105 is referred to as an addition representative value. A value added to the representative value in the step S105 is equal to the value added to a gradation value of each pixel of the difference image data in the step S117 of FIG. 20. In the case where the processing of the step S117 is not preformed, the processing of the present step S105 is not performed either.

Thereafter, the controller 114 sets a minimum value and a maximum value of the calculated addition representative values as a lower limit value and an upper limit value of the allowable range, respectively (step S106). In the case where the processing of the above-mentioned steps S117 and S105 is not performed, a minimum value and a maximum value of the N representative values calculated in the processing of the steps S101 to S104 are set as a lower limit value and an upper limit value of the allowable range, respectively. Thereafter, the allowable range setting processing is ended. At the time of the end of the allowable range setting processing, the variable i is reset to the initial value 1.

The controller 114 may allow the variable i to be 1 after the start of the allowable range setting processing and before the processing of the step S101 instead of setting of the variable i to 1 at the time of the end of the allowable range setting processing. The allowable range is set in this manner. Thus, as for a normal portion, the calculated gradation value of the determination image data is less likely to fall outside of the allowable range due to a deviation in correspondence relationship between the pixels. Therefore, a normal portion is less likely to be erroneously determined to be defective.

Further, a lower limit value and an upper limit value of the allowable range are limited to a minimum value and a maximum value of the addition representative values. Thus, as for a defective portion, the calculated gradation value of the determination image data is less likely to be included in the allowable range due to a deviation in correspondence relationship between the pixels. Therefore, a defective portion is less likely to be erroneously determined to be normal. As a result, even in the case where there is a deviation in correspondence relationship between the surface image data of the inspection substrate W and the surface image data of the sample substrate, a defect in appearance on the inspection substrate W can be detected with high accuracy.

In the above-mentioned step S102, any of a minimum value, a center value and a maximum value among the calculated differences in gradation value may be determined as a representative value corresponding to the i-th target pixel instead of an average value of the calculated differences in gradation value. In this manner, the representative value determined in the step S102 may be set to any value of the average value, the minimum value, the center value, the maximum value and the like as long as being in a range from the minimum value to the maximum value of the plurality of gradation values. In this case, a desired allowable range can be appropriately set according to a determination condition for a defect and the like.

As for the pixel corresponding to a normal portion, a gradation value of the determination image data may be smaller than the minimum value of the addition representative values due to noise, disturbance or the like. Further, as for the pixel corresponding to a normal portion, a gradation value of the determination image data may be larger than the maximum value of the addition representative values. The controller 114 may perform the following processing in the processing of the step S106 instead of the respective setting of a minimum value and a maximum value of the addition representative values to a lower limit value and an upper limit value of the allowable range.

For example, the controller 114 sets a first value smaller than the minimum value of the addition representative values by a predetermined value as the lower limit value of the allowable range, and sets a second value larger than the maximum value of the addition representative values by a predetermined value as the upper limit value of the allowable range. Thus, even in the case where a gradation value of the determination image data is smaller than the minimum value of the addition representative values for the pixel corresponding to a normal portion, determination error does not occur when the gradation value is not less than the first value. Further, even in the case where a gradation value of the determination image data is larger than the maximum value of the addition representative values for the pixel corresponding to a normal portion, determination error does not occur when the gradation value is not more than the second value. As a result, determination error resulting from noise, disturbance or the like can be prevented.

(3) Effects

In the defect determination processing according to the third embodiment, the surface image data of the sample substrate with no defect in appearance is acquired, and the surface image data of the inspection substrate W is acquired. As for a normal portion of the inspection substrate W, a difference between a gradation value of a pixel of the surface image data of the inspection substrate W and a gradation value of a corresponding pixel of the surface image data the sample substrate is small. On the one hand, as for the pixel corresponding to a defective portion, the above-mentioned difference is large. Therefore, even in the case where the gradation value of the pixel corresponding to a defective portion is close to the gradation value of the pixel corresponding to a normal portion, the above-mentioned difference corresponding to a defective portion is larger than the above-mentioned difference corresponding to a normal portion.

A difference between a gradation value of a pixel of the surface image data of the inspection substrate W and a gradation value of a pixel of the surface image data of the sample substrate, the pixels of the surface image data of the inspection substrate W and the sample substrate being considered to correspond to each other, is calculated, and the difference image data is produced. Thus, a difference for the pixel considered to correspond to a defective portion and a difference for the pixel corresponding to a normal portion can be distinguished from each other. Therefore, the allowable range is determined in advance to include the differences corresponding to normal portions and not to include the differences corresponding to defective portions, whereby it is possible to determine whether there is a defect.

The pixel of the inspection substrate W considered to correspond to one pixel of the sample substrate sometimes deviates from the truly corresponding pixel. In this case, when the allowable range is set, assuming that the correspondence relationship between the surface image data of the sample substrate and the surface image data of the inspection substrate W is accurate, the determination image data corresponding to normal portions may fall outside of the allowable range. Therefore, it becomes necessary to largely set the allowable range in order to prevent determination error resulting from a deviation. On the one hand, when the allowable range is set excessively largely, detection accuracy for a defect is reduced.

In the present embodiment, as for each of the plurality of target pixels of the sample substrate, a difference between a gradation value of the target pixel and gradation values of the plurality of pixels in a constant region including the target pixel is calculated. In this case, it is considered that the plurality of differences calculated for each target pixel are substantially equivalent to the differences in gradation value calculated with a deviation being present in the correspondence relationship between the surface image data of the sample substrate and the surface image data of the inspection substrate W, in the case where there is no defect for the inspection substrate W.

An average value of a plurality of differences is determined as a representative value based on the plurality of differences calculated for each target pixel. In this case, when there is a deviation in correspondence relationship between the pixels, the representative value for each target pixel represents a difference in gradation value to be calculated in the case where a portion corresponding to each target pixel is normal.

Therefore, a minimum value and a maximum value of the plurality of addition representative values determined for the plurality of target pixels of the surface image data of the sample substrate are set as a lower limit value and an upper limit value of the allowable range, respectively. Thus, as for a normal portion, the determination image data calculated with a deviation being present in the correspondence relationship between pixels is less likely to fall outside of the allowable range. Therefore, a normal portion is less likely to be erroneously determined to be defective.

Further, a lower limit value and an upper limit value of the allowable range are limited to a minimum value and a maximum value of the addition representative values. Thus, as for a defective portion, the determination image data calculated with a deviation being present in the correspondence relationship between the pixels is less likely to be included in the allowable range. Therefore, a defective portion is less likely to be erroneously determined to be normal. As a result, even in the case where there is a deviation between the pixel of the surface image data of the sample substrate and the corresponding pixel of the surface image data of the inspection substrate W, a defect in appearance on the inspection substrate W can be detected with high accuracy.

(4) Modified Example of Defect Determination Processing

In the step S118 of the above-mentioned defect determination processing, it is determined that there is a defect in appearance on the inspection substrate W in the case where a gradation value of each pixel of the determination image data is outside of the allowable range. However, the present invention is not limited to this.

In the determination image data, gradation values of part of pixels not corresponding to a defect may be outside of the allowable range due to noise, disturbance or the like. In the defect determination processing, following processing may be performed instead of the processing of the step S118 of FIG. 20.

Figure 24:
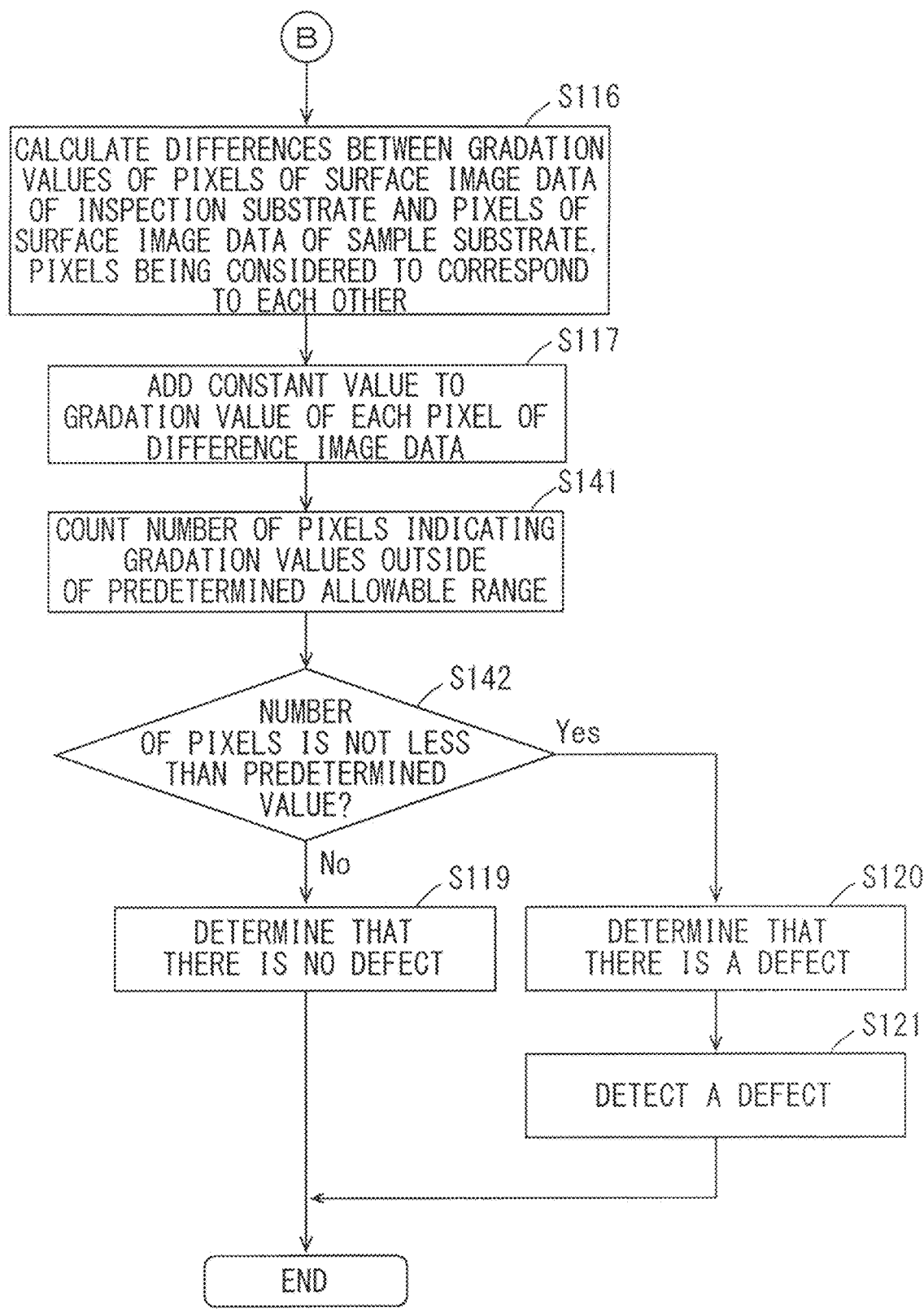
FIG. 24 is a flow chart showing a modified example of the defect determination processing according to a third embodiment.

FIG. 24 is a flow chart showing the modified example of the defect determination processing according to the third embodiment. In the present example, after performing the processing of the steps S111 to S117 of FIGS. 19 and 20, the controller 114 counts the number of pixels indicating the gradation values outside of the allowable range instead of the processing of the step S118 (step S141). Further, the controller 114 determines whether the counted number is not less than a predetermined number (step S142). Further, in the step S142, the controller 114 determines that there is no defect in appearance on the inspection substrate W in the case where the counted number is smaller than the predetermined number (step S119). On the one hand, the controller 114 determines that there is a defect in appearance on the inspection substrate W in the case where the counted number is not less than the predetermined number (step S120), and detects a defect (step S121).

In this case, in the case where the number of the pixels indicating gradation values outside of the allowable range is smaller than the predetermine number, it is not determined that there is a defect. Therefore, determination error due to noise, disturbance or the like can be prevented.

[4] Fourth Embodiment

The substrate processing apparatus according to the fourth embodiment has the same configuration and operation as the substrate processing apparatus according to the third embodiment expect for the following point. In the substrate processing apparatus according to the present embodiment, the controller 114 (FIG. 1) performs the moire removal processing of FIG. 15 according to the second embodiment in the defect determination processing.

Figure 25:
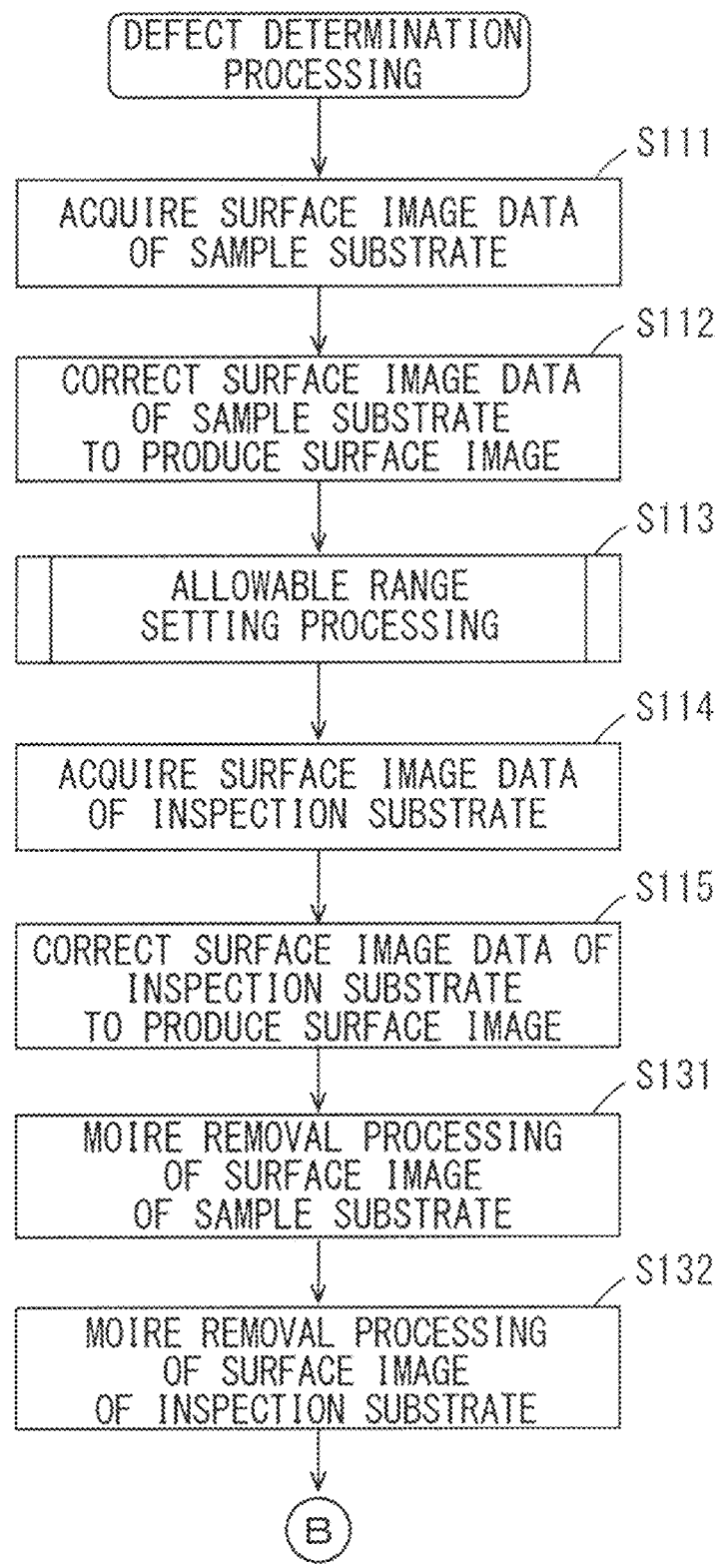
FIG. 25 is a flow chart showing part of the defect determination processing according to a fourth embodiment.

FIG. 25 is a flow chart showing part of the defect determination processing according to the fourth embodiment. As shown in FIG. 25, after performing the processing of the steps S111 to S115 of FIG. 19 similarly to the third embodiment, the controller 114 performs the moire removal processing of the surface image SD2 of the sample substrate (step S131). Subsequently, the controller 114 performs the moire removal processing for the surface image SD3 of the inspection substrate W (step S132). Thereafter, the controller 114 performs the subsequent processing after the step S116 of FIG. 20 based on the surface images SD2, SD3 on which the moire removal processing is performed.

In the preset embodiment, the moire removal processing is performed for the surface image SD2 of the sample substrate and the surface image SD3 of the inspection substrate W. In the moire removal processing, the acquired surface image data is smoothed, and a gradation value of each pixel of the surface image data after smoothing is subtracted from a gradation value of each pixel of the surface image data before smoothing. Thus, the corrected image data from which a moire is produced. The surface images SD2, SD3 from which moires are removed are acquired based on the corrected image data.

In this case, in the inspection substrate W including a defect DP, it is easy to distinguish the defect DP and a moire from each other. Further, in the steps S116 and S117, an occurrence of variations in gradation value resulting from a moire in the difference image data and the determination image data is prevented. Thus, it is not necessary to widely set the allowable range to include variations in gradation value resulting from a moire. Therefore, a defect in appearance on the inspection substrate W can be detected with higher accuracy.

[5] Fifth Embodiment

The substrate processing apparatus according to the fifth embodiment has the same configuration and operation as the substrate processing substrate 100 according to the first embodiment except for the following point. In the substrate processing apparatus according to the present embodiment, the defect determination processing performed by the controller 114 (FIG. 1) is partially different from the defect determination processing performed in the first embodiment.

In the appearance inspection for the substrate W in the inspection unit IP, the substrate W is positioned on the spin chuck 511 (FIG. 5) in a predetermined attitude. Further, irradiation timing with the inspection light, acquisition timing of the surface image data or the like is controlled based on a cutout (an orientation flat or notch) for positioning that is formed in advance at the substrate W. Thus, in the inspection unit IP, the surface image data of a plurality of substrates W is acquired under a common condition.

(1) Method of Appearance Inspection

Figure 26:
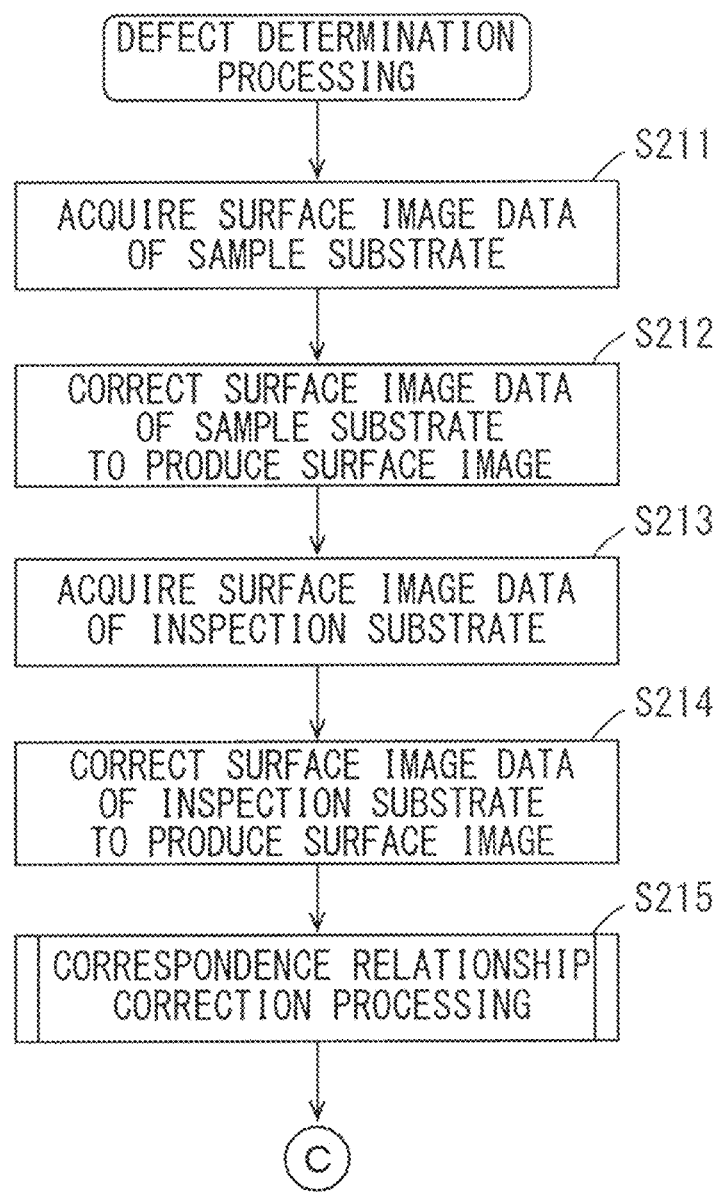
FIG. 26 is a flow chart of the defect determination processing according to a fifth embodiment.
Figure 27:
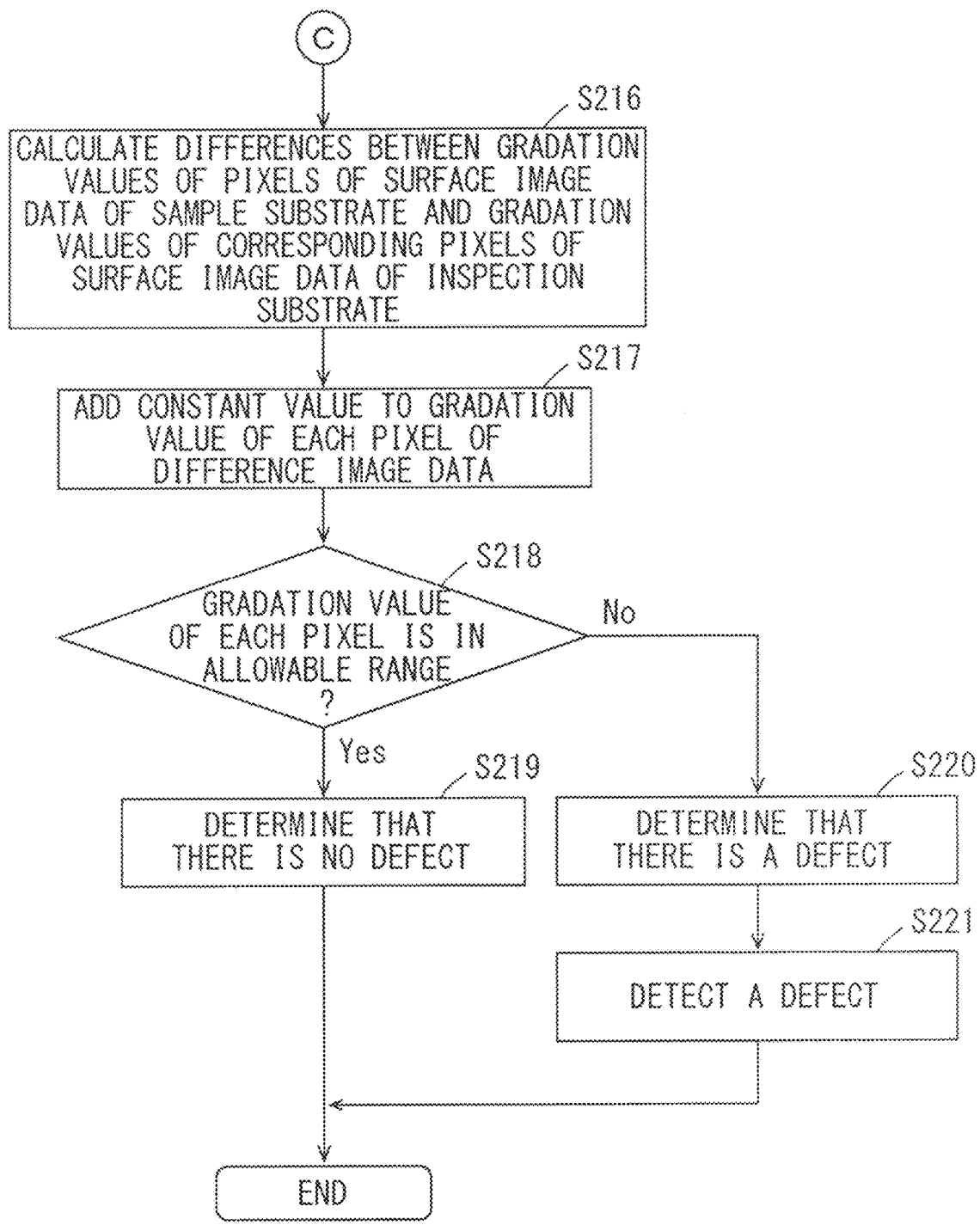
FIG. 27 is a flow chart of the defect determination processing according to the fifth embodiment.

FIGS. 26 and 27 are flow charts of the defect determination processing according to the fifth embodiment. Also in the present embodiment, before the start of the defect determination processing, the inspection is performed in advance with high accuracy, and the substrate that is determined to be non-defective in the inspection is prepared as a sample substrate. Further, in the present embodiment, the sample substrate has no distortion.

As shown in FIG. 26, the controller 114 acquires the surface image data of the non-defective sample substrate (step S211), and corrects the acquired surface image data to produce a surface image in the shape of the substrate W (step S212). In the present embodiment, the surface image data is acquired by the above-mentioned inspection unit IP. The surface image data may be acquired by another device instead of the inspection unit IP. In this case, the surface image SD2 of FIG. 12A is acquired, for example.

Next, similarly to the processing of the steps S211 and S212, the controller 114 acquires the surface image data of the inspection substrate W (step S213), and corrects the acquired surface image data to produce the surface image in the shape of the substrate W (step S214). In this case, the surface image SD3 of FIG. 12B is acquired, for example.

The position of each pixel of the surface image data of the sample substrate and the inspection substrate W acquired under the common condition by the inspection unit IP can be indicated by a two-dimensional coordinate system specific to the device, for example. In the present embodiment, the two-dimensional coordinate system specific to the device is an xy coordinate system having an x axis and a y axis orthogonal to each other. In this case, it is considered that the pixels located at positions of the same coordinates of the surface images SD2, SD3 ideally correspond to each other.

However, non-defective local distortion sometimes occurs in the inspection substrate W. Such distortion occurs due to thermal processing, for example. In this case, the position of the pixel of the surface image SD3 of the inspection substrate W corresponding to the distortion deviates from the position of the truly corresponding pixel of the surface image SD2 of the sample substrate.

Figure 28A:
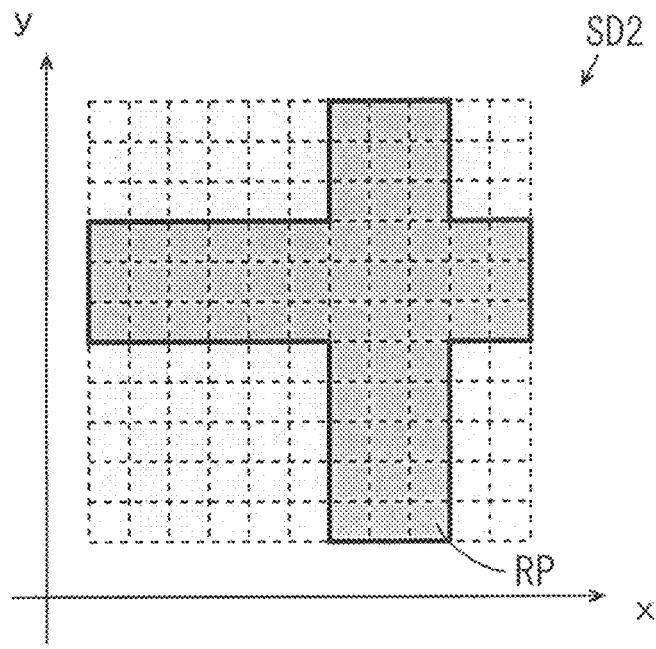
FIGS. 28A and 28B are diagrams for explaining an example in which a deviation has occurred in a correspondence relationship between a pixel of a surface image of the sample substrate and a pixel of a surface image of the inspection substrate.
Figure 28B:
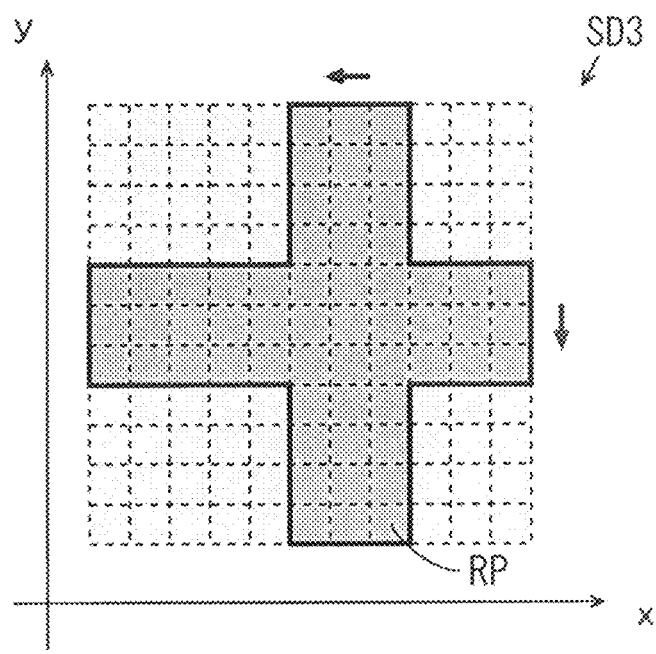

FIGS. 28A and 28B are diagrams for explaining an example in which a deviation is present in the correspondence relationship between the pixel of the surface image SD2 of the sample substrate and the pixel of the surface image SD3 of the inspection substrate W. An enlarged diagram of a partial region of the surface image SD2 is shown in FIG. 28A. An enlarged diagram of a partial region of the surface image SD3 at position of the same coordinates of the surface image SD2 of FIG. 28A (the position of the same coordinates) is shown in FIG. 28B. In FIGS. 28A and 28B, the plurality of pixels on the surface images SD2, SD3 are shown by dotted lines.

In the present example, as indicated by thick arrows in FIG. 28B, each pixel of the surface image SD3 truly corresponding to each pixel of the surface image SD2 deviates by one pixel from the position at which the pixel is supposed to be located (the position of the same coordinates as each pixel of the surface image SD2) in the x direction and the y direction.

In this manner, when the subsequent steps S216 to S221 are performed with a deviation being present in the correspondence relationship between the pixel of the surface image SD2 of the inspection substrate W and the pixel of the surface image SD3 of the sample substrate, presence or absence of a defect may not be accurately determined.

The controller 114 performs correspondence relationship correction processing in order to resolve a deviation that occurs in correspondence relationship between each set of pixels of the surface images SD2, SD3 of the sample substrate and the inspection substrate W, as shown in FIG. 26 (step S215). Details of the correspondence relationship correction processing will be described below.

Then, the controller 114 calculates a difference between a gradation value of a pixel of the surface image data of the sample substrate and a gradation value a corresponding pixel of the surface image data of the inspection substrate W (step S216), as shown in FIG. 27. More specifically, the controller 114 subtracts a gradation value of each pixel of the surface image SD2 of the sample substrate from a gradation value of a pixel of the surface image SD3 of the inspection substrate W corresponding to the pixel based on the correspondence relationship corrected by the correspondence relationship correction processing.

In the surface image SD3 of the inspection substrate W, an image similar to the surface structure of the sample substrate included in the surface image SD2 is included in addition to the image of a defect DP. Therefore, as for the pixel corresponding to a normal portion of the inspection substrate W, a difference acquired by the processing of the step S216 is small. On the one hand, in the case where there is a defect in appearance on the inspection substrate W, as for the pixel corresponding to a defective portion, the above-mentioned difference is large. Thus, a difference in gradation value for the pixel corresponding to a defective portion and a difference in gradation value for the pixel corresponding to a normal portion can be distinguished from each other.

In the following description, the surface image data made of differences acquired by the processing of the step S216 is referred to as difference image data. In this case, the surface image SD4 of FIG. 12C is acquired based on the difference image data, for example.

Next, the controller 114 adds a constant value to a gradation value of each pixel of the difference image data (step S217). Hereinafter, the surface image data after the processing of the step S217 is referred to as determination image data. For example, a center value of the range of the gradation values is added to a gradation value of each pixel. For example, in the case where the gradation values are indicated by numerical values of not less than 0 and not more than 255, 128 is added to a gradation value of each pixel. In this case, the surface image SD5 of FIG. 12D is acquired based on the determination image data, for example.

The controller 114 displays the produced surface image SD5 in the main panel PN of FIG. 1, for example. In this case, the user can view the surface image SD5 of FIG. 12D without an uncomfortable feeling. In the case where the user does not view the surface image SD5, the above-mentioned processing of the step S217 does not have to be performed.

Thereafter, the controller 114 determines whether a gradation value of each pixel of the determination image data is in a predetermined allowable range (step S218). In the present embodiment, the allowable range is determined in advance as a parameter specific to the device to include a gradation value for the pixel corresponding to a normal portion, and not to include a gradation value for the pixel corresponding to a defective portion.

In the case where a gradation value of each pixel of the determination image data is in the allowable range, the controller 114 determines that there is no defect in appearance on the inspection substrate W (step S219), and ends the defect determination processing. On the one hand, in the case where a gradation value of any pixel is outside of the allowable range, the controller 114 determines that there is a defect in appearance on the inspection substrate W (step S220). Further, the controller 114 detects the defect by extracting one or a plurality of pixels of which a gradation value is outside of the allowable range (step S221), and ends the defect determination processing.

In the above-mentioned step S221, the controller 114 may produce a surface image SD6 showing the extracted defect DP as shown in FIG. 12E. Further, the controller 114 may display the produced surface image SD6 in the main panel PN of FIG. 1. As described above, a defect in appearance on the inspection substrate W is detected, so that a position and a shape of the defect can be identified.

For the inspection substrate W determined to be defective in the defect determination processing, different processing from the processing for the substrate W determined to be non-defective is performed after the inspection substrate W is carried out from the substrate processing apparatus 100.

(2) Correspondence Relationship Correction Processing

Figure 29:
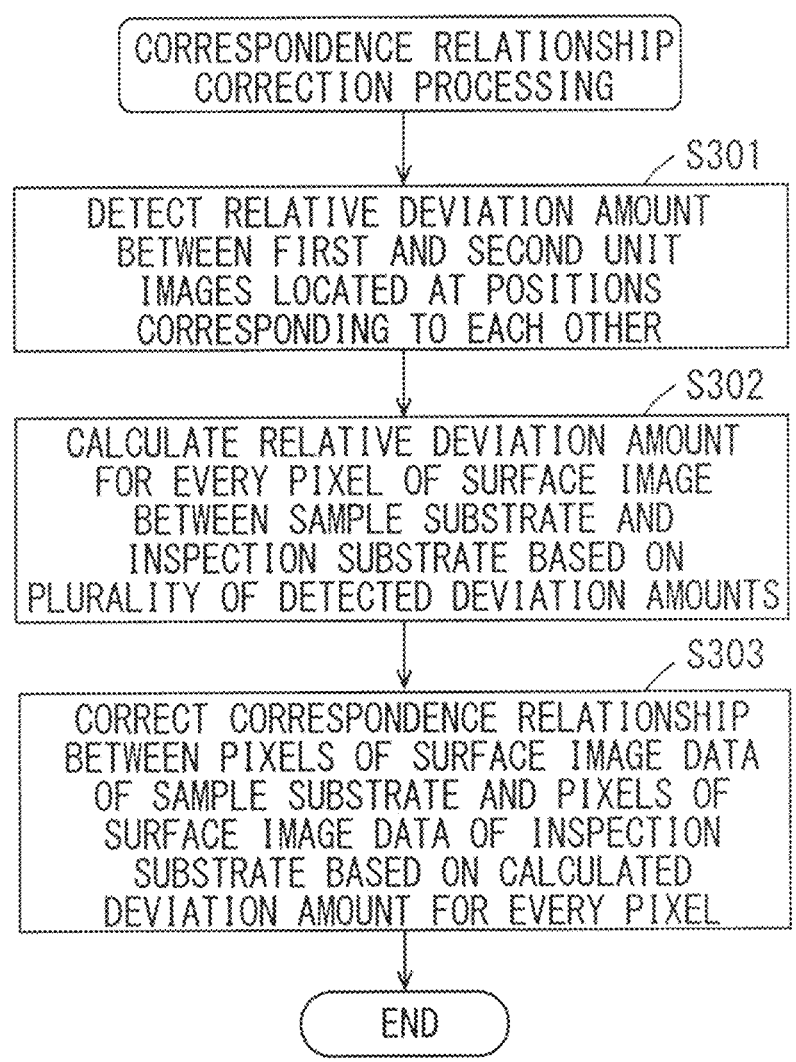
FIG. 29 is a flow chart of correspondence relationship correction processing.

FIG. 29 is a flow chart of the correspondence relationship correction processing. FIGS. 30A to 33C are diagrams for conceptually explaining the contents of each processing of the correspondence relationship correction processing of FIG. 29. In the present example, the controller 114 of FIG. 1 performs the correspondence relationship correction processing. The surface image of the substrate W acquired by the above-mentioned inspection unit IP includes a plurality of unit images. The unit images have a predetermined measurement.

In the following description, each of the plurality of unit images included in the surface image SD2 of the sample substrate is referred to as a first unit image 1U, and a plurality of surface image data respectively indicating the plurality of first unit images 1U are referred to as pieces of first unit image data. Further, each of the plurality of unit images included in the surface image SD3 of the inspection substrate W is referred to as a second unit image 2U, and a plurality of surface image data respectively indicating the plurality of second unit images are referred to as pieces of second unit image data.

As shown in FIG. 29, as for the surface images SD2, SD3 produced in the steps S212, S214 of FIG. 26, the controller 114 detects a relative deviation amount between the first and second unit images 1U, 2U located at positions corresponding to each other (step S301).

Figure 30A:
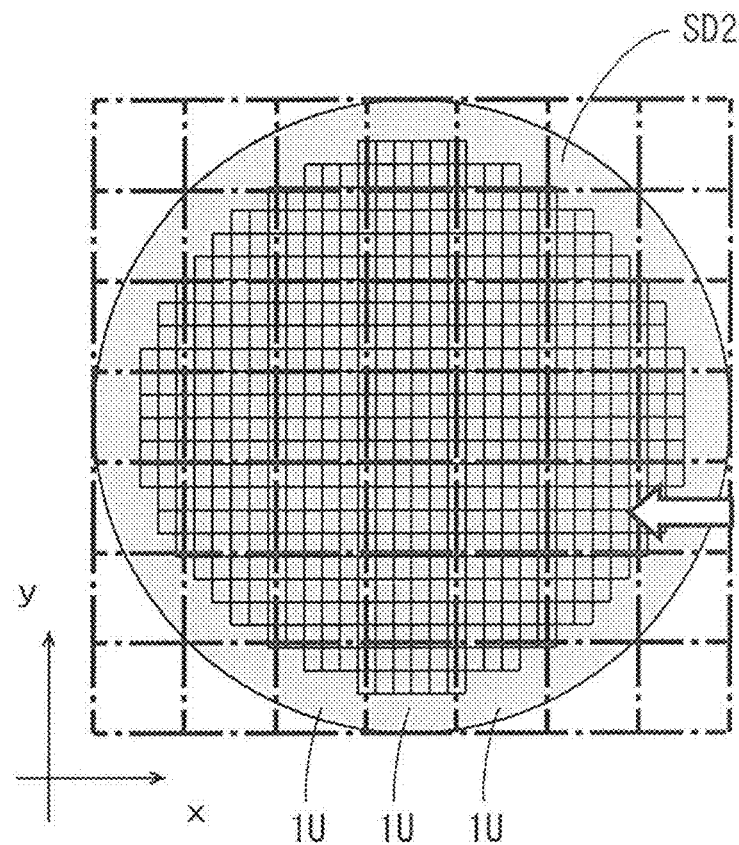
FIGS. 30A and 30B are diagrams for conceptually explaining the contents of each processing of the correspondence relationship correction processing of FIG. 29.
Figure 30B:
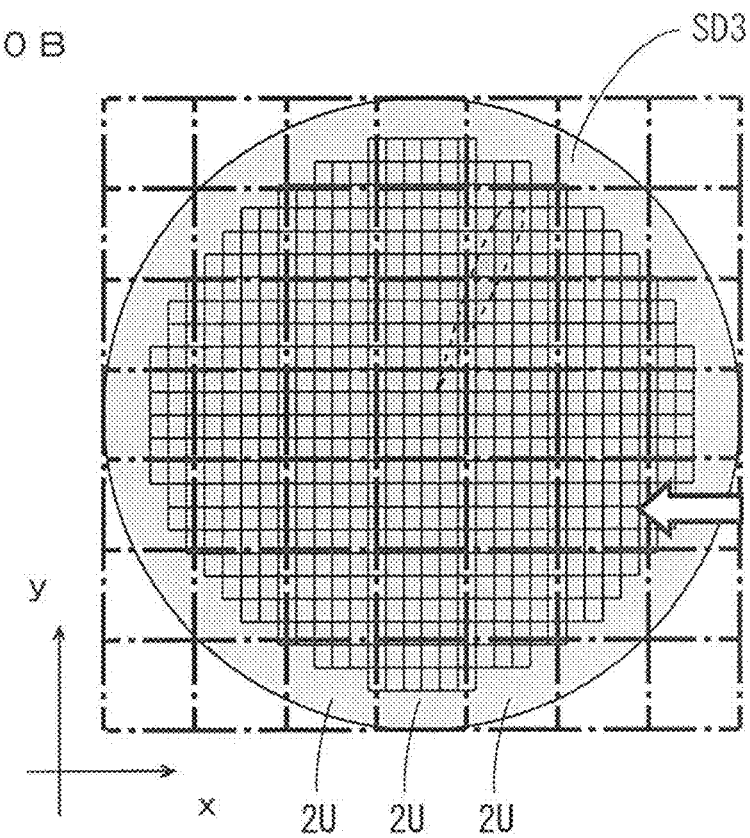

The plurality of first unit images 1U included in the surface image SD2 of the sample substrate are indicated by thick one-dot and dash lines in FIG. 30A, and the plurality of second unit images 2U included in the surface image SD3 of the inspection substrate W are indicated by thick one-dot and dash lines in FIG. 30B. A specific example in which a relative deviation amount between the first and second unit images 1U, 2U indicated by outlined arrows in FIGS. 30A and 30B is detected will be explained in the above-mentioned step S101.

First, differences between gradation values of the pixels of the first second unit image 1U and gradation values of the pixels located at corresponding positions of the second unit image 2U are calculated. A coincidence degree that indicates the degree of coincidence between the pieces of first and second unit image data is calculated based on the plurality of calculated differences. More specifically, the total of absolute values of the plurality of calculated differences is calculated as the coincidence degree.

In the case where a position of an arbitrary pixel is indicated by coordinates (x, y), the gradation value of the pixel of the first unit image 1U in the coordinates (x, y) is indicated by g1 (x, y), and the gradation value of the pixel of the second unit image 2U in the coordinates (x, y) is indicated by g2 (x, y), the coincidence degree AL can be expressed by a following formula (2).

$$AL = \sum_{x=a}^{m} \sum_{y=b}^{n} \text{abs}\{g2(x, y) - g1(x,y)\} \quad (2)$$

In the above-mentioned formula (2), 'a' indicates a minimum value of the x coordinate of the first unit image 1U, and 'm' indicates a maximum value of the x coordinate of the first unit image 1U. Further, 'b' indicates a minimum value of the y coordinate of the first unit image 1U, and 'n' indicates a maximum value of the y coordinate of the first unit image 1U.

In this case, the closer the value of the coincidence degree AL is to 0, the higher the degree of coincidence between the pieces of first and second unit image data is. On the one hand, the farther the value of the coincidence degree AL is from 0, the lower the degree of coincidence between the pieces of first and second unit image data is.

Next, as indicated by outlined arrows in FIG. 31, the first unit image 1U is moved in the x direction and the y direction by one pixel with respect to the second unit image 2U in a predetermined region AA. At this time, the coincidence degree AL is calculated using the above-mentioned formula (2) every time the first unit image 1U is moved by one pixel. The predetermined region AA is set to surround a region deviating in the respective x direction and y direction by 7 pixels from to the second unit image 2U, for example.

Thereafter, a movement amount of the first unit image 1U in the x direction and the y direction in the case where the coincidence degree AL that is 0 or closest to 0 among the plurality of calculated coincidence degrees AL is acquired is detected as a relative deviation amount between the first and second unit images 1U, 2U. In this manner, a relative deviation amount between the first and second unit images 1U, 2U is appropriately detected for each of all of the first and second unit images 1U, 2U based on the difference in gradation value of the pixel corresponding to a normal portion.

Next, as shown in FIG. 29, the controller 114 calculates a relative deviation amount for every pixel between the surface images SD2, SD3 of the sample substrate and the inspection substrate W based on the plurality of detected deviation amounts (step S302).

For example, the calculated deviation amount between the first and second unit images 1U, 2U located at positions corresponding to each other is determined as a deviation amount of the center pixel of the first unit image 1U with respect to the center pixel of the second unit image 2U. Further, a deviation amount of each pixel in a region surrounded by center pixels of the four first unit images 1U adjacent to one another is calculated by bilinear interpolation based on the deviation amount determined for the four center pixels.

In FIG. 32, one example of a method of calculating a deviation amount for every pixel by the bilinear interpolation is shown. As shown in FIG. 32, let the coordinates of the center pixels 1UC of the four first unit images 1U be $(X_0, Y_0)$, $(X_1, Y_0)$, $(X_1, Y_1)$, $(X_0, Y_1)$, and let the respectively determined deviation amounts be $P_{00}$, $P_{10}$, $P_{11}$, $P_{01}$. Further, as for an arbitrary coordinates (x, y) in the region surrounded by the four center pixels 1UC, let the coordinates that are converted in order to perform the bilinear interpolation be (x', y'). In this case, x' and y' can be expressed by the following formulas (3), (4).

$$X' = (x - X_0)/(X_1 - X_0) \quad (3)$$

$$Y' = (y - Y_0)/(Y_1 - Y_0) \quad (4)$$

Further, coefficients $K_{00}$, $K_{10}$, $K_{11}$, $K_{01}$ for the deviation amounts $P_{00}$, $P_{10}$, $P_{11}$, $P_{01}$ can be expressed by following formulas (5), (6), (7), (8), respectively.

$$K_{00} = (1-x') \times (1-y') \quad (5)$$

$$K_{10} = (1-x') \times y' \quad (6)$$

$$K_{11} = x' \times y' \quad (7)$$

$$K_{01} = x' \times (1-y') \quad (8)$$

The deviation amount P in the coordinates (x, y) is expressed by a following formula (9).

$$P = K_{00} \times P_{00} + K_{10} \times P_{10} + K_{11} \times P_{11} + K_{01} \times P_{01} \quad (9)$$

After deviation amounts for all of the pixels on the surface image SD2 are calculated using the above-mentioned formulas (3) to (9), the controller 114 corrects the correspondence relationship between the pixel of the surface image data of the sample substrate and the pixel of the surface image data of the inspection substrate W based on the deviation amount calculated for every pixel, as shown in FIG. 29 (step S303).

For example, the controller 114 corrects a gradation value of each pixel of the surface image SD2 of the sample substrate based on the deviation amount calculated for each pixel such that a deviation in correspondence relationship for each pixel of the surface image SD3 of the inspection substrate W is resolved as correction of correspondence relationship.

Figure 33A:
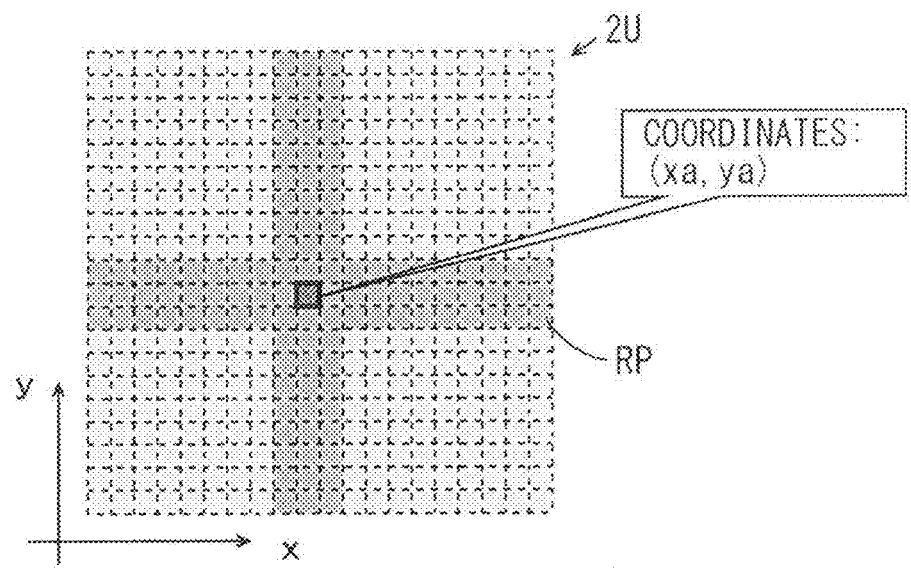
FIGS. 33A to 33C are diagrams for conceptually explaining the contents of each processing of the correspondence relationship correction processing of FIG. 29.
Figure 33B:
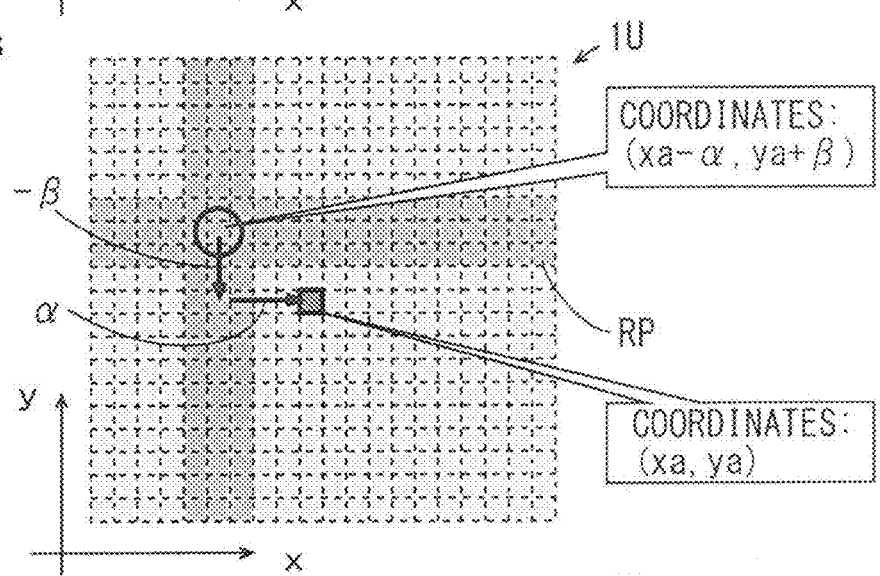

One example of the second unit image 2U is shown in FIG. 33A. One example of the first unit image 1U is shown in FIG. 33B. It is assumed that the second unit image 2U of FIG. 33A and the first unit image 1U of FIG. 33B are located at positions corresponding to each other. The coordinates of the pixel indicated by hatching in FIGS. 33A and 33B are treated as (xa, ya). Further, it is assumed that the deviation amounts calculated for the pixel of the coordinates (xa, ya) are α and −β in the x direction and the y direction, respectively.

Figure 33C:
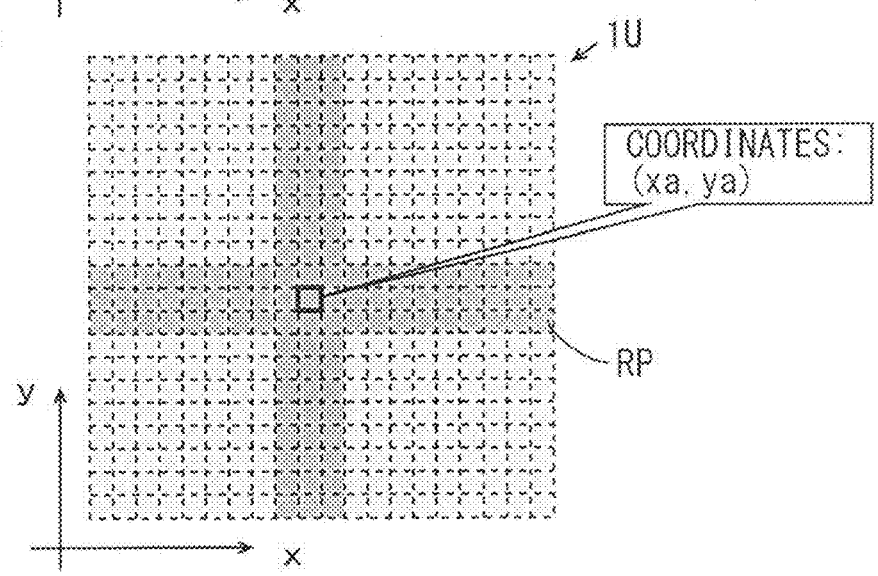

In this case, as for the first unit image 1U, the controller 114 treats the gradation value of the pixel located at the coordinates (xa−α, ya+β) as the gradation value of the pixel of the coordinates (xa, ya). In this manner, similar processing based on each deviation amount is performed for each pixel of the first unit image 1U, whereby the first unit image 1U of which a deviation in correspondence relationship with the second unit image 2U is resolved can be acquired as shown in FIG. 33C. At this time, the first unit image 1U of FIG. 33C has distortion included in the second unit image 2U.

In this manner, the surface image SD2 of the sample substrate is corrected based on the deviation amount of each pixel, so that the correspondence relationship between the pixel of the surface image SD2 of the sample substrate and the pixel of the surface image SD3 of the inspection substrate W is corrected. Thereafter, the controller 114 ends the correspondence relationship correction processing.

In the step S216 of the defect determination processing, the controller 114 can calculate a difference between gradation values of the truly corresponding pixels by calculating a difference between a gradation value of a pixel of the corrected surface image SD2 and a gradation value of a pixel located at a corresponding position of the surface image SD3.

In the above-mentioned step S301, when variations in correspondence degree are large, part of the correspondence degrees may be erroneously calculated. Essentially, it is considered that the first and second unit images 1U, 2U corresponding to each other are located at positions corresponding to each other or positions in the vicinity of them. Therefore, the coincidence degree having an extremely high value is likely to be erroneously calculated. On the one hand, in the case where the plurality of coincidence degrees calculated for the first and second unit images 1U, 2U located at positions corresponding to each other indicate substantially the constant value, it is difficult to identify the coincidence degree in the case where the pieces of first and second unit image data coincides with each other. The controller 114 may detect a relative deviation amount between the first and second unit images 1U, 2U located at positions corresponding to each other as described below.

First, similarly to the above-mentioned example, the controller 114 calculates a plurality of coincidence degrees for the first and second unit images 1U, 2U located at positions corresponding to each other. Thereafter, the controller 114 subtracts a minimum value from a maximum value of the plurality of coincidence degrees. In this case, the calculated subtraction value is equivalent to the magnitude of the variations of the plurality of coincidence degrees calculated for the first and second unit images 1U, 2U. Thereafter, the controller 114 determines whether the subtraction value of the coincidence degree is not more than a predetermined threshold value.

In the case where the subtraction value of the coincidence degree is larger than the predetermined threshold value, the controller 114 detects the movement amounts of the first unit image 1U in the x direction and the y direction in the case where the coincidence degree is in a predetermined range of the coincidence degree, and the deviation amount is minimized as a relative deviation amount between the first and second unit images 1U, 2U.

In the case where letting a maximum value and a minimum value of the plurality of coincidence degrees be AL(max) and AL(min), and letting a coincidence allowable ratio be AP, a predetermined range ALA of the coincidence degree can be expressed by a following formula (10).

$$AL(min) \leq ALA < \{AL(max) - AL(min)\} \times AP + AL(min) \quad (10)$$

The coincidence allowable ratio AP is set to about 10%, for example.

In this manner, in the case where the subtraction value of the coincidence degree is larger than the predetermined threshold value, the movement amount of the first unit image 1U in the case where the coincidence degree with high reliability is acquired is appropriately detected as a deviation amount. Therefore, detection of a relative deviation amount between the first and second unit images 1U, 2U based on the erroneously calculated coincidence degree is prevented.

On the one hand, in the case where the subtraction value of the coincidence degree is not more than the predetermined threshold value, the controller 114 treats the deviation amount between the first and second unit images 1U, 2U as a target of interpolation. Further, the controller 114 interpolates the deviation amount between the first and second unit images 1U, 2U with an average amount of the plurality of deviation amounts detected for a plurality of sets of the other first and second unit images 1U, 2U adjacent to the first and second unit images 1U, 2U. Thus, even for the inspection substrate W having the surface structure in which a difference between gradation values of images is unlikely to occur, or an unprocessed bare wafer, the deviation amount for every pixel can be appropriately calculated.

The controller 114 may interpolate the deviation amount for the first and second unit images 1U, 2U with the deviation amount detected for the adjacent one set of the other first and second unit images 1U, 2U. Further, in the case where deviation amounts for all of other first and second unit images 1U, 2U adjacent to the first and second unit images 1U, 2U are targets of interpolation, the controller 114 may determine that the deviation amount is 0 (not deviating).

In the above-mentioned step S302, a deviation amount of each pixel in a region surrounded by center pixels of four first unit images 1U adjacent to one another is calculated by the bilinear interpolation based on the deviation amounts determined for the four center pixels. The invention is not limited to the above-mentioned example. The deviation amount of each pixel in the region surrounded by four center pixels may be calculated by another interpolation method such as nearest neighbor interpolation based on a deviation amount of any of the four center pixels.

(3) Effects

In the defect determination processing according to the fifth embodiment, the surface image data of the sample substrate with no defect in appearance is acquired, and the surface image data of the inspection substrate W is acquired. As for a normal portion of the inspection substrate W, a difference between a gradation value of a pixel of the surface image data of the inspection substrate W and a gradation value of a corresponding pixel of the surface image data of the sample substrate is small. On the one hand, as for the pixel corresponding to a defective portion, the above-mentioned difference is large. Therefore, even in the case where a gradation value of the pixel corresponding to a defective portion is close to a gradation value of the pixel corresponding to a normal portion, the above-mentioned difference corresponding to a defective portion is larger than the above-mentioned difference corresponding to a normal portion.

A difference in gradation value is calculated for the pixel of the surface image data of the inspection substrate W and the corresponding pixel of the surface image data of the sample substrate, and the difference image data is produced. In this case, a difference for the pixel corresponding to a defective portion and a difference for the pixel corresponding to a normal portion can be distinguished from each other. Therefore, the allowable range is determined in advance to include a difference corresponding to a normal portion and not to include a difference corresponding to a defective portion, whereby it is possible to determine whether there is a defect.

However, local distortion, which is not a defect, sometimes occurs in the inspection substrate W. In this case, a position of the pixel of the inspection substrate W corresponding to a distorted portion deviates from a position of the truly corresponding pixel of the sample substrate. Therefore, when the above-mentioned difference image data is calculated on the assumption that the correspondence relationship between the surface image data of the sample substrate and the surface image data of the inspection substrate W is accurate, presence and absence of a defect cannot be accurately determined.

In the present embodiment, the correspondence relationship correction processing is performed. In the correspondence relationship correction processing, a relative deviation amount between the first and second unit images 1U, 2U is detected by comparison between the pieces of first and second unit image data of the first and second unit images 1U, 2U located at positions corresponding to each other. Thus, relative deviation amounts of positions are respectively detected for the plurality of portions corresponding to each other between the surface images SD2, SD3 of the sample substrate and the inspection substrate W.

The deviation amount for every pixel of the surface images SD2, SD3 is calculated based on the plurality of detected deviation amounts. The correspondence relationship between the pixels of the surface image data of the sample substrate and the pixel of the surface image data of the inspection substrate W is corrected based on the calculated deviation amount for every pixel, and a deviation for every pixel is resolved.

Thus, even in the case where local distortion is present in the inspection substrate W, the pixels corresponding to each other can be accurately distinguished by correction of the correspondence relationship between the pixel of the surface image data of the sample substrate and the pixel of the surface image data of the inspection substrate W. A difference between a gradation value of a pixel of the surface image data of the sample substrate and a gradation value of a corresponding pixel of the surface image data of the inspection substrate W is calculated, and the difference image data is produced.

In this case, for a normal portion, because gradation values of the pixels located at positions corresponding to each other of the surface images SD2, SD3 substantially coincide with each other, a difference in gradation value is small. On the one hand, for a defective portion, because a difference resulting from a defect occurs in the gradation values of the pixels located at positions corresponding to each other of the first and second images, a difference in gradation value is large. Therefore, a defect in appearance on the inspection substrate W can be detected with high accuracy.

(4) Modified Example of Defect Determination Processing

In the step S218 of the above-mentioned defect determination processing, it is determined that there is a defect in appearance on the inspection substrate W in the case where a gradation value of each pixel of the determination image data is outside of the allowable range. However, the present invention is not limited to this.

In the determination image data, gradation values of part of the pixels not corresponding to a defect may be outside of the allowable range due to noise, disturbance or the like. In the defect determination processing, the following processing may be performed instead of the processing of the step S218 of FIG. 27.

Figure 34:
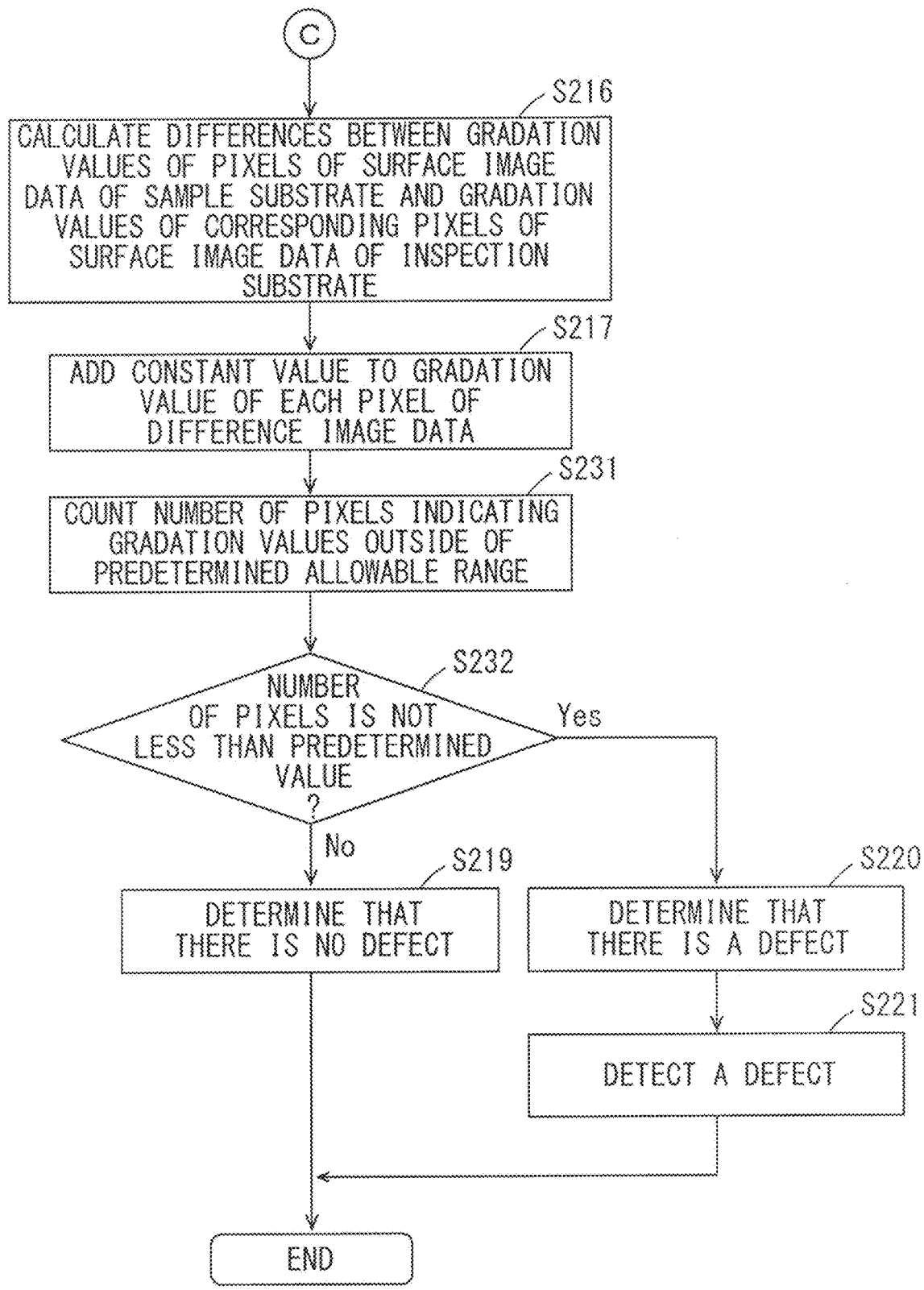
FIG. 34 is flow chart showing a modified example of the defect determination processing according to the fifth embodiment.

FIG. 34 is a flow chart showing the modified example of the defect determination processing according to the fifth embodiment. In the present example, after performing the processing of the steps S211 to S217 of FIGS. 26 and 27 in the defect determination processing, the controller 114 counts the number of pixels indicating the gradation values outside of the allowable range instead of the processing of the step S218 (step S231). Further, the controller 114 determines whether the counted number is not less than a predetermined number (step S232). Further, in the step S231, the controller 114 determines that there is no defect in appearance on the inspection substrate W in the case where the counted number is smaller than the predetermined number (step S219). On the one hand, the controller 114 determines that there is a defect in appearance on the inspection substrate W in the case where the counted number is not less than the predetermined number (step S220), and detects a defect (step S221).

In this case, in the case where the number of pixels indicating the gradation values outside of the allowable range is smaller than the predetermined number, it is not determined that there is a defect. Therefore, determination error due to noise, disturbance or the like can be prevented.

[6] Sixth Embodiment

The substrate processing apparatus according to the sixth embodiment has the same configuration and operation as the substrate processing apparatus according to the fifth embodiment except for the following point.

(1) Detection Error of Deviation Amount

In the fifth embodiment, a relative deviation amount between the first and second unit images 1U, 2U located at positions corresponding to each other is detected based on the above-mentioned coincidence degree in the step S301 of the correspondence relationship correction processing.

Figure 35A:
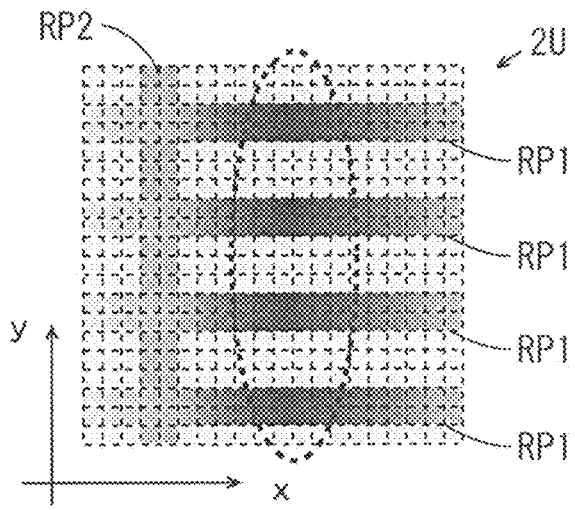
FIGS. 35A to 35C are diagrams showing an example in which a relative deviation amount between the first and second unit images is erroneously detected.
Figure 35B:
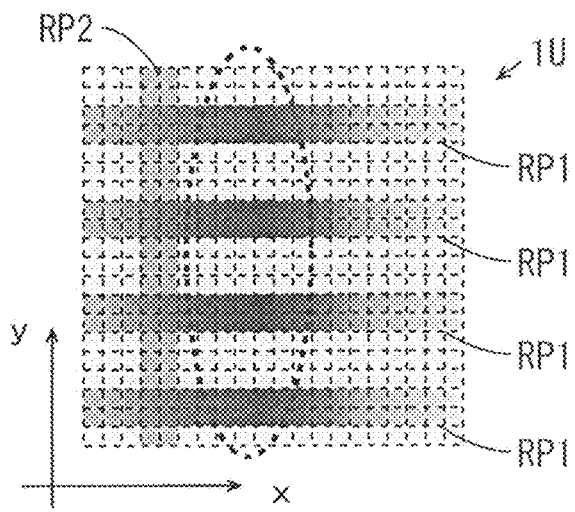
Figure 35C:
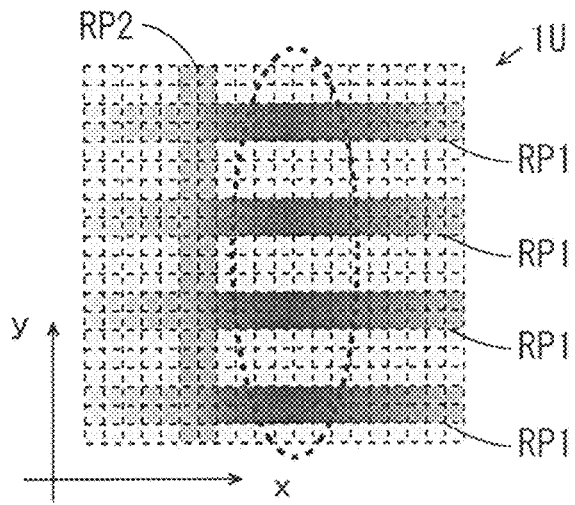

However, depending on a type of the surface structure of the sample substrate and the inspection substrate W, a relative deviation amount between the first and second unit images 1U, 2U may be erroneously detected. FIGS. 35A to 35C are diagrams showing an example in which a relative deviation amount between the first and second unit images 1U, 2U is erroneously detected.

One example of the second unit image 2U is shown in FIG. 35A. One example of the first unit image 1U is shown in FIG. 35B. The second unit image 2U of FIG. 35A and the first unit image 1U of FIG. 35B are located at positions corresponding to each other. In the present example, four resist patterns RP1 extending in the x direction and arranged in the y direction are shown, and one resist pattern RP2 extending in the y direction is shown, in each of the first and second unit images 1U, 2U. In the four resist patterns RP1, the gradation value gently changes in the x direction. On the one hand, the gradation value of the resist pattern RP2 is constant.

As indicated by a thick dotted line in FIG. 35A, in each resist pattern RP1 shown in the second unit image 2U, the gradation value is locally reduced in the center portion in the x direction. On the one hand, as indicated by a thick dotted line in FIG. 35B, in each resist pattern RP1 shown in the first unit image 1U, the gradation value is locally reduced at a position deviating from the center portion in the x direction by a constant distance.

In the present example, the area of the four resist patterns RP is larger than that of the one resist pattern RP2. Therefore, the coincidence degree calculated, in the case where the positions of portions having locally reduced gradation values of the four resist patterns RP1 coincide with the positions of the four resist patterns RP1 between the first and second unit images 1U, 2U, is closer to 0 than the coincidence degree calculated in the case where positions of the one resist patterns RP2 coincide with each other between the first and second unit images 1U, 2U.

In this case, as shown in FIGS. 35A and 35B, even when no deviation has essentially occurred in the correspondence relationship between the first and second unit images 1U, 2U, an erroneous deviation amount is detected. As a result, as shown in FIG. 35C, each pixel of the first unit image 1U after the correspondence relationship correction processing may deviate from the truly corresponding pixel.

Figure 36:
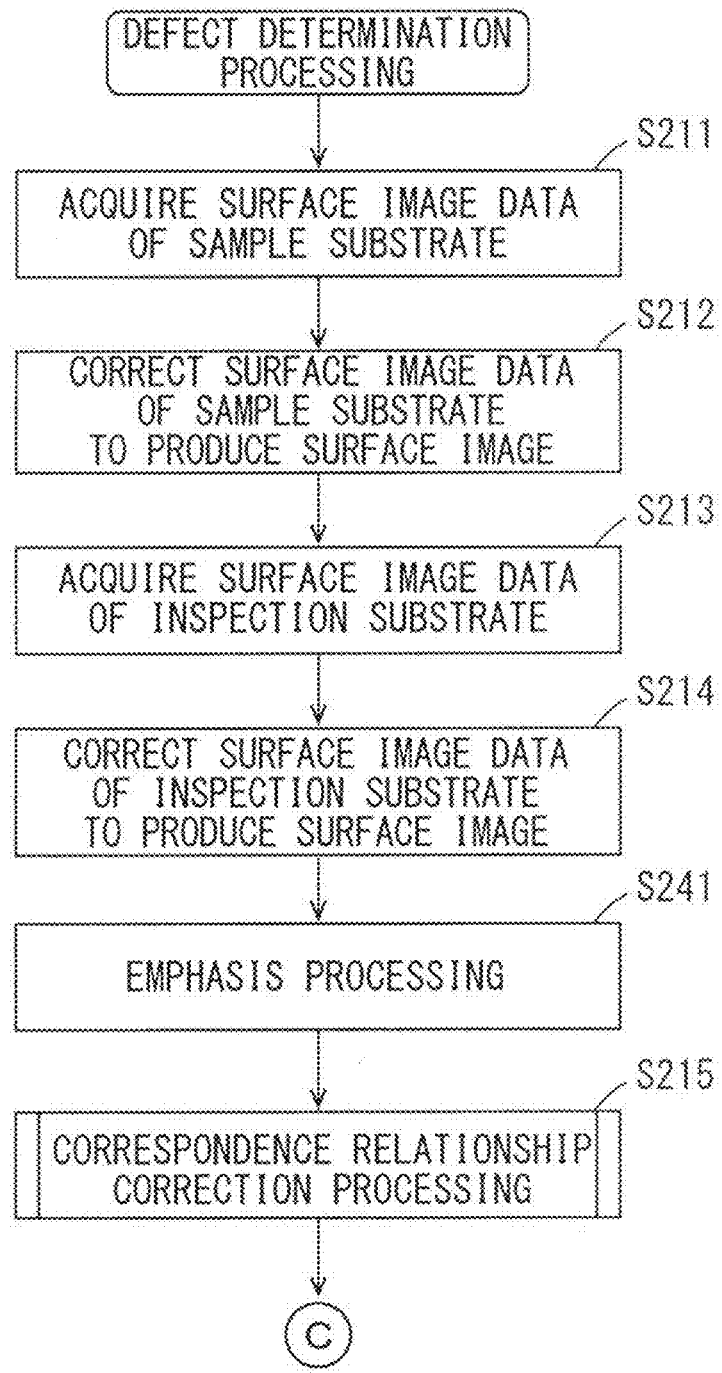
FIG. 36 is a flow chart showing part of the defect determination processing according to a sixth embodiment.

In the substrate processing apparatus according to the present embodiment, emphasis processing is performed in the defect determination processing. FIG. 36 is a flow chart showing part of the defect determination processing according to the sixth embodiment. In the present example, after performing the processing of the step S211 to S214 similarly to the fifth embodiment, the controller 114 performs the emphasis processing of the contrast under a predetermined condition (step S241).

As the emphasis processing, unsharp mask processing is used, for example. Specifically, as for each of the surface image data of the sample substrate and the surface image data of the inspection substrate W, an average of the gradation values is calculated for the prescribed number of the peripheral pixels centered at a target pixel, and the average value is treated as the gradation value for the target pixel. In the present example, all pixels of the surface images SD2, SD3 are treated as target pixels, and a gradation value of each pixel is changed to the average value of the peripheral pixels. In this manner, the surface image data is smoothed.

Thereafter, a gradation value of each pixel of the surface image data after smoothing is subtracted from a gradation value of each pixel of the surface image data before smoothing. A gradation value of each pixel of the surface image data after the subtraction processing is multiplied by a predetermined coefficient. A gradation value of each pixel of the surface image data before smoothing is added to a gradation value of each pixel of the surface image data after the multiplication processing. Thus, the unsharp mask processing is ended. In this unsharp mask processing, the surface structure of the surface images SD2, SD3 of the sample substrate and the inspection substrate W and a contour of the image corresponding to a defect are emphasized.

After the processing of the step S241, the controller 114 performs the correspondence relationship correction processing of the step S215 based on the surface image data after the emphasis processing for the sample substrate and the inspection substrate W. Thereafter, the controller 114 performs the subsequent processing after the step S216 of FIG. 27.

(2) Effects

In the present embodiment, emphasis processing is performed on the surface image data of each of the sample substrate and the inspection substrate W before the correspondence relationship correction processing is performed. Thus, the normal surface structure of the sample substrate and inspection substrate can be accurately identified. As a result, detection error of the deviation amount can be prevented in the correspondence relationship correction processing of the subsequent step S215.

[7] Seventh Embodiment

The substrate processing apparatus according to the seventh embodiment has the same configuration and operation as the substrate processing apparatus according to the fifth embodiment except for the following point.

(1) Detection Error of Deviation Amount

In the fifth embodiment, in the step S302 of the correspondence relationship correction processing, a relative deviation amount for every pixel between the surface images SD2, SD3 of the sample substrate and the inspection substrate W is calculated in the step S302 of the correspondence relationship correction processing. However, part of the deviation amounts may be erroneously calculated due to noise, disturbance or the like. It is considered that the deviation amount erroneously calculated for one pixel is largely different from the deviation amounts calculated for pixels surrounding the pixel. In the substrate processing apparatus according to the present embodiment, deviation amount optimization processing is performed in the correspondence relationship correction processing.

Figure 37:
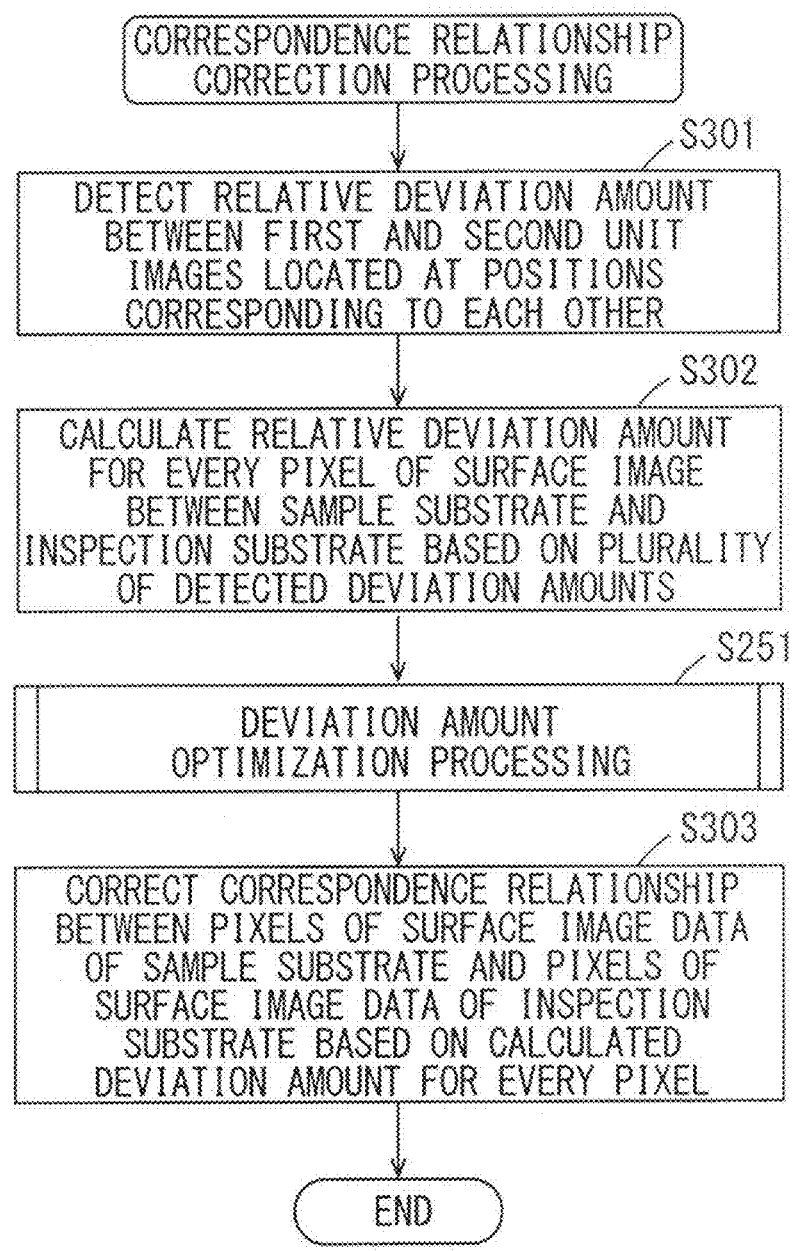
FIG. 37 is a flow chart of the correspondence relationship correction processing according to a seventh embodiment.

FIG. 37 is a flow chart of the correspondence relationship correction processing according to the seventh embodiment. As shown in FIG. 37, after performing the processing of the step S301, S302 similarly to the fifth embodiment, the controller 114 performs the deviation amount optimization processing (step S251). In the deviation amount optimization processing, the deviation amount of the pixel considered to have been erroneously calculated in the processing of the step S302 is interpolated based on the deviation amounts of pixels surrounding the pixel. Thereafter, the controller 114 performs the processing of the step S303.

(2) Deviation Amount Optimization Processing

Figure 38:
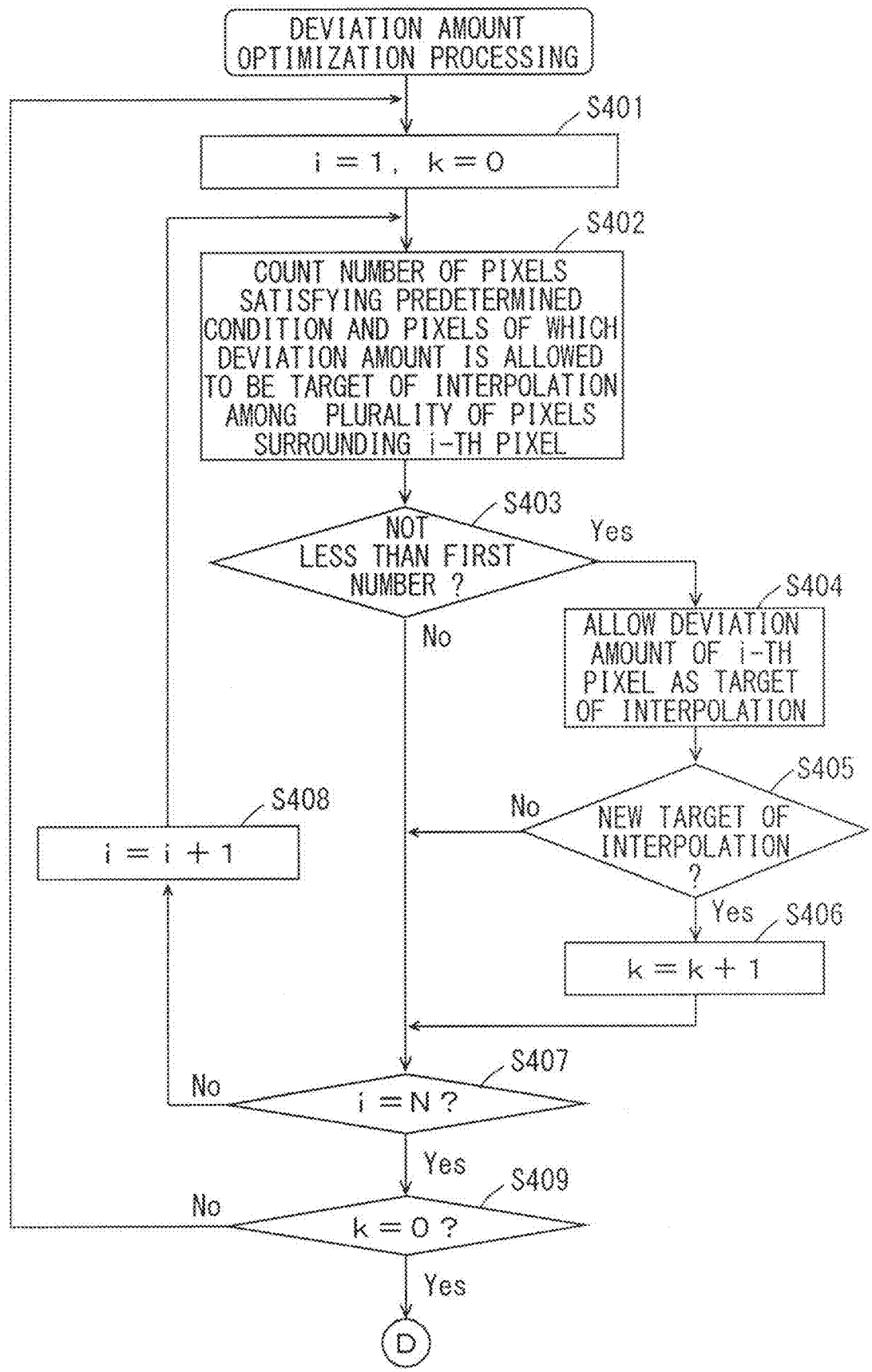
FIG. 38 is a flow chart of deviation amount optimization processing.
Figure 39:
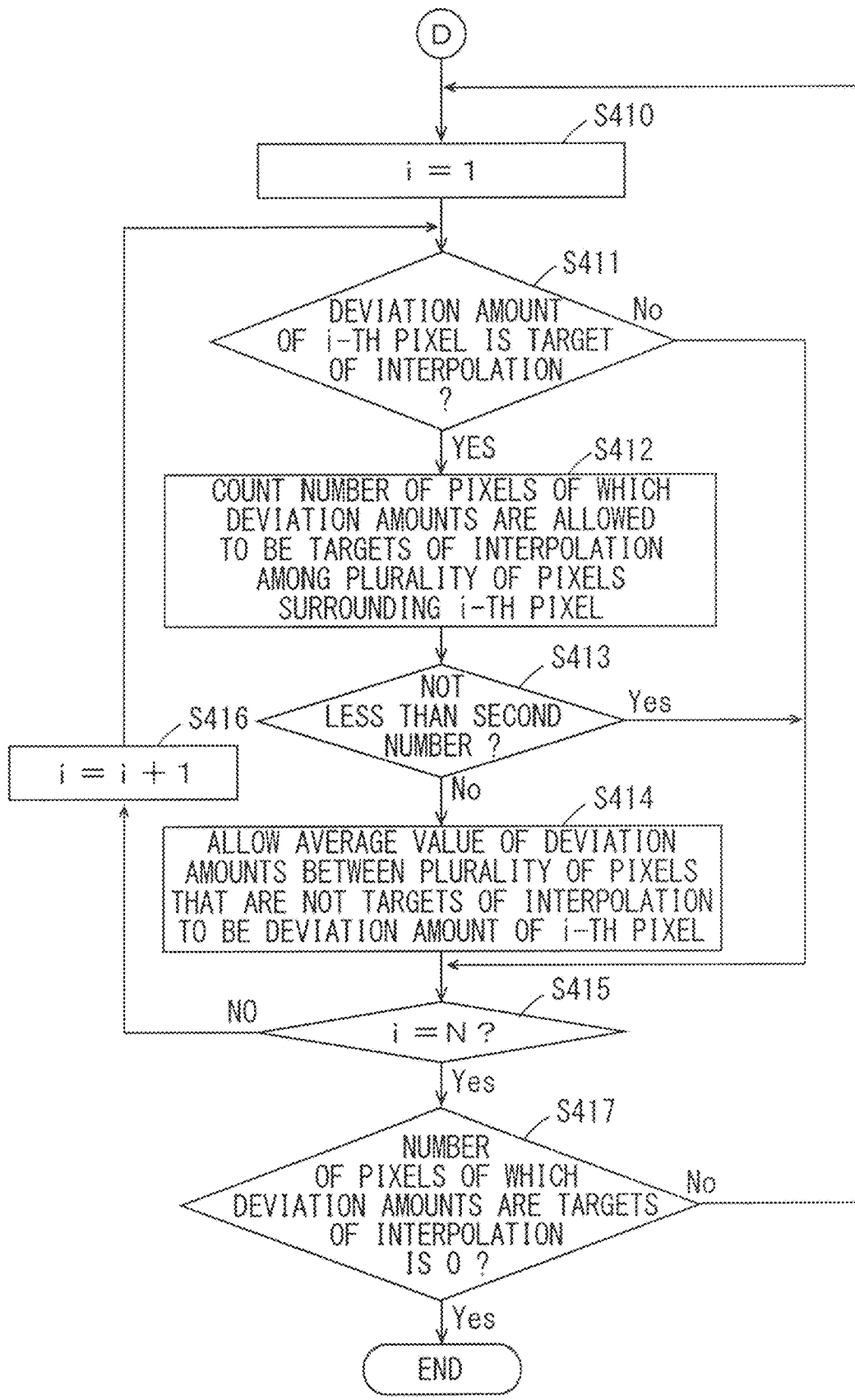
FIG. 39 is a flow chart of the deviation amount optimization processing.

The details of the deviation amount optimization processing will be described. FIGS. 38 and 39 are flow charts of the deviation amount optimization processing. FIGS. 40A to 40C are diagrams showing states of the deviation amounts of the plurality of pixels to be optimized by the deviation amount optimization processing. In the following description, N is the number of all pixels of the surface image SD2. Further, a variable i is a natural number of not more than N, and a variable k is an integer of not less than 0.

As shown in FIG. 38, the controller 114 first treats the variable i as 1, and the variable k as 0 (step S401). Next, the controller 114 counts the number of the pixels of which the deviation amounts satisfy a predetermined condition among a plurality of pixels surrounding the i-th pixel, and the number of the pixels of which the deviation amounts are treated as the targets of interpolation by processing of the below-mentioned step S404 (step S402).

The plurality of pixels surrounding the i-th pixel in the step S402 are 8 pixels surrounding the i-th pixel, for example. Further, the predetermined condition is that at least one deviation amount of the deviation amounts in x direction and y direction is 2 or more, for example.

Subsequently, the controller 114 determines whether the counted number is not less than a predetermined first number (step S403). The predetermined first number is 5, for example.

In the case where the counted number is smaller than the first number, the controller 114 proceeds to the processing of the step S407. On the one hand, in the case where the counted number is not less than the first number, the controller 114 treats the deviation amount of the i-th pixel as the target of interpolation (step S404). Then, the controller 114 determines whether the target of interpolation set right before in the processing of the step S404 is newly set (step S405). In the case where the target of interpolation is not newly set, the controller 114 proceeds to the processing of the step S407. On the one hand, in the case where the target of interpolation is newly set, the controller 114 adds 1 to the variable k (step S406), and proceeds to the processing of the step S407.

In the step S407, the controller 114 determines whether the value of the variable i is N. In the case where the variable i is not N, the controller 114 adds 1 to the variable i (step S408), and proceeds to the processing of the step S402. On the one hand, in the case where the variable i is N, the controller 114 determines whether the variable k is 0 (step S409). In the case where the variable k is not 0, the controller 114 proceeds to the processing of the step S401. On the one hand, in the case where the variable k is 0, the controller 114 proceeds to the processing of the below-mentioned step S410.

The processing of the above-mentioned steps S401 to S409 is performed in order to detect the deviation amount that may be erroneously calculated for every pixel and set the detected deviation amount as the target of the interpolation.

In FIG. 40A, one example of the deviation amounts respectively calculated for the plurality of pixels in the step S302 of FIG. 37 is shown. In FIG. 40A, total 25 pixels in which 5 pixels are arranged in the x direction and 5 pixels are arranged in the y direction, respectively, are indicated by dotted lines. Further, the deviation amounts in the x direction and the y direction calculated for each pixel are shown. In the present example, the deviation amounts calculated for 9 pixels located at the center are respectively (5, 0), and the deviation amounts calculated for 16 pixels surrounding the 9 pixels are respectively (0, 0).

When the optimization is performed for the plurality of deviation amounts of FIG. 40A, the processing of the steps S402, S403 is first repeated for all of the pixels. In this case, the deviation amounts of the four pixels indicated by thick bold frames are newly treated as the targets of interpolation by the processing of the step S404. Thus, the variable k becomes 4 at a time point at which the processing of the steps S402, S403 is performed for all of the pixels.

Therefore, the processing of the steps S402, S403 is repeated for all of the pixels again by the processing of the step S409. In this case, the deviation amounts of the four pixels indicated by the thick one-dot and dash frames are newly treated as the targets of interpolation by the processing of the step S404. Thus, the variable k is 4.

Therefore, the processing of the steps S402, S403 is repeated again for all of the pixels by the processing of the step S409. In this case, the deviation amount of one pixel indicated by the thick dotted frame is newly treated as the target of interpolation by the processing of the step S404. Thus, the variable k is 1.

Therefore, the processing of the steps S402, S403 is repeated again for all of the pixels by the processing of the step S409. In this case, a deviation amount newly treated as the target of interpolation is not present. Thus, the variable k is 0. As a result, as shown in FIG. 40B, with the deviation amounts of part of the pixels being the targets of interpolation, the processing of the step S410 is started.

As shown in FIG. 39, the controller 114 treats the variable i as 1 in the step S410. Thereafter, the controller 114 determines whether the deviation amount of the i-th pixel is the target of interpolation (step S411). In the case where the deviation amount of the i-th pixel is not the target of interpolation, the controller 114 proceeds to the processing of the step S415, described below. On the one hand, in the case where the deviation amount of the i-th pixel is the target of interpolation, the controller 114 counts the number of pixels that are treated as the targets of interpolation among the plurality of pixels surrounding the i-th pixel (step S412).

The plurality of pixels surrounding the i-th pixel in the step S412 are the four pixels adjacent to the i-th pixel in the x direction and the y direction, for example.

Subsequently, the controller 114 determines whether the counted number is not less than a predetermined second number (step S413). The predetermined second number is 3, for example. In the case where the counted number is not less than the second number, the controller 114 proceeds to the processing of the step S415, described below. On the one hand, in the case where the counted number is smaller than the second number, the controller 114 treats an average value of the deviation amounts of the plurality of pixels that are not treated as the targets of interpolation as the deviation amount of the i-th pixel (step S414), and proceeds to the processing of the step S415.

In the step S415, the controller 114 determines whether the value of the variable i is N. In the case where the variable i is not N, the controller 114 adds 1 to the variable i (step S416), and proceeds to the processing of the step S411. On the one hand, in the case where the variable i is N, the controller 114 determines whether the number of pixels of which the deviation amounts are treated as the targets of interpolation is 0 (step S417).

In the case where the number of pixels of which the deviation amounts are treated as the targets of the interpolation is not 0, the controller 114 proceeds to the processing of the step S410. On the one hand, in the case where the number of pixels of which the deviation amounts are treated as the targets of interpolation is 0, the controller 114 ends the deviation amount optimization processing.

The processing of the above-mentioned steps S410 to S417 is performed in order to sequentially interpolate the deviation amounts that are treated as the targets of interpolation by the processing of the steps S401 to S409. As shown in FIG. 40B, with the deviation amounts of part of the pixels being the targets of interpolation among the plurality of pixels, the processing of the steps S411 to S414 is repeated for all of the pixels. In this case, the deviation amounts of the four pixels indicated by the thick solid frames in FIG. 40C are interpolated by the processing of the step S414. At this time point, five targets of interpolation among the 9 targets of interpolation of FIG. 40B are not interpolated.

Therefore, the processing of the steps S411 to S414 is repeated again for all of the pixels by the processing of the step S417. In this case, the deviation amounts of the four pixels indicated by the one thick one-dot and dash frames in FIG. 40C are interpolated by the processing of the step S414. At this time point, one target of interpolation among the 9 targets of interpolation of FIG. 40B is not interpolated.

Therefore, the processing of the steps S411 to S414 is repeated again for all of the pixels by the processing of the step S417. In this case, the deviation amount of one pixel indicated by the thick dotted frame in FIG. 40C is interpolated by the processing of the step S414. Thus, all of the 9 targets of interpolation of FIG. 40B are interpolated. In this manner, the deviation amounts of all of the targets of the interpolation are determined, so that the deviation amount optimization processing is ended.

(3) Effects

In the present embodiment, the deviation amount erroneously calculated in the processing of the step S302 is optimized by the deviation amount optimization processing in the correspondence relationship correction processing. Thus, the correspondence relationship between the pixel of the surface image SD2 of the sample substrate and the pixel of the surface image SD2 of the inspection substrate W is appropriately corrected. Therefore, a defect in appearance on the inspection substrate W can be detected with high accuracy.

Also in the present embodiment, similarly to the seventh embodiment, the emphasis processing for the surface image data of the sample substrate and the inspection substrate W may be performed before the correspondence relationship correction processing of the step S215 in the defect determination processing.

[8] Eighth Embodiment

The substrate processing apparatus according to the eighth embodiment has the same configuration and operation as the substrate processing apparatus according to the fifth embodiment except for the following point. In the substrate processing apparatus according to the present embodiment, the controller 114 (FIG. 1) performs the moire removal processing of FIG. 15 according to the second embodiment in the defect determination processing.

Figure 41:
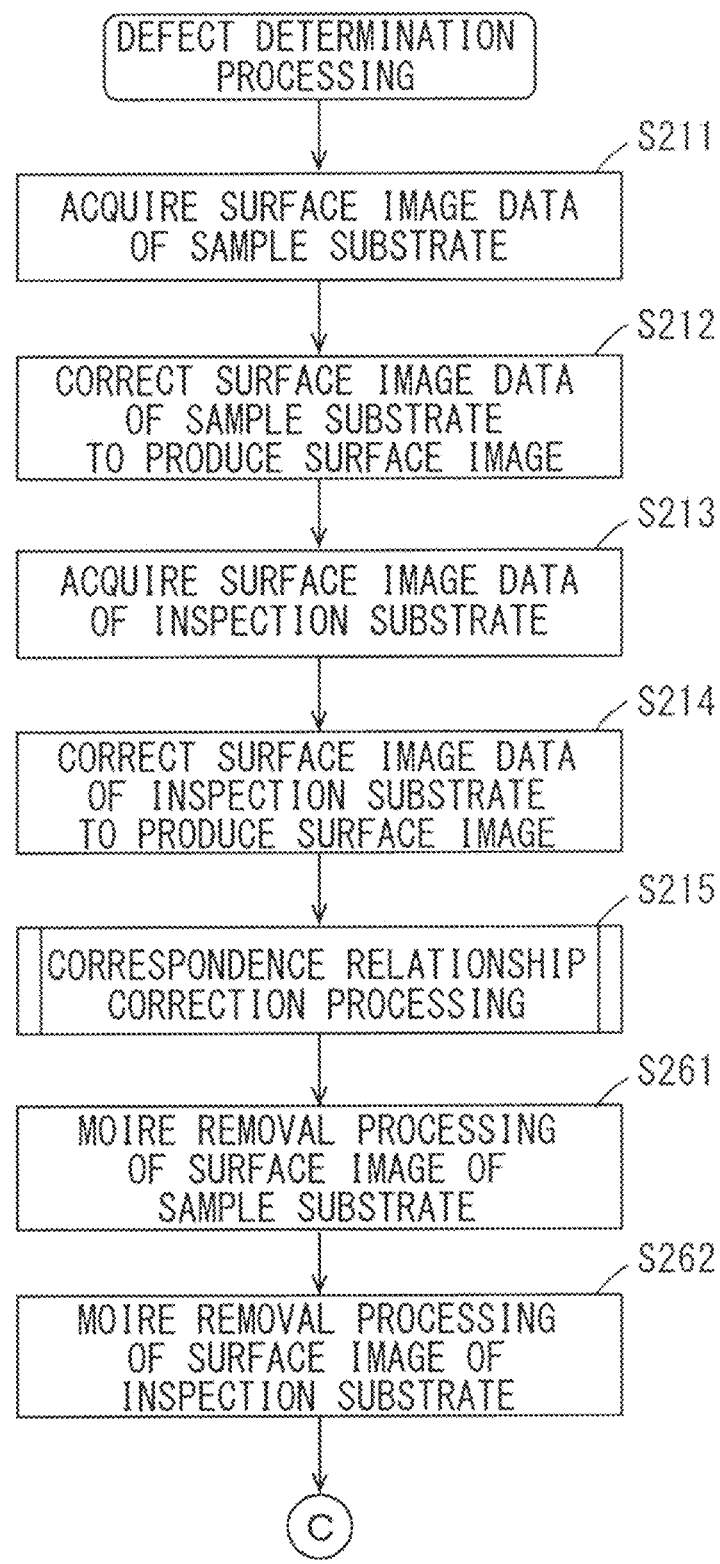
FIG. 41 is a flow chart showing part of defect determination processing according to an eighth embodiment.

FIG. 41 is a flow chart showing part of the defect determination processing according to the eighth embodiment. As shown in FIG. 41, after performing the processing of the steps S211 to S215 of FIG. 26 similarly to the fifth embodiment, the controller 114 performs the moire removal processing for the surface image SD2 of the sample substrate (step S261). Subsequently, the controller 114 performs the moire removal processing for the surface image SD3 of the inspection substrate W (step S262). Thereafter, the controller 114 performs the subsequent processing after the step S216 of FIG. 27 based on the surface images SD2, SD3 on which the moire removal processing is performed.

In the present embodiment, the moire removal processing is performed for the surface image SD2 of the sample substrate and the surface image SD3 of the inspection substrate W. In the moire removal processing, the acquired surface image data is smoothed, and a gradation value of each pixel of the surface image data after smoothing is subtracted from a gradation value of each pixel of the surface image data before smoothing. Thus, the correction image data from which a moire is removed is produced. The surface images SD2, SD3 from which moires are removed are acquired based on the correction image data.

In this case, in the inspection substrate W including a defect DP, it is easy to distinguish between the defect DP and a moire. Further, in the steps S216, S217 of the defect determination processing, an occurrence of variations between gradation values of the difference image data and gradation values of the determination image data resulting from a moire is prevented. Thus, it is not necessary to widely set the allowable range to include variations in gradation value resulting from a moire. Therefore, a defect in appearance on the inspection substrate W can be detected with higher accuracy.

Also in the present embodiment, similarly to the sixth embodiment, the emphasis processing for the surface image data of the sample substrate and the inspection substrate W may be performed before the correspondence relationship correction processing of the step S215 in the defect determination processing.

Also in the present embodiment, similarly to the seventh embodiment, the deviation amount optimization processing may be performed between the processing of the steps S302, S303 in the correspondence relationship correction processing.

[9] Ninth Embodiment

The substrate processing apparatus according to the ninth embodiment has the same configuration and operation as the substrate processing apparatus according to the fifth embodiment except for the following point.

As described above, in the defect determination processing according to the fifth embodiment, the correspondence relationship between the pixel of the surface image SD2 of the sample substrate and the pixel of the surface image SD3 of the inspection substrate W is corrected by the correspondence relationship correction processing. However, depending on the influence of noise, disturbance or the like, a deviation in correspondence relationship may not be completely resolved.

In the case where a deviation in correspondence relationship is not completely resolved, it is necessary to largely set the allowable range used in the defect determination processing in order to prevent determination error resulting from a deviation in correspondence relationship between the pixels. On the one hand, when the allowable range is set excessively large, the detection accuracy for a defect is reduced.

Figure 42:
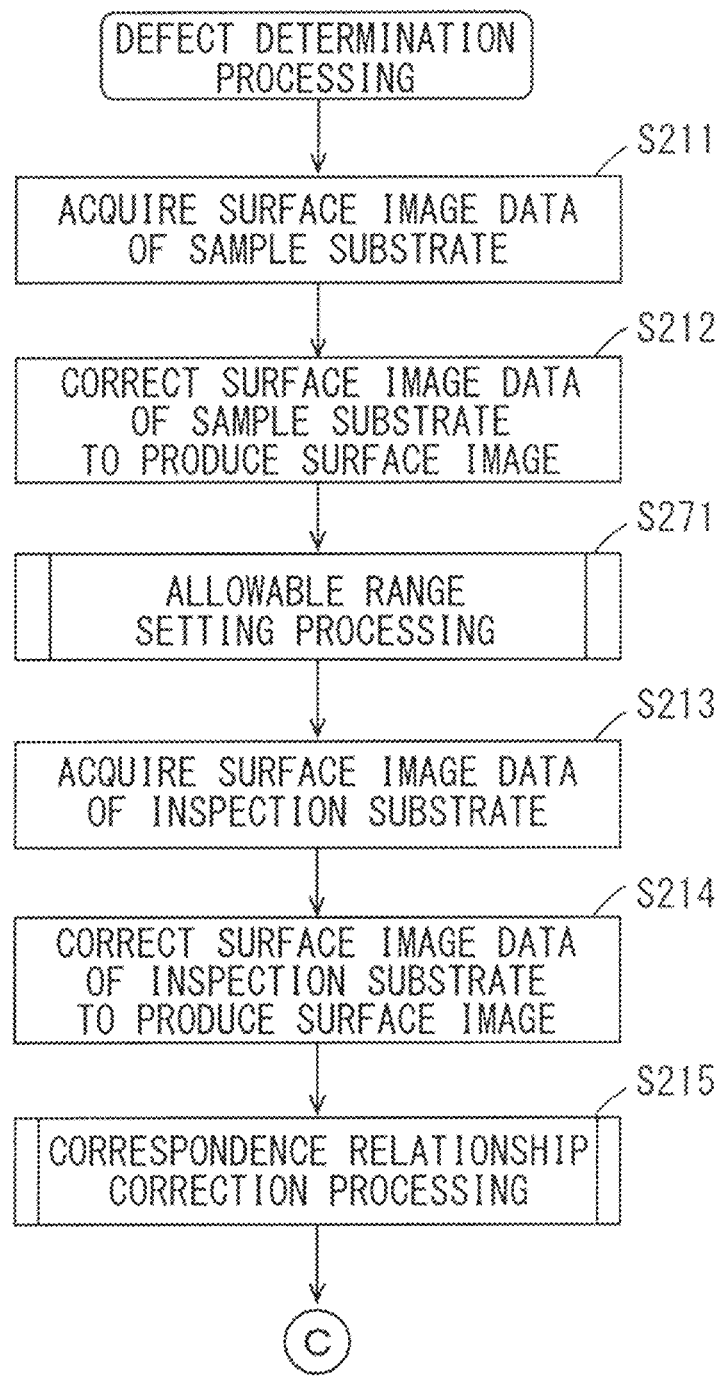
FIG. 42 is a flow chart showing part of the defect determination processing according to a ninth embodiment.

In the present embodiment, in order to appropriately set the allowable range while a deviation in correspondence relationship between the surface image data of the sample substrate and the surface image data of the inspection substrate W is considered, the allowable range setting processing of FIG. 23 according to the third embodiment is performed. FIG. 42 is a flow chart showing part of the defect determination processing according to the ninth embodiment. In the present example, after performing the processing of the step S211, S212 similarly to the fifth embodiment, the controller 114 performs the allowable range setting processing of FIG. 23 according to the third embodiment (step S271). Thereafter, the controller 114 performs the subsequent processing after the step S213. In this case, in the processing of the step S218 of FIG. 27, the allowable range set in the processing of the step S271 is used.

As described above, the allowable range is set by the allowable range setting processing of FIG. 23. Thus, even in the case where a deviation in correspondence relationship between the pixel of the surface image SD2 of the sample substrate and the pixel of the surface image SD3 of the inspection substrate W is not completely resolved, the gradation value of the determination image data calculated with the deviation being present in the correspondence relationship between the pixels is less likely to fall outside of the allowable range. Therefore, a normal portion is less likely to be erroneously determined as a defect.

Also in the present embodiment, similarly to the sixth embodiment, the emphasis processing for the surface image data of the sample substrate and the inspection substrate W may be performed before the correspondence relationship correction processing of the step S215 in the defect determination processing (see FIG. 36).

Further, also in the present embodiment, similarly to the seventh embodiment, the deviation optimization processing may be performed between the processing of the step S302 and the processing of the step S303 in the correspondence relationship correction processing (see FIG. 37).

Further, also in the present embodiment, similarly to the eighth embodiment, the moire removal processing for the surface images SD2, SD3 of the sample substrate and the inspection substrate W may be performed before the processing of the step S216 after the processing of the step S214 or the step S215 in the defect determination processing (see FIG. 41).

[10] Other Embodiments (1) In the above-mentioned embodiment, the surface image data of the sample substrate is acquired, and the surface image SD2 of FIG. 12A is produced, every time the defect determination processing is performed for one inspection substrate W. However, the invention is not limited to this. In the case where the defect determination processing is performed for the plurality of inspection substrates W having the common surface structure, the surface image data of the sample substrate may be acquired before the defect determination processing and the surface image SD2 may be stored in the controller 114 in advance. In this case, when the defect determination processing of each inspection substrate W is performed, the processing for acquiring the surface image data of the sample substrate, and the processing for correcting the acquired surface image data can be omitted. Therefore, efficiency of the defect determination processing is improved.

Further, before the defect determination processing of the plurality of inspection substrates W, the allowable range setting processing in the third and ninth embodiments may be performed in addition to the processing for acquiring the surface image data of the sample substrate. Further, the allowable range set by the allowable range setting processing may be stored in the memory of the controller 114 in advance together with the surface image SD2. Thus, when the defect determination processing for each inspection substrate W is performed, the allowable range setting processing can be further omitted. Therefore, efficiency of the defect determination processing is further improved.

(2) While the surface image data of the sample substrate is acquired by picking up of an image of the sample substrate in the above-mentioned embodiment, the present invention is not limited to this. The predetermined design data may be used as the surface image data of the sample substrate. In this case, it is not necessary to image the sample substrate. Therefore, in the defect determination processing, the processing for acquiring the surface image data of the sample substrate and the processing for correcting the acquired surface image data can be omitted.

(3) In the above-mentioned embodiment, after the surface image data of the sample substrate is acquired in the defect determination processing, the acquired surface image data is corrected. Thus, the surface image SD2 in the shape of the substrate W is produced. Further, after the surface image data of the inspection substrate W is acquired, the acquired surface image data is corrected. Thus, the surface image SD3 in the shape of the substrate W is produced.

The present invention is not limited to the above-mentioned example. The surface image data of the sample substrate and the surface image data of the inspection substrate W do not have to be corrected to be in the shape of the substrate W. Even in such a case, the defect determination processing similar to the above-mentioned example can be performed based on the surface image data indicating the rectangular surface image SD1 as shown in FIG. 7F.

(4) In the above-mentioned embodiment, in the inspection unit IP, the radial region RR of the substrate W is irradiated with the inspection light while the substrate W is rotated, and the reflected light is led to the CCD line sensor 54. Thus, the surface image data is produced. However, the surface image data may be produced by another method. For example, the surface image data may be produced by picking up of an image of the entire surface of the substrate W by an area sensor with the substrate W not being rotated.

(5) While the defect determination processing is performed by the controller 114 in the above-mentioned embodiment, the present invention is not limited to this. For example, a controller for the appearance inspection may be provided to correspond to the inspection unit IP, and various processing in the appearance inspection may be performed by the controller. Alternatively, a plurality of local controllers may be provided to respectively correspond to the indexer block 11, the first and second processing blocks 12, 13 and the interface block 14, and various processing in the appearance inspection may be performed by one local controller among them (a local controller corresponding to the second processing block 13, for example).

(6) While the appearance inspection for the substrate W after the development processing is performed in the inspection unit IP in the above-mentioned embodiment, the present invention is not limited to this. For example, the appearance inspection of the substrate W after the formation of the resist film and before the exposure processing may be performed by the inspection unit IP. Further, the appearance inspection of the substrate W before the formation of the resist film may be performed by the inspection unit IP.

(7) While the inspection unit IP is provided in the second processing block 13 in the above-mentioned embodiment, the arrangement of the inspection units IP and the number of the inspection units IP may be suitably changed. For example, the inspection units IP may be provided in the first processing block 12, or the inspection unit IP may be provided in the interface block 14.

(8) While the inspection units IP are provided in the substrate processing apparatus 100 adjacent to the exposure device 15 that performs the exposure processing for the substrate W by an immersion method in the above-mentioned embodiment, the present invention is not limited to this. The inspection unit IP may be provided in the substrate processing apparatus adjacent to an exposure device that performs the exposure processing for the substrate W without using liquid.

(9) While the inspection units IP are provided in the substrate processing apparatus 100 that performs the processing for the substrate W before and after the exposure processing in the above-mentioned embodiment, the inspection unit IP may be provided in another substrate processing apparatus. For example, the inspection unit IP may be provided in a substrate processing apparatus that performs cleaning processing on the substrate W, or the inspection units IP may be provided in a substrate processing apparatus that performs etching processing for the substrate W. Alternatively, the inspection unit IP does not have to be provided in the substrate processing apparatus, and the inspection unit IP may be used alone.

[11] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the sample substrate is an example of a substrate with no defect in appearance, the inspection substrate W is an example of a substrate to be inspected, the inspection unit IP and the controller 114 are examples of an inspector, the controller 114 is an example of a corrector, a determiner, an emphasis processer and an optimization processer, and the illuminator 52, the CCD line sensor 54 and the controller 114 are examples of an image data acquirer.

Further, the surface image SD2 of the sample substrate is an example of a first image, the surface image data of the sample substrate is an example of first image data, the surface image SD3 of the inspection substrate W is an example of a second image, the surface image data of the inspection substrate W is an example of second image data, and the difference image data and the determination image data are examples of pieces of difference information.

Further, the plurality of first unit images 1U are examples of a plurality of first unit images, the plurality of second unit images 2U are examples of a plurality of second unit images, the center pixel 1UC of the first unit image 1U is an example of a representative pixel of a first unit image, the center pixel of the second unit image 2U is an example of a representative pixel of a second unit image, the correction image data of the sample substrate is an example of first correction image data, and the correction image data of the inspection substrate W is an example of second correction image data.

Further, the gradation values of the plurality of pixels of the determination image data are examples of values acquired by addition of a constant value to differences between gradation values of pixels of the first image data and gradation values of pixel of the second image data, the pixels of the first and second image data being considered to correspond to each other, the minimum value and the maximum value of the addition representative value are examples of values acquired by respective addition of a constant value to a minimum value and a maximum value of a plurality of representative values.

Further, the holding rotator 51 is an example of a substrate holding rotator, the illuminator 52 is an example of an illuminator, the CCD line sensor 54 is an example of a line sensor, the substrate processing apparatus 100 is an example of a substrate processor, the exposure device 15 is an example of an exposer, the coating processing unit 129 is an example of a coater, and the development processing unit 139 is an example of a developer.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for appearance inspection for various types of substrates.

We claim:

1. An inspection method of performing appearance inspection for a substrate, comprising:
acquiring image data of a substrate with no defect in appearance as first image data, and acquiring image data of a substrate to be inspected as second image data by picking up an image of the substrate to be inspected by an imaging device;
setting an allowable range for determining whether there is a defect in appearance on the substrate; and
calculating values related to differences between gradation values of pixels of the acquired first image data and gradation values of pixels of the acquired second image data as pieces of difference information, the pixels of the first and second image data being considered to correspond to each other, and determining whether there is a defect in appearance on the substrate to be inspected based on whether each piece of calculated difference information is in the set allowable range, wherein
the setting includes calculating, for each of a plurality of predetermined target pixels of the first image data, differences between gradation values of a target pixel and a plurality of pixels in a constant region including the target pixel, determining, for each of the plurality of predetermined target pixels of the first image data, a representative value in a range from a minimum value to a maximum value of the calculated differences by a predetermined method based on the calculated differences, and respectively setting values related to a minimum value and a maximum value of a plurality of representative values respectively determined for the plurality of predetermined target pixels as a lower limit value and an upper limit value of the allowable range.

2. The inspection method according to claim 1, wherein the predetermined method is a method of determining, for each of the plurality of predetermined target pixels of the first image data, an average value of the differences between a gradation value of the target pixel and gradation values of the plurality of pixels in the constant region including the target pixels as the representative value.

3. The inspection method according to claim 1, wherein the predetermined method is a method of determining, for each of the plurality of predetermined target pixels of the first image data, a maximum value of the differences between a gradation value of the target pixel and gradation values of the plurality of pixels in the constant region including the target pixels as the representative value.

4. The inspection method according to claim 1, wherein
the pieces of difference information include values acquired by addition of a constant value to differences between gradation values of pixels of the first image data and gradation values of pixels of the second image data, the pixels of the first and second image data being considered to correspond to each other, and
values related to the minimum value and the maximum value of the plurality of representative values include values acquired by respective addition of the constant value to the minimum value and the maximum value of the plurality of representative values.

5. The inspection method according to claim 1, wherein the setting includes setting a first value smaller than the minimum value of the plurality of representative values by a predetermined value as the lower limit value of the allowable range instead of the value related to the minimum value of the plurality of representative values, and setting a second value larger than the maximum value of the plurality of representative values by a predetermined value as the upper limit value of the allowable range instead of the value related to the maximum value of the plurality of representative values.

6. The inspection method according to claim 1, wherein the determining includes detecting a defect in appearance on the substrate based on a pixel of which a piece of difference information is outside of the allowable range.

7. The inspection method according to claim 1, wherein the determining includes determining that there is a defect in appearance on the substrate to be inspected in the case where the number of pieces of difference information outside of the allowable range is not less than a predetermined number.

8. The inspection method according to claim 1, wherein the determining includes performing smoothing of the acquired first image data, producing first correction image data by subtracting a gradation value of each pixel of first image data after smoothing from a gradation value of each pixel of first image data before smoothing, performing smoothing of the acquired second image data, producing second correction image data by subtracting a gradation value of each pixel of second image data after smoothing from a gradation value of each pixel of second image data before smoothing, and calculating differences between gradation values of pixels of the produced first correction data and gradation values of pixels of the produced second correction data, the pixels of the produced first and second correction data being considered to correspond to each other, as the pieces of difference information for the pixels of the first image data and corresponding pixels of the second image data, and the setting includes calculating, for each of a plurality of target pixels of the produced first correction image data instead of the first image data, differences between a gradation value of the target pixel and gradation values of the plurality of pixels in the constant region including the target pixel, and determining, for each of the plurality of target pixels of the produced first correction image data instead of the first image data, the representative value in the range from the minimum value to the maximum value of the plurality of differences by the predetermined method based on the plurality of calculated differences.

9. A substrate processing method of performing processing on a substrate, comprising:
   forming a photosensitive film on the substrate by a coater before exposure processing by an exposer that performs the exposure processing;
   performing development processing on the photosensitive film on the substrate by a developer after the exposure processing by the exposer; and
   performing appearance inspection for the substrate after the formation of the photosensitive film by the coater, by the inspection method according to claim 1.

10. The substrate processing method according to claim 9, wherein
   the performing the appearance inspection for the substrate by the inspection method includes performing the appearance inspection for the substrate after the formation of the photosensitive film by the coater and after the development processing by the developer.

* * * * *